(12) United States Patent
Sato et al.

(10) Patent No.: US 11,710,794 B2
(45) Date of Patent: *Jul. 25, 2023

(54) SEMICONDUCTOR DEVICE

(71) Applicant: Semiconductor Energy Laboratory Co., Ltd., Atsugi (JP)

(72) Inventors: Takahiro Sato, Tochigi (JP); Yasutaka Nakazawa, Tochigi (JP); Takayuki Cho, Tochigi (JP); Shunsuke Koshioka, Tochigi (JP); Hajime Tokunaga, Yokohama (JP); Masami Jintyou, Shimotsuga (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/063,748

(22) Filed: Oct. 6, 2020

(65) Prior Publication Data

US 2021/0020785 A1 Jan. 21, 2021

Related U.S. Application Data

(63) Continuation of application No. 16/515,283, filed on Jul. 18, 2019, which is a continuation of application (Continued)

(30) Foreign Application Priority Data

Nov. 16, 2012 (JP) .................................. 2012-251794

(51) Int. Cl.
*H01L 29/786* (2006.01)
*H01L 29/10* (2006.01)
(Continued)

(52) U.S. Cl.
CPC ........ *H01L 29/7869* (2013.01); *G02F 1/1368* (2013.01); *G02F 1/136277* (2013.01);
(Continued)

(58) Field of Classification Search
CPC ........... H01L 29/7869; H01L 21/30604; H01L 27/1225; H01L 27/3248; H01L 29/24;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 001258209 C 5/2006
CN 102169907 A 8/2011
(Continued)

OTHER PUBLICATIONS

Chinese Office Action (Application No. 201910045929.9) dated Sep. 16, 2021.
(Continued)

*Primary Examiner* — Eduardo A Rodela
(74) *Attorney, Agent, or Firm* — Robinson Intellectual Property Law Office; Eric J. Robinson

(57) ABSTRACT

A transistor includes a multilayer film in which an oxide semiconductor film and an oxide film are stacked, a gate electrode, and a gate insulating film. The multilayer film overlaps with the gate electrode with the gate insulating film interposed therebetween. The multilayer film has a shape having a first angle between a bottom surface of the oxide semiconductor film and a side surface of the oxide semiconductor film and a second angle between a bottom surface of the oxide film and a side surface of the oxide film. The first angle is acute and smaller than the second angle.
(Continued)

Further, a semiconductor device including such a transistor is manufactured.

9 Claims, 32 Drawing Sheets

Related U.S. Application Data

No. 15/785,562, filed on Oct. 17, 2017, now Pat. No. 10,361,318, which is a continuation of application No. 15/187,106, filed on Jun. 20, 2016, now Pat. No. 9,812,583, which is a continuation of application No. 14/878,399, filed on Oct. 8, 2015, now Pat. No. 9,449,819, which is a continuation of application No. 14/733,489, filed on Jun. 8, 2015, now Pat. No. 9,219,165, which is a continuation of application No. 14/073,993, filed on Nov. 7, 2013, now Pat. No. 9,087,726.

(51) Int. Cl.
| | | |
|---|---|---|
| *H01L 21/02* | (2006.01) | |
| *H01L 21/465* | (2006.01) | |
| *H10K 59/123* | (2023.01) | |
| *G02F 1/1362* | (2006.01) | |
| *G02F 1/1368* | (2006.01) | |
| *H01L 27/12* | (2006.01) | |
| *H01L 29/04* | (2006.01) | |
| *H01L 29/06* | (2006.01) | |
| *H01L 29/24* | (2006.01) | |
| *H01L 29/423* | (2006.01) | |
| *H01L 21/306* | (2006.01) | |
| *H01L 29/66* | (2006.01) | |

(52) U.S. Cl.
CPC .. *H01L 21/02365* (2013.01); *H01L 21/02403* (2013.01); *H01L 21/02422* (2013.01); *H01L 21/02551* (2013.01); *H01L 21/02554* (2013.01); *H01L 21/02565* (2013.01); *H01L 21/02631* (2013.01); *H01L 21/30604* (2013.01); *H01L 21/465* (2013.01); *H01L 27/1225* (2013.01); *H01L 27/1259* (2013.01); *H01L 29/045* (2013.01); *H01L 29/0657* (2013.01); *H01L 29/1033* (2013.01); *H01L 29/24* (2013.01); *H01L 29/42356* (2013.01); *H01L 29/66742* (2013.01); *H01L 29/66969* (2013.01); *H01L 29/786* (2013.01); *H01L 29/78603* (2013.01); *H01L 29/78693* (2013.01); *H01L 29/78696* (2013.01); *H10K 59/123* (2023.02)

(58) Field of Classification Search
CPC ......... H01L 29/66742; H01L 29/66969; H01L 29/78696; G02F 1/1368; H10K 59/123
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,294,799 B1 | 9/2001 | Yamazaki et al. | |
| 6,376,861 B1 | 4/2002 | Yaegashi et al. | |
| 6,475,836 B1 | 11/2002 | Suzawa et al. | |
| 6,563,174 B2 | 5/2003 | Kawasaki et al. | |
| 6,657,692 B2 | 12/2003 | Shiota | |
| 6,686,228 B2 | 2/2004 | Suzawa et al. | |
| 6,727,522 B1 | 4/2004 | Kawasaki et al. | |
| 6,740,599 B2 | 5/2004 | Yamazaki et al. | |
| 6,900,461 B2 | 5/2005 | Inoue et al. | |
| 6,900,462 B2 | 5/2005 | Suzawa et al. | |
| 6,972,263 B2 | 12/2005 | Yamazaki et al. | |
| 7,049,190 B2 | 5/2006 | Takeda et al. | |
| 7,057,694 B2 | 6/2006 | Shiota | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,633,085 B2 | 12/2009 | Suzawa et al. | |
| 7,642,573 B2 | 1/2010 | Hoffman et al. | |
| 7,674,650 B2 | 3/2010 | Akimoto et al. | |
| 7,727,898 B2 | 6/2010 | Yamazaki et al. | |
| 7,732,819 B2 | 6/2010 | Akimoto et al. | |
| 7,791,072 B2 | 9/2010 | Kumomi et al. | |
| 7,838,348 B2 | 11/2010 | Hoffman et al. | |
| 7,940,085 B2 | 5/2011 | Kim et al. | |
| 7,973,867 B2 | 7/2011 | Shiota | |
| 7,988,470 B2 | 8/2011 | Ye | |
| 8,058,645 B2 * | 11/2011 | Jeong | H01L 27/1225 257/43 |
| 8,093,136 B2 | 1/2012 | Endo et al. | |
| 8,093,591 B2 | 1/2012 | Suzawa et al. | |
| 8,202,365 B2 | 6/2012 | Umeda et al. | |
| 8,217,680 B2 | 7/2012 | Kim et al. | |
| 8,237,166 B2 | 8/2012 | Kumomi et al. | |
| 8,298,879 B2 | 10/2012 | Ye | |
| 8,309,961 B2 | 11/2012 | Yamazaki et al. | |
| 8,319,218 B2 | 11/2012 | Yamazaki et al. | |
| 8,343,799 B2 | 1/2013 | Ito et al. | |
| 8,350,261 B2 | 1/2013 | Sakata et al. | |
| 8,384,080 B2 | 2/2013 | Taniguchi et al. | |
| 8,399,274 B2 * | 3/2013 | Kang | H01L 27/1225 438/45 |
| 8,410,479 B2 * | 4/2013 | Kim | H01L 29/78696 257/E29.296 |
| 8,422,272 B2 | 4/2013 | Inoue et al. | |
| 8,426,868 B2 * | 4/2013 | Akimoto | H01L 27/127 438/156 |
| 8,482,001 B2 | 7/2013 | Yamazaki et al. | |
| 8,501,553 B2 | 8/2013 | Hu et al. | |
| 8,546,811 B2 | 10/2013 | Godo et al. | |
| 8,547,753 B2 | 10/2013 | Takemura et al. | |
| 8,647,934 B2 * | 2/2014 | Lee | H01L 29/7869 438/166 |
| 8,653,525 B2 | 2/2014 | Yamada | |
| 8,659,013 B2 | 2/2014 | Yamazaki | |
| 8,692,252 B2 | 4/2014 | Takata et al. | |
| 8,728,883 B2 | 5/2014 | Yamazaki et al. | |
| 8,741,702 B2 | 6/2014 | Ito et al. | |
| 8,742,412 B2 | 6/2014 | Goyal et al. | |
| 8,748,881 B2 | 6/2014 | Yamazaki | |
| 8,760,931 B2 | 6/2014 | Takemura et al. | |
| 8,766,253 B2 | 7/2014 | Miyake | |
| 8,779,420 B2 | 7/2014 | Yamazaki | |
| 8,878,178 B2 | 11/2014 | Ito et al. | |
| 8,901,552 B2 | 12/2014 | Yamazaki et al. | |
| 8,902,640 B2 | 12/2014 | Inoue et al. | |
| 8,916,867 B2 | 12/2014 | Koezuka | |
| 8,956,907 B2 | 2/2015 | Ono et al. | |
| 8,987,074 B2 | 3/2015 | Xie et al. | |
| 9,059,047 B2 | 6/2015 | Yamazaki | |
| 9,059,295 B2 | 6/2015 | Yamazaki | |
| 9,087,726 B2 | 7/2015 | Sato et al. | |
| 9,117,919 B2 | 8/2015 | Yamazaki et al. | |
| 9,123,751 B2 | 9/2015 | Ito et al. | |
| 9,190,526 B2 | 11/2015 | Moriguchi et al. | |
| 9,214,520 B2 | 12/2015 | Yamazaki | |

(56) References Cited

U.S. PATENT DOCUMENTS

| | | | |
|---|---|---|---|
| 9,219,165 B2 | 12/2015 | Sato et al. |
| 9,281,358 B2 | 3/2016 | Yamazaki et al. |
| 9,299,813 B2 | 3/2016 | Inoue et al. |
| 9,306,072 B2 | 4/2016 | Yamazaki et al. |
| 9,324,880 B2 | 4/2016 | Ono et al. |
| 9,337,347 B2 | 5/2016 | Koezuka |
| 9,343,584 B2 | 5/2016 | Yamazaki et al. |
| 9,406,808 B2 | 8/2016 | Yamazaki et al. |
| 9,525,051 B2 | 12/2016 | Inoue et al. |
| 9,614,097 B2 | 4/2017 | Takemura et al. |
| 9,634,082 B2 | 4/2017 | Yamazaki et al. |
| 9,812,583 B2 | 11/2017 | Sato et al. |
| 9,825,037 B2 | 11/2017 | Inoue et al. |
| 9,887,298 B2 | 2/2018 | Yamazaki |
| 10,115,831 B2 | 10/2018 | Yamazaki et al. |
| 10,454,475 B2 | 10/2019 | Takemura et al. |
| 10,886,413 B2 * | 1/2021 | Sato | G02F 1/1368 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0031963 A1 | 2/2004 | Inoue et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0168490 A1 | 8/2005 | Takahara |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140243 A1 * | 6/2009 | Kim | H01L 21/02614 |
| | | | 257/E29.094 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0025674 A1 | 2/2010 | Kim et al. |
| 2010/0044700 A1 * | 2/2010 | Kim | H01L 29/7869 |
| | | | 257/E29.1 |
| 2010/0051938 A1 | 3/2010 | Hayashi et al. |
| 2010/0065844 A1 | 3/2010 | Tokunaga |
| 2010/0090217 A1 | 4/2010 | Akimoto |
| 2010/0092800 A1 | 4/2010 | Itagaki et al. |
| 2010/0109002 A1 | 5/2010 | Itagaki et al. |
| 2010/0117075 A1 | 5/2010 | Akimoto et al. |
| 2010/0200999 A1 | 8/2010 | Yamazaki et al. |
| 2010/0295041 A1 | 11/2010 | Kumomi et al. |
| 2011/0024750 A1 | 2/2011 | Yamazaki et al. |
| 2011/0062436 A1 | 3/2011 | Yamazaki et al. |
| 2011/0104833 A1 * | 5/2011 | Kang | H01L 27/3262 |
| | | | 257/E29.094 |
| 2011/0140100 A1 | 6/2011 | Takata et al. |
| 2011/0148847 A1 | 6/2011 | Ikeda |
| 2011/0212569 A1 | 9/2011 | Yamazaki et al. |
| 2011/0240991 A1 | 10/2011 | Yamazaki |
| 2012/0001170 A1 | 1/2012 | Yamazaki |
| 2012/0032730 A1 | 2/2012 | Koyama |
| 2012/0126223 A1 | 5/2012 | Maeng et al. |
| 2012/0168743 A1 | 7/2012 | Lee et al. |
| 2012/0193625 A1 | 8/2012 | Sasagawa et al. |
| 2012/0223300 A1 * | 9/2012 | Kang | H01L 29/45 |
| | | | 438/34 |
| 2012/0256179 A1 | 10/2012 | Yamazaki et al. |
| 2012/0319101 A1 | 12/2012 | Sasagawa et al. |
| 2013/0075723 A1 | 3/2013 | Yamazaki et al. |
| 2013/0256666 A1 * | 10/2013 | Chang | H01L 29/78696 |
| | | | 438/158 |
| 2013/0260497 A1 * | 10/2013 | Ahn | H01L 21/02565 |
| | | | 438/34 |
| 2013/0271687 A1 * | 10/2013 | Lim | H01L 29/41783 |
| | | | 257/43 |
| 2013/0280859 A1 | 10/2013 | Kim et al. |
| 2014/0014954 A1 | 1/2014 | Godo et al. |
| 2014/0134795 A1 | 5/2014 | Mochizuki et al. |
| 2014/0167034 A1 * | 6/2014 | Liu | H01L 27/127 |
| | | | 257/43 |
| 2014/0197408 A1 | 7/2014 | Tsuruma et al. |
| 2015/0311347 A1 | 10/2015 | Yamazaki |
| 2015/0357444 A1 | 12/2015 | Yamazaki |
| 2016/0233342 A1 | 8/2016 | Koezuka |
| 2018/0166580 A1 | 6/2018 | Yamazaki |

FOREIGN PATENT DOCUMENTS

| | | |
|---|---|---|
| CN | 102403361 A | 4/2012 |
| CN | 102648524 A | 8/2012 |
| CN | 202443973 U | 9/2012 |
| EP | 1396881 A | 3/2004 |
| EP | 1737044 A | 12/2006 |
| EP | 2172972 A | 4/2010 |
| EP | 2226847 A | 9/2010 |
| EP | 2416323 A | 2/2012 |
| EP | 2544237 A | 1/2013 |
| EP | 2526622 B | 9/2015 |
| EP | 3151244 A | 4/2017 |
| EP | 3249698 A | 11/2017 |
| JP | 60-198861 A | 10/1985 |

(56) References Cited

FOREIGN PATENT DOCUMENTS

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-305576 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-310372 A | 11/2006 |
| JP | 2007-096055 A | 4/2007 |
| JP | 2007-123861 A | 5/2007 |
| JP | 2009-167087 A | 7/2009 |
| JP | 2009-206508 A | 9/2009 |
| JP | 2010-073881 A | 4/2010 |
| JP | 2010-118407 A | 5/2010 |
| JP | 2010-123935 A | 6/2010 |
| JP | 2010-123937 A | 6/2010 |
| JP | 2011-086923 A | 4/2011 |
| JP | 2011-100979 A | 5/2011 |
| JP | 2011-100997 A | 5/2011 |
| JP | 2011-124360 A | 6/2011 |
| JP | 2011-138934 A | 7/2011 |
| JP | 2011-181917 A | 9/2011 |
| JP | 2011-216694 A | 10/2011 |
| JP | 2011-233876 A | 11/2011 |
| JP | 2011-243745 A | 12/2011 |
| JP | 2012-059860 A | 3/2012 |
| JP | 2012-084867 A | 4/2012 |
| JP | 2012-134467 A | 7/2012 |
| JP | 4982620 | 7/2012 |
| JP | 2012-164978 A | 8/2012 |
| JP | 5052693 | 10/2012 |
| JP | 2013-506294 | 2/2013 |
| KR | 10-0623253 | 9/2006 |
| KR | 2007-0077050 A | 7/2007 |
| KR | 2009-0065271 A | 6/2009 |
| KR | 2010-0037407 A | 4/2010 |
| KR | 2010-0092882 A | 8/2010 |
| KR | 2011-0110021 A | 10/2011 |
| KR | 2012-0026995 A | 3/2012 |
| KR | 2012-0033231 A | 4/2012 |
| KR | 2012-0103616 A | 9/2012 |
| KR | 2012-0118034 A | 10/2012 |
| TW | 201244082 | 11/2012 |
| WO | WO-2004/114391 | 12/2004 |
| WO | WO-2009/034953 | 3/2009 |
| WO | WO-2009/096608 | 8/2009 |
| WO | WO-2010/024279 | 3/2010 |
| WO | WO-2010/047288 | 4/2010 |
| WO | WO-2011/033936 | 3/2011 |
| WO | WO-2011/037829 | 3/2011 |
| WO | WO-2011/043176 | 4/2011 |
| WO | WO-2011/043203 | 4/2011 |
| WO | WO-2011/065243 | 6/2011 |
| WO | WO-2011/089808 | 7/2011 |
| WO | WO-2011/096275 | 8/2011 |
| WO | WO-2011/122363 | 10/2011 |
| WO | WO-2011/125454 | 10/2011 |
| WO | WO-2012/073918 | 6/2012 |
| WO | WO-2012/144165 | 10/2012 |

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Lee.J et al., "World's Largest (15-inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

(56) References Cited

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors By Dc Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZNO TFT", IMID '07 DIGEST, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA Amoled Display Using In—Ga—Zn-Oxide TFTS With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1 Jnvited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1 :Polarizer-Free Reflective LCD Combined with Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "SPINEL,YBFE2O4, and YB2FE3O7 Types of Structures for Compounds in the IN2O3 and SC2O3—A2O3—BO Systems [A; Fe, Ga, or Al; B: Mg, Mn, Fe, Nl, Cu, or Zn] At Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Taiwanese Office Action (Application No. 102139950) dated Feb. 6, 2017.

Chinese Office Action (Application No. 201310572119.1) dated Aug. 9, 2017.

Chinese Office Action (Application No. 201310572119.1) dated Feb. 9, 2018.

Korean Office Action (Application No. 2013-0137736) dated Jun. 26, 2018.

Korean Office Action (Application No. 2017-0023107) dated Nov. 23, 2018.

Chinese Office Action (Application No. 201710155210.1) dated Jan. 22, 2020.

\* cited by examiner

150nm

150nm

200nm

200nm

200nm

SEMICONDUCTOR DEVICE

BACKGROUND OF THE INVENTION

1. Field of the Invention

The present invention relates to a semiconductor device and a manufacturing method thereof.

A semiconductor device in this specification refers to any device that can function by utilizing semiconductor characteristics. An electro-optical device, a semiconductor circuit, an electronic appliance, and the like are all semiconductor devices.

2. Description of the Related Art

A technique for forming a transistor by using a semiconductor film formed over a substrate having an insulating surface has attracted attention. The transistor is applied to a wide range of semiconductor devices such as an integrated circuit and a display device. A silicon film is known as a semiconductor film applicable to the transistor.

As the silicon film used as a semiconductor film of a transistor, either an amorphous silicon film or a polycrystalline silicon film is used depending on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility. As a method for forming a polycrystalline silicon film, high-temperature heat treatment or laser light treatment which is performed on an amorphous silicon film has been known.

Further, in recent years, an oxide semiconductor film has attracted attention. For example, a transistor which includes an oxide semiconductor film containing indium, gallium, and zinc and having a carrier density lower than $10^{18}/cm^3$ is disclosed (see Patent Document 1).

An oxide semiconductor film can be formed by a sputtering method and therefore can be applied to a transistor in a large-sized display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

A transistor including an oxide semiconductor film is known to have extremely low leakage current in an off state (also referred to as off-state current). For example, a CPU with low-power consumption utilizing the low leakage current of the transistor including an oxide semiconductor film is disclosed (see Patent Document 2).

REFERENCE

Patent Document

[Patent Document 1] Japanese Published Patent Application No. 2006-165528
[Patent Document 2] United States Patent Application Publication No. 2012/0032730

SUMMARY OF THE INVENTION

In a transistor including an oxide semiconductor film, defects generated in the oxide semiconductor film or defects generated at an interface between the oxide semiconductor film and an insulating film cause poor electrical characteristics of the transistor. With the expansion of the application range of a transistor including an oxide semiconductor film, reliability is being demanded in much more aspects.

In view of this situation, it is an object of one embodiment of the present invention to provide a transistor including an oxide semiconductor film with stable electrical characteristics. It is an object of one embodiment of the present invention to provide a transistor including an oxide semiconductor film with excellent electrical characteristics. Further, it is an object of one embodiment of the present invention to provide a highly reliable semiconductor device including such a transistor.

An embodiment of the present invention is a semiconductor device which includes a multilayer film in which an oxide semiconductor film and an oxide film are stacked, a gate electrode, and a gate insulating film. In the semiconductor device, the multilayer film overlaps with the gate electrode with the gate insulating film interposed therebetween. Further, the multilayer film has a shape having a first angle between a bottom surface of the oxide semiconductor film and a side surface of the oxide semiconductor film and a second angle between a bottom surface of the oxide film and a side surface of the oxide film. In addition, the first angle is an acute angle and smaller than the second angle.

In the multilayer film of the above-described semiconductor device, an upper edge of the oxide semiconductor film may substantially coincide with a lower edge of the oxide film. In the multilayer film, the oxide film may be stacked over the oxide semiconductor film or alternatively may be formed over and below the oxide semiconductor film.

In the semiconductor device, the first angle and the second angle are each preferably greater than or equal to 10° and less than 90°.

In the above-described semiconductor device, the oxide film preferably includes an element in common with the oxide semiconductor film and has an energy of a bottom of a conduction band that is closer to a vacuum level than that of the oxide semiconductor film is. For example, it is preferable that the oxide semiconductor film and the oxide film include an In-M-Zn oxide (M is Al, Ga, Ge, Y, Zr, Sn, La, Ce, or Nd) and that the oxide film have a lower atomic ratio of In to M than the oxide semiconductor film.

In the above-described semiconductor device, it is preferable that the oxide film be amorphous, the oxide semiconductor film be crystalline, and a c-axis of a crystal part included in the oxide semiconductor film be parallel to a normal vector of a surface of the oxide semiconductor film.

In the above-described semiconductor device, a source electrode and a drain electrode may be provided in contact with the multilayer film. A low-resistance region may be provided in a region that is in the multilayer film and in the vicinity of an interface between the multilayer film and one of the source electrode and the drain electrode.

In the above-described semiconductor device, an oxide film having the same or different composition as the oxide film may be provided in contact with a top surface of the source electrode, a top surface of the drain electrode, and a top surface of the multilayer film.

With one embodiment of the present invention using a multilayer film including an oxide film and an oxide semiconductor film, a transistor can have stable electrical characteristics.

Further, by forming the multilayer film in a tapered shape having at least the first angle and the second angle larger than the second angle, the contact area between the oxide semiconductor film serving as a channel region and the source and drain electrodes can be increased, whereby on-state current of the transistor can be increased.

Further, with one embodiment of the present invention, a highly reliable semiconductor device including such a transistor can be provided.

DETAILED DESCRIPTION OF THE INVENTION

Figure 1A:
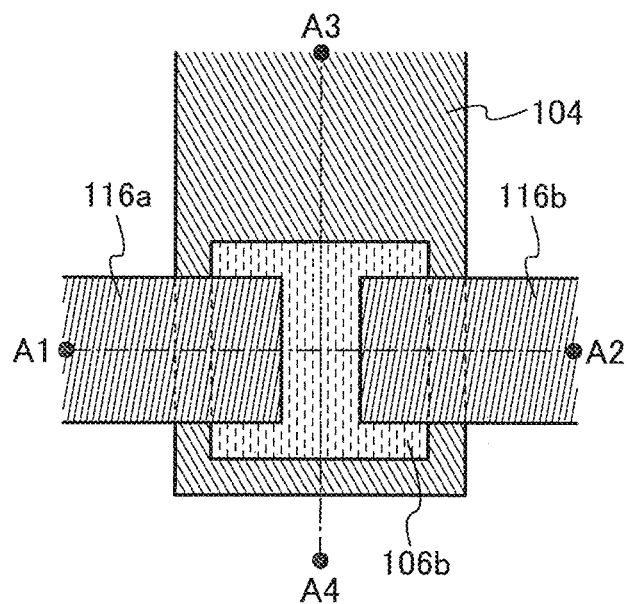
FIG. 1A is a top view of a transistor.

Hereinafter, embodiments of the present invention will be described in detail with reference to the accompanying drawings. However, the present invention is not limited to the description below and it is easily understood by those skilled in the art that the mode and details can be modified in various ways. Therefore, the present invention is not construed as being limited to the description of the embodiments given below. In describing structures of the present invention with reference to the drawings, the same reference numerals are used in common for the same portions in different drawings. Note that the same hatch pattern is applied to similar parts, and the similar parts are not especially denoted by reference numerals in some cases.

The ordinal numbers such as "first" and "second are used for convenience and do not indicate the order of steps or the stacking order of layers. In addition, the ordinal numbers in this specification do not indicate particular names which specify the present invention.

Note that a voltage refers to a potential difference between a certain potential and a reference potential (e.g., a ground potential (GND) or a source potential) in many cases. Accordingly, a voltage can also be called a potential.

Even when the expression "being electrically connected" is used, there is a case in which no physical connection is made and a wiring is just extended in an actual circuit.

Further, functions of a source and a drain might be switched when a direction of current flow is changed in circuit operation, for example. Therefore, the terms "source" and "drain" can be switched in this specification.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

In this specification, the trigonal and rhombohedral crystal systems are included in the hexagonal crystal system.

Structures and contents described in Embodiments and Example 1 of this specification and the like can be combined as appropriate.

Embodiment 1

In this embodiment, a transistor of one embodiment of the present invention will be described.

1-1. Transistor Structure (1)

Figure 1C:
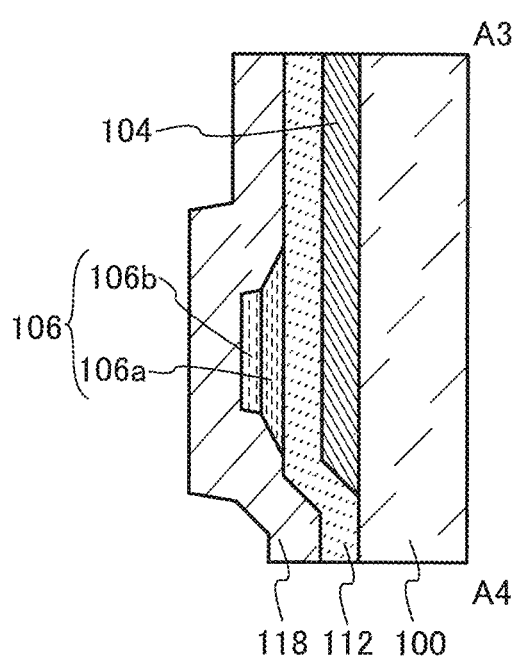
FIGS. 1B to 1D are cross-sectional views thereof.
Figure 1B:
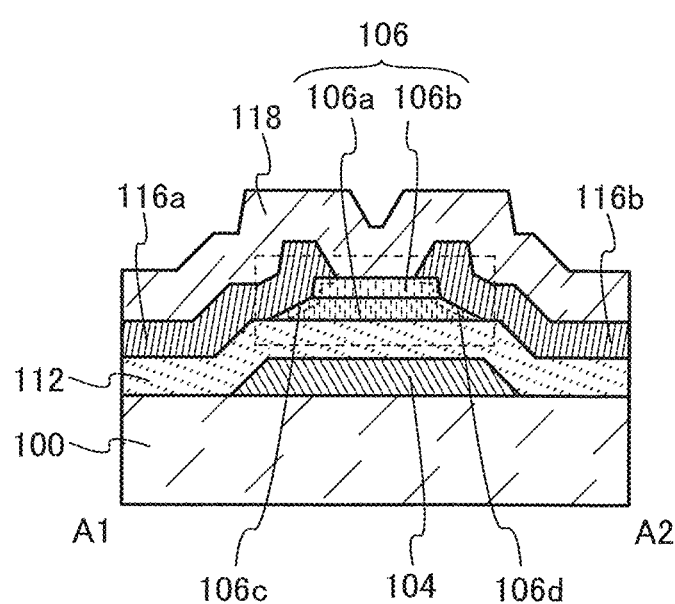

FIGS. 1A to 1D are a top view and cross-sectional views of a BGTC transistor. FIG. 1A is a top view of the transistor. FIG. 1B is a cross-sectional view taken along dashed-dotted line A1-A2 in FIG. 1A. FIG. 1C is a cross-sectional view taken along dashed-dotted line A3-A4 in FIG. 1A. Note that in FIG. 1A, some components of the transistor (e.g., a gate insulating film and a protective insulating film) are not illustrated for simplicity of the drawing.

In this embodiment, a bottom-gate transistor is described. Here, a bottom-gate top-contact (BGTC) transistor, which is one kind of a bottom gate transistor, is described with reference to FIGS. 1A to 1D. The transistor illustrated in FIG. 1B includes a gate electrode 104 provided over a substrate 100, a gate insulating film 112 provided over the gate electrode 104, a multilayer film 106 which includes an oxide semiconductor film 106a provided over the gate insulating film 112 and an oxide film 106b provided over the oxide semiconductor film 106a, a source electrode 116a and a drain electrode 116b provided over the gate insulating film 112 and the multilayer film 106, and a protective insulating film 118 provided over the multilayer film 106, the source electrode 116a, and the drain electrode 116b.

Note that a conductive film used for the source electrode 116a and the drain electrode 116b gains oxygen from part of the multilayer film 106 or forms a mixed layer depending on its kind, which results in formation of a low-resistance region 106c and a low-resistance region 106d in the multilayer film 106. The low-resistance region 106c and the low-resistance region 106d are regions of the multilayer film 106 which are in the vicinity of the interfaces between the multilayer film 106 and the source electrode 116a and the drain electrode 116b (regions between the dashed lines in the multilayer film 106 and the source and drain electrodes 116a and 116b) in FIG. 1B. The low-resistance region 106c and the low-resistance region 106d partly or entirely function as source and drain regions.

In FIG. 1A, the distance between the source electrode 116a and the drain electrode 116b in a region overlapping with the gate electrode 104 is called channel length. Note that in the case where the transistor includes a source region and a drain region, the distance between the low-resistance region 106c and the low-resistance region 106d in a region overlapping with the gate electrode 104 may be called channel length.

Note that a channel formation region refers to a region, which overlaps with the gate electrode 104 and is interposed between the source electrode 116a and the drain electrode 116b, in the multilayer film 106 (see FIG. 1B). Further, a channel region refers to a region through which current mainly flows in the channel formation region. Here, the channel region is a portion of the oxide semiconductor film 106a in the channel formation region.

Note that as illustrated in FIG. 1A, the gate electrode 104 is provided such that the entire region of the multilayer film 106 is located within the gate electrode 104 in the top view. By placing the gate electrode 104 in the above-described way, when light enters from the substrate 100 side, generation of carriers in the multilayer film 106 due to light can be suppressed. In other words, the gate electrode 104 functions as a light-blocking film. Note that the multilayer film 106 may be formed so as to extend beyond the edge of the gate electrode 104.

A bottom surface of the oxide semiconductor film 106a corresponds to the surface on the substrate 100 side of the oxide semiconductor film 106a or the surface in contact with the gate insulating film 112 of the oxide semiconductor film 106a. A bottom surface of the oxide film 106b corresponds to the surface on the substrate 100 side of the oxide film 106b or the boundary surface between the oxide film 106b and the oxide semiconductor film 106a. Note that the boundary in the stacked structure of the multilayer film 106 can be observed by scanning transmission electron microscopy (STEM). However, the boundary cannot be observed clearly in some cases depending on the materials used in the oxide semiconductor film 106a and the oxide film 106b.

1-1-1. Multilayer Film

The multilayer film 106 and the oxide semiconductor film 106a and the oxide film 106b which are included in the multilayer film 106 are described below with reference to FIGS. 1A to 1D and FIG. 2.

Figure 2:
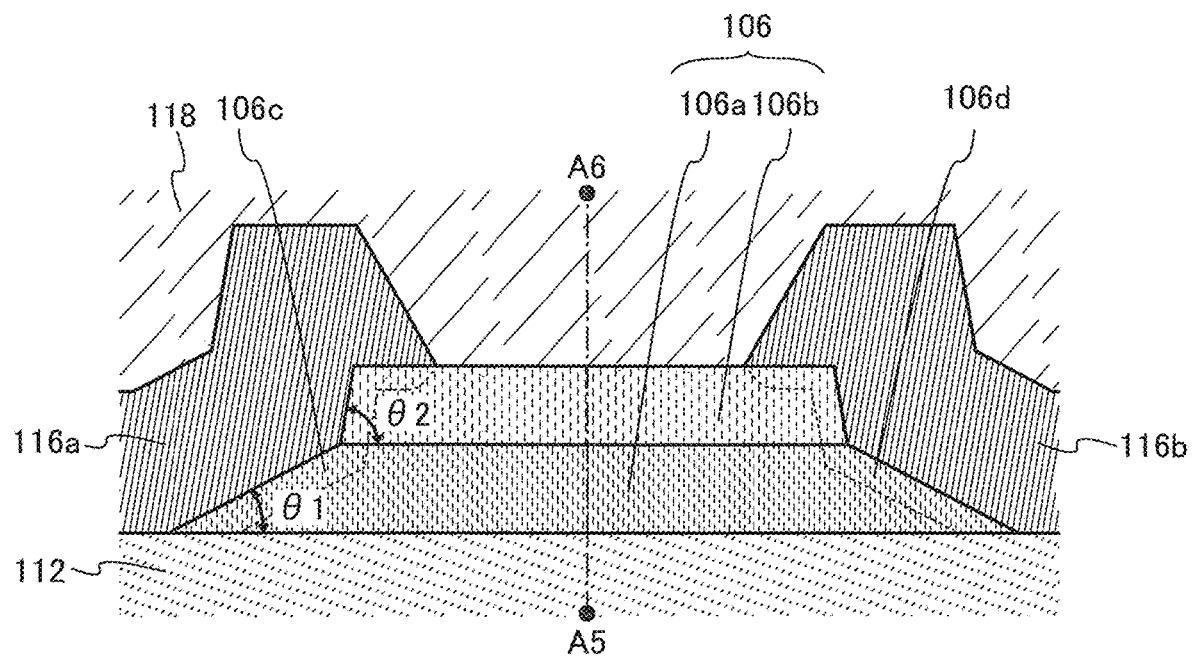
FIG. 2 is a cross-sectional view of a transistor.

FIG. 2 is an enlarged view illustrating a region surrounded by a dashed line in FIG. 1B.

In the multilayer film 106, at least the oxide semiconductor film 106a has a tapered shape. Preferably, the oxide film 106b also has a tapered shape. In addition, the tapered shape of the oxide semiconductor film 106a and the tapered shape of the oxide film 106b are different.

Specifically, when the angle between the bottom surface of the oxide semiconductor film 106a and a side surface of the oxide semiconductor film 106a in the oxide semiconductor film 106a is defined as a first angle θ1 and the angle between the bottom surface of the oxide film 106b and a side surface of the oxide film 106b in the oxide film 106b is defined as a second angle θ2, the first angle θ1 can be an acute angle and the second angle θ2 can be an acute angle or a right angle.

It is particularly preferable that the first angle θ1 and the second angle θ2 be both acute angles and that the first angle θ1 is smaller than the second angle θ2.

Further, the first angle θ1 is greater than or equal to 10° and less than 90°, preferably greater than or equal to 30° and less than or equal to 70°. The second angle θ2 is greater than or equal to 10° and less than 90°, preferably greater than or equal to 30° and less than or equal to 70°.

The following effects can be obtained by the tapered shape with different taper angles of the multilayer film 106 as shown above. The contact area of the source electrode 116a and the drain electrode 116b can be large with the tapered shape having different taper angles, compared with the tapered shape having one taper angle in the multilayer film 106. Accordingly, the contact resistance between the multilayer film 106 and the source and drain electrodes 116a and 116b is reduced, whereby on-state current of the transistor can be increased.

Further, by setting the second angle θ2 larger than the first angle θ1, the contact area of the oxide film 106b with the source and drain electrodes 116a and 116b can be reduced, which can cause a reduction of the low-resistance regions formed in the oxide film 106b. This suppresses the lowering of the resistance of the oxide film 106b and thereby can suppress generation of a leak path between the source electrode 116a and the drain electrode 116b. In addition, low-resistance regions can be formed effectively in the oxide semiconductor film 106a functioning as the channel region. Thus, an increase in on-state current and a reduction in off-state current of the transistor can be both achieved.

Figure 31A:
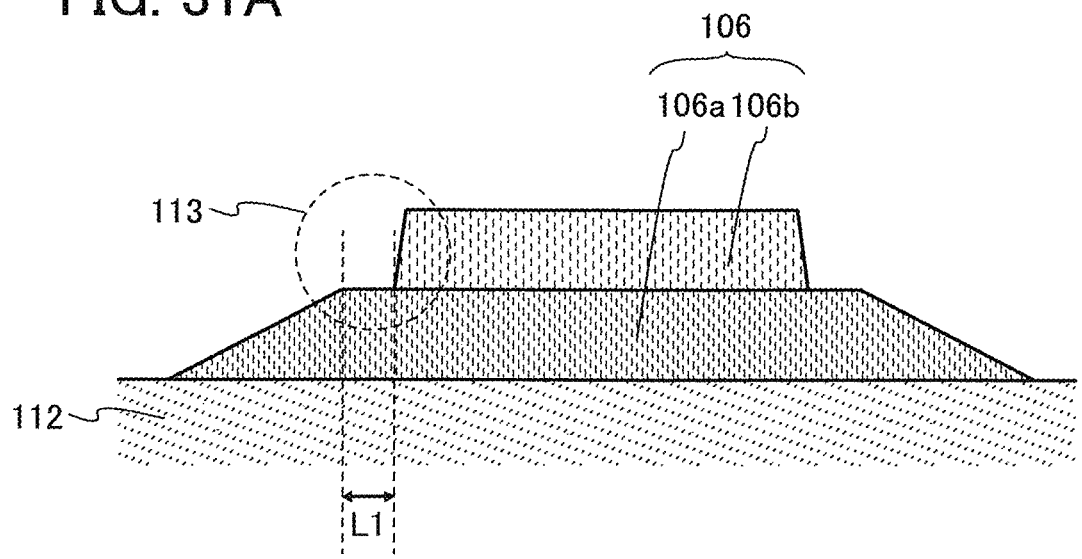
FIGS. 31A and 31B illustrate structures of multilayer films.
Figure 31B:
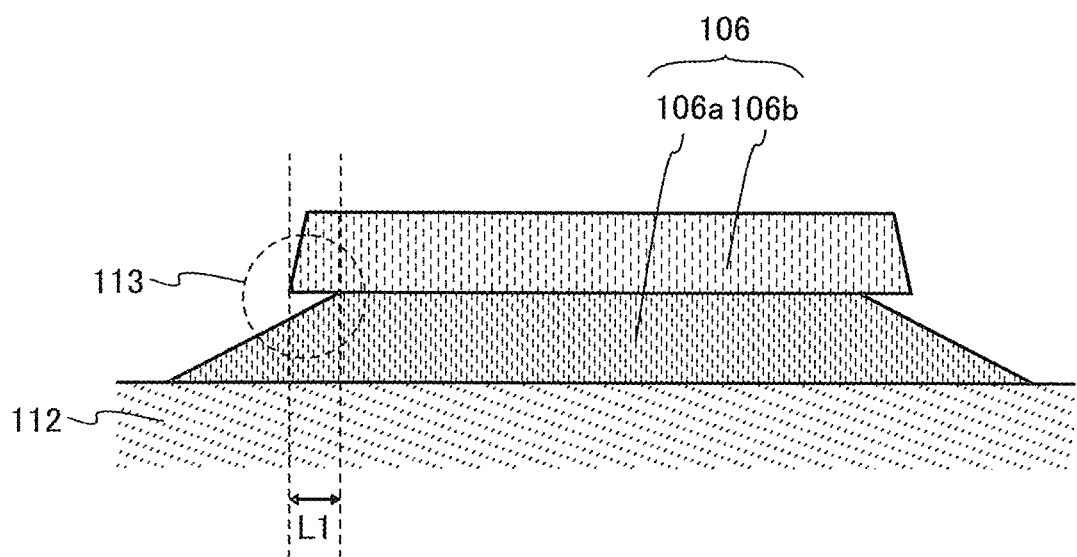

An upper edge of the oxide semiconductor film 106a substantially coincides with a lower edge of the oxide film 106b (see FIG. 2). That is, the multilayer film 106 does not have a large step 113 produced by the oxide semiconductor film 106a and the oxide film 106b (see FIGS. 31A and 31B). Therefore, disconnection of a film provided over the multilayer film 106 (e.g., a conductive film to be processed into the source electrode 116a and the drain electrode 116b) can be suppressed, and a transistor having favorable electrical characteristics can be manufactured. Note that the phrase "the upper edge of the oxide semiconductor film 106a and the lower edge of the oxide film 106b substantially coincide" means that the distance L1 between the lower edge of the oxide film 106b and the upper edge of the oxide semiconductor film 106a is 30 nm or shorter, preferably 10 nm or shorter (see FIGS. 31A and 31B).

The tapered shape can be formed by utilizing the difference in etching rate between the oxide semiconductor film 106a and the oxide film 106b in etching of the multilayer film 106. In particular, the above-described tapered shape can be formed by setting the etching rate of the oxide semiconductor film 106a lower than that of the oxide film 106b.

To form the tapered shape, wet etching using a solution containing a phosphoric acid as an etchant can be performed, for example.

Advantages in employing wet etching for forming the multilayer film 106 are as follows. In the case of dry etching, if an oxide semiconductor film and an oxide film which are to be processed into the multilayer film 106 have a defect such as a pinhole, for example, the insulating film (e.g., the gate insulating film) provided below the oxide semiconductor film and the oxide film may be etched through the pinhole by the dry etching. Further, an opening that reaches the electrode (e.g., the gate electrode) provided below the insulating film may be formed in the insulating film. The transistor formed under these conditions possibly has characteristics defects such as short circuit between the electrode below the insulating film and the electrode (e.g., the source electrode and the drain electrode) formed over the multilayer film 106. That is, dry etching of the multilayer film 106 leads to a reduction in yield of the transistor. By forming the multilayer film 106 by wet etching, a transistor with favorable electrical characteristics can be manufactured with high productivity.

The etching rate in wet etching varies depending on the concentration, temperature, and the like of the etchant. It is preferable to adjust the concentration, temperature, and the like of the etchant as appropriate so that the etching rate of the oxide semiconductor film 106a is lower than the etching rate of the oxide film 106b. Further, by setting the second angle θ2 larger than the first angle θ1, the area exposed to the etchant in the wet etching can be reduced, and in addition, the low-resistance regions formed in the oxide film 106b owing to contamination or defect generation by the etchant can be reduced.

For example, a solution of about 85% phosphoric acid or a mixed solution (also referred to as an aluminum etchant) containing a phosphoric acid (72%), a nitric acid (2%), and an acetic acid (9.8%) can be used as the above-described etchant. The temperature of the etchant is preferably room temperatures or normal temperatures of 20° C. to 35° C. Note that an etchant other than the above-described etchants may be used as well.

The oxide semiconductor film 106a is an oxide semiconductor film including at least indium. The oxide semiconductor film 106a may include zinc in addition to indium, for example. Further, the oxide semiconductor film 106a preferably includes an element M (M is Al, Ga, Ge, Y, Zr, Sn, La, Ce, or Nd) in addition to indium.

The oxide film 106b is an oxide film including one or more kinds of elements that are included in the oxide semiconductor film 106a. The energy of the bottom of the conduction band of the oxide film 106b is closer to the vacuum level than that of the oxide semiconductor film 106a by 0.05 eV or more, 0.07 eV or more, 0.1 eV or more, or 0.15 eV or more and 2 eV or less, 1 eV or less, 0.5 eV or less, or 0.4 eV or less. Under these conditions, when an electric field is applied to the gate electrode 104, a channel is formed in the oxide semiconductor film 106a having lower energy of the bottom of the conduction band in the multilayer film 106. That is, forming the oxide film 106b between the oxide semiconductor film 106a and the protective insulating film 118 enables the channel of the transistor to be formed in the oxide semiconductor film 106a which is not in contact with the protective insulating film 118. Further, since the oxide film 106b includes one or more kinds of elements that are included in the oxide semiconductor film 106a, interface scattering is unlikely to occur at the interface between the oxide semiconductor film 106a and the oxide film 106b. Thus, movement of carriers is not inhibited between the oxide semiconductor film 106a and the oxide film 106b, which results in an increase in the field-effect mobility of the transistor. Moreover, an interface state is less likely to be formed between the oxide semiconductor film 106a and the oxide film 106b. When an interface state is formed between the oxide semiconductor film 106a and the oxide film 106b, a second transistor having a different threshold voltage in which the interface between the oxide semiconductor film 106a and the oxide film 106b serves as a channel is formed and the apparent threshold voltage of the transistor varies in some cases. Thus, the oxide film 106b can reduce variations in the electrical characteristics of the transistor such as threshold voltage.

The oxide film 106b may be an oxide film including, for example, Al, Ga, Ge, Y, Zr, Sn, La, Ce, Nd or Hf (especially Al or Ga) at a proportion higher than that in the oxide semiconductor film 106a. Specifically, as the oxide film 106b, an oxide film including the above element at a proportion 1.5 times or more, preferably twice or more, further preferably 3 times or more that in the oxide semiconductor film 106a is used. The above element is strongly bonded to oxygen, and thus has a function of suppressing generation of oxygen vacancies in the oxide film. In other words, the oxide film 106b is an oxide film in which oxygen vacancies are less likely to be generated than in the oxide semiconductor film 106a.

For example, in the case where the oxide semiconductor film 106a is an In-M-Zn oxide having an atomic ratio of In to M and Zn of $x_1:y_1:z_1$ and the oxide film 106b is also an In-M-Zn oxide having an atomic ratio of In to M and Zn of $x_2:y_2:z_2$, the oxide semiconductor film 106a and the oxide film 106b which satisfy the following conditions are selected: $y_1/x_1$ is larger than $y_2/x_2$, preferably $y_1/x_1$ is 1.5 times or more as large as $y_2/x_2$, further preferably $y_1/x_1$ is twice or more as large as $y_2/x_2$, still further preferably $y_1/x_1$ is 3 times or more as large as $y_2/x_2$. Note that the element M is a metal element which has higher bonding strength to oxygen than In. Examples of the element M include Al, Ga, Ge, Y, Zr, Sn, La, Ce, or Nd (especially Al and Ga). At this time, $y_2$ is preferably greater than or equal to $x_2$ in the oxide film 106b, in which case stable electrical characteristics of a transistor can be achieved. However, when $y_2$ is 3 times or more as large as $x_2$, the field-effect mobility of the transistor decreases; for this reason, $y_2$ is preferably less than 3 times $x_2$.

When the oxide film 106b is dense, damage due to plasma in the manufacture process of the transistor is less likely to be caused, which leads to manufacture of a transistor with stable electrical characteristics.

The thickness of the oxide film 106b is greater than or equal to 3 nm and less than or equal to 100 nm, preferably greater than or equal to 3 nm and less than or equal to 50 nm. The thickness of the oxide semiconductor film 106a is greater than or equal to 3 nm and less than or equal to 200 nm, preferably greater than or equal to 3 nm and less than or equal to 100 nm, further preferably greater than or equal to 3 nm and less than or equal to 50 nm.

The concentration of silicon in each of the oxide semiconductor film 106a and the oxide film 106b is described below. In order to obtain stable electrical characteristics of a transistor, it is effective to reduce the concentration of impurities in the oxide semiconductor film 106a so that the oxide semiconductor film 106a becomes intrinsic or substantially intrinsic. Specifically, the carrier density of the oxide semiconductor film is preferably set to lower than $1 \times 10^{17}/cm^3$, lower than $1 \times 10^{15}/cm^3$, or lower than $1 \times 10^{13}/cm^3$. In the oxide semiconductor film, a light element, a semimetal element, a metal element, and the like (lower than 1 atomic %), other than main components serve as impurities. For example, hydrogen, nitrogen, carbon, silicon, germanium, titanium, and hafnium serve as impurities in the oxide semiconductor film. In order to reduce the concentration of impurities in the oxide semiconductor film, the concentrations of impurities in the gate insulating film 112 and the oxide film 106b which are adjacent to the oxide semiconductor film are preferably reduced.

For example, if silicon is contained in the oxide semiconductor film 106a, an impurity level is formed. In particular, if silicon exists between the oxide semiconductor film 106a and the oxide film 106b, the impurity level serves as a trap. For this reason, the concentration of silicon in a region between the oxide semiconductor film 106a and the oxide film 106b is set lower than $1 \times 10^{19}$ atoms/cm$^3$, preferably lower than $5 \times 10^{18}$ atoms/cm$^3$, further preferably lower than $2 \times 10^{18}$ atoms/cm$^3$.

Further, hydrogen and nitrogen in the oxide semiconductor film 106a form donor levels, which increase carrier density. The concentration of hydrogen in the oxide semiconductor film 106a, which is measured by secondary ion mass spectrometry (SIMS), is set to lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. The concentration of nitrogen, which is measured by SIMS, is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

It is preferable to reduce the concentrations of hydrogen and nitrogen in the oxide film 106b in order to reduce the concentrations of hydrogen and nitrogen in the oxide semiconductor film 106a. The concentration of hydrogen in the oxide film 106b, which is measured by SIMS, is set lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. The concentration of nitrogen, which is measured by SIMS, is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The oxide semiconductor film 106a and the oxide film 106b are amorphous or crystalline. Examples of the crystalline structure are a polycrystalline structure, a single crystal structure, and a microcrystalline structure. The oxide semiconductor film 106a and the oxide film 106b may have a mixed structure in which crystal grains are dispersed in an amorphous region. Note that the plane orientations of crystal grains are random in the microcrystalline structure, and the grain size of the microcrystalline structure or the mixed structure is greater than or equal to 0.1 nm and less than or equal to 10 nm, preferably greater than or equal to 1 nm and less than or equal to 10 nm, and further preferably greater than or equal to 2 nm and less than or equal to 4 nm.

It is preferable that the oxide semiconductor film 106a have a crystalline structure and the oxide film 106b have an amorphous structure or a crystalline structure. When the oxide semiconductor film 106a in which a channel is formed has a crystalline structure, stable electrical characteristics of a transistor can be achieved. Note that the oxide semiconductor film 106a having a crystalline structure is preferably a CAAC-OS (c-axis aligned crystalline oxide semiconductor) film.

Further, it is preferable that the oxide semiconductor film 106a be formed over an amorphous film. For example, the oxide semiconductor film 106a can be formed over a surface of an amorphous insulating film or a surface of an amorphous semiconductor film. By the film formation method described below, the oxide semiconductor film 106a which is a CAAC-OS film can be formed over an amorphous film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is low. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electrical characteristics due to irradiation with visible light or ultraviolet light is small. Thus, the transistor has stable electrical characteristics.

Note that when silicon and carbon are contained in the oxide semiconductor film 106a at a high concentration, the crystallinity of the oxide semiconductor film 106a is lowered in some cases. In order not to lower the crystallinity of the oxide semiconductor film 106a, the concentration of silicon in the oxide semiconductor film 106a is preferably set lower than $1\times10^{19}$ atoms/cm$^3$, preferably lower than $5\times10^{18}$ atoms/cm$^3$, further preferably lower than $2\times10^{18}$ atoms/cm$^3$. Moreover, in order not to lower the crystallinity of the oxide semiconductor film 106a, the concentration of carbon in the oxide semiconductor film 106a is set to be lower than $1\times10^{19}$ atoms/cm$^3$, preferably lower than $5\times10^{18}$ atoms/cm$^3$, further preferably lower than $2\times10^{18}$ atoms/cm$^3$.

As described above, in the case where the oxide semiconductor film 106a in which a channel is formed has high crystallinity and the number of states due to an impurity or a defect is small, a transistor including the multilayer film 106 has stable electrical characteristics.

Localized states of the multilayer film 106 are described below. By reducing localized states of the multilayer film 106, a transistor including the multilayer film 106 can have stable electrical characteristics. The localized states of the multilayer film 106 can be measured by a constant photocurrent method (CPM).

In order that the transistor has stable electrical characteristics, the absorption coefficient due to the localized level of the multilayer film 106 measured by CPM is preferably lower than $1\times10^{-3}$ cm$^{-1}$, further preferably lower than $3\times10^{-4}$ cm$^{-1}$. Further, when the absorption coefficient due to the localized level of the multilayer film 106 measured by CPM is lower than $1\times10^{-3}$ cm$^{-1}$, preferably lower than $3\times10^{-4}$ cm$^{-1}$, the field-effect mobility of the transistor can be increased. In order that the absorption coefficient due to the localized level of the multilayer film 106 measured by CPM is lower than $1\times10^{-3}$ cm$^{-1}$, preferably lower than $3\times10^{-4}$ cm$^{-1}$, the concentration of silicon, germanium, carbon, hafnium, titanium, and the like in the oxide semiconductor film 106a which form the localized level is preferably lower than $2\times10^{18}$ atoms/cm$^3$, further preferably lower than $2\times10^{17}$ atoms/cm$^3$.

In the CPM measurement, the amount of light with which a surface of the sample between terminals is irradiated is adjusted so that a photocurrent value is kept constant in the state where voltage is applied between electrodes provided in contact with the multilayer film 106 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

It is considered that the localized level obtained by CPM originates from an impurity or a defect. That is, a transistor which includes the multilayer film 106 having a small absorption coefficient due to the localized level obtained by CPM has stable electrical characteristics.

The band structure of the multilayer film 106 is described below with reference to FIG. 3.

In the example described here, an In—Ga—Zn oxide having an energy gap of 3.15 eV was used as the oxide semiconductor film 106a, and an In—Ga—Zn oxide having an energy gap of 3.5 eV was used as the oxide film 106b. The energy gaps were measured with a spectroscopic ellipsometer (UT-300 manufactured by HORIBA JOBIN YVON S.A.S.).

The energy difference between the vacuum level and the top of the valence band (also called ionization potential) of the oxide semiconductor film 106a and the energy difference between the vacuum level and the top of the valence band of the oxide film 106b were 8 eV and 8.2 eV, respectively. Note that the energy difference between the vacuum level and the top of the valence band was measured with an ultraviolet photoelectron spectroscopy (UPS) device (VersaProbe manufactured by ULVAC-PHI, Inc.).

Thus, the energy difference between the vacuum level and the bottom of the conduction band (also called electron affinity) of the oxide semiconductor film 106a and the energy gap between the vacuum level and the bottom of the conduction band of the oxide film 106b were 4.85 eV and 4.7 eV, respectively.

Figure 3:
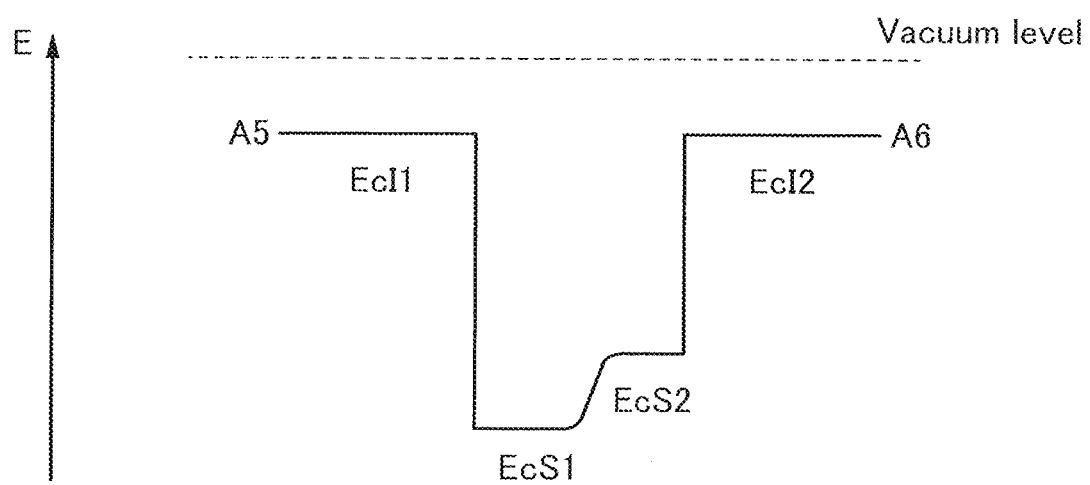
FIG. 3 shows a band structure of a multilayer film.

FIG. 3 schematically shows part of the band structure of the multilayer film 106 corresponding to the area taken along dashed-dotted line A5-A6 in FIG. 2. Specifically, a case where a silicon oxide film (the gate insulating film 112 and the protective insulating film 118) is provided in contact with each of the oxide semiconductor film 106a and the oxide film 106b is described. Here, EcI1 represents the energy of the bottom of the conduction band of the silicon oxide film, EcS1 represents the energy of the bottom of the conduction band of the oxide semiconductor film 106a, EcS2 represents the energy of the bottom of the conduction band of the oxide film 106b, and EcI2 represents the energy of the bottom of the conduction band of the silicon oxide film.

As illustrated in FIG. 3, there is no energy barrier between the oxide semiconductor film 106a and the oxide film 106b, and the energy level of the bottom of the conduction band gradually changes between the oxide semiconductor film 106a and the oxide film 106b. In other words, the energy level of the bottom of the conduction band is continuously changed. This is owing to the structure in which the oxide film 106b includes an element in common with the oxide semiconductor film 106a and a mixed layer is formed by oxygen movement between the oxide semiconductor film 106a and the oxide film 106b.

According to FIG. 3, the oxide semiconductor film 106a of the multilayer film 106 serves as a well and a channel region of a transistor including the multilayer film 106 is formed in the oxide semiconductor film 106a. Note that since the energy level of the bottom of the conduction band in the multilayer film 106 continuously changes, it can be said that the oxide semiconductor film 106a and the oxide film 106b make a continuous junction.

Figure 4:
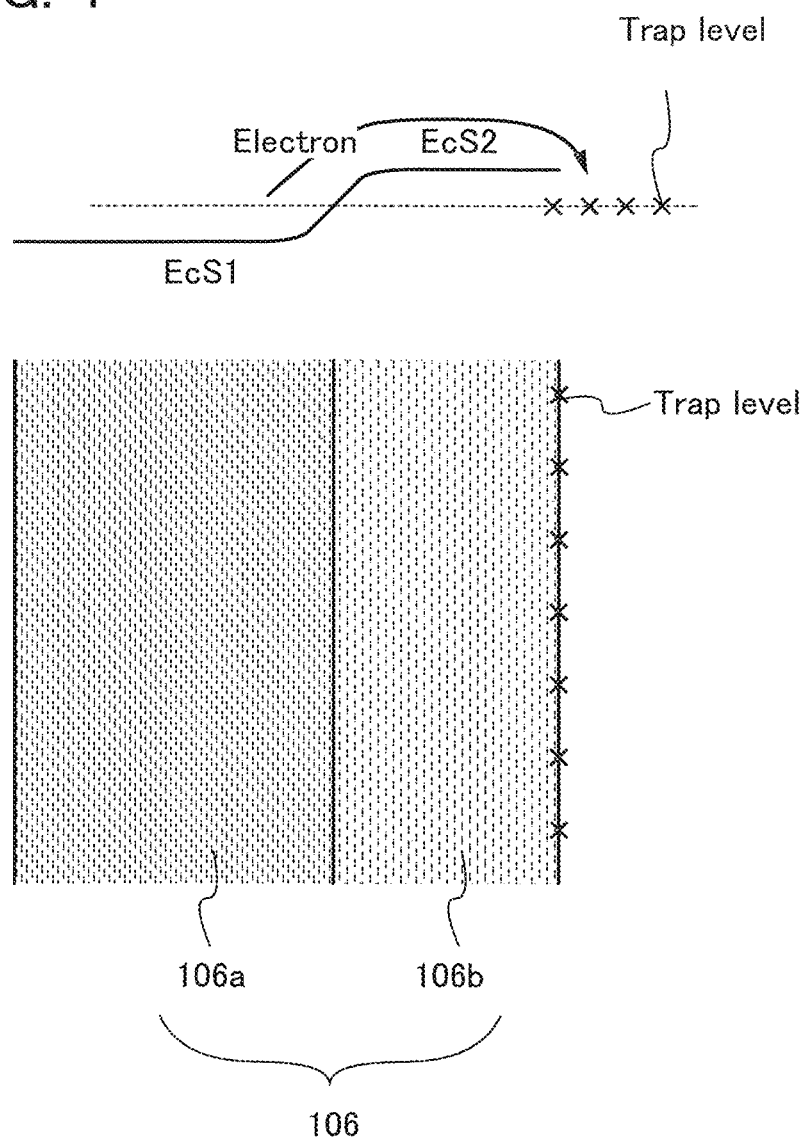
FIG. 4 shows a band structure of a multilayer film.

As illustrated in FIG. 4, trap levels due to impurities or defects can be formed in the vicinity of the interface between the oxide film 106b and the protective insulating film 118. However, the oxide film 106b can keep the oxide semiconductor film 106a away from the trap levels. However, when the energy difference between EcS1 and EcS2 is small, electrons in the oxide semiconductor film 106a might reach the trap levels over the energy gap. When the electrons are captured by the trap levels, negative fixed charges are generated, so that the threshold voltage of the transistor is shifted in the positive direction.

Thus, the energy difference between EcS1 and EcS2 is preferably greater than or equal to 0.1 eV, further preferably greater than or equal to 0.15 eV, in which case variations in the threshold voltage of the transistor can be reduced and stable electrical characteristics of the transistor can be achieved.

1-1-2. Source Electrode and Drain Electrode

The source electrode 116a and the drain electrode 116b may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten. The source electrode 116a and the drain electrode 116b are each preferably a multilayer film including a layer containing copper. In the case where the source electrode 116a and the drain electrode 116b are each a multilayer film including a layer containing copper and where a wiring is formed in the same layer as the source electrode 116a and the drain electrode 116b, wiring resistance can be reduced. Note that the source electrode 116a and the drain electrode 116b may have the same composition or different compositions.

In the case where a multilayer film including a layer containing copper is used for the source electrode 116a and the drain electrode 116b, trap levels as shown in FIG. 4 might be formed at the interface between the oxide film 106b and the protective insulating film 118 by the influence of copper. Also in this case, the oxide film 106b can prevent electrons from being trapped in the trap levels. Thus, stable electrical characteristics of a transistor can be achieved and wiring resistance can be reduced.

1-1-3. Protective Insulating Film

The protective insulating film 118 may be formed of a single layer or a stacked layer using an insulating film containing one or more kinds selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 118 may be, for example, a multilayer film including a silicon oxide film as a first layer and a silicon nitride film as a second layer. In that case, the silicon oxide film may be a silicon oxynitride film. In addition, the silicon nitride film may be a silicon nitride oxide film. As the silicon oxide film, a silicon oxide film whose defect density is low is preferably used. Specifically, a silicon oxide film whose spin density attributed to a signal with a g factor of 2.001 in electron spin resonance (ESR) is lower than or equal to $3 \times 10^{17}$ spins/cm$^3$, preferably lower than or equal to $5 \times 10^{16}$ spins/cm$^3$ is used. As the silicon nitride film, a silicon nitride film from which a hydrogen gas and an ammonia gas are less likely to be released is used. The amount of released hydrogen gas or ammonia gas may be measured by thermal desorption spectroscopy (TDS). Further, as the silicon nitride film, a silicon nitride film which does not transmit or hardly transmits hydrogen, water, and oxygen is used.

Figure 1D:
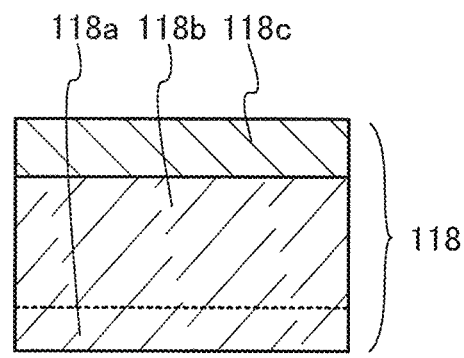

Alternatively, the protective insulating film 118 may be, for example, a multilayer film including a first silicon oxide film 118a as a first layer, a second silicon oxide film 118b as a second layer, and a silicon nitride film 118c as a third layer (see FIG. 1D). In that case, the first silicon oxide film 118a and/or the second silicon oxide film 118b may be a silicon oxynitride film. In addition, the silicon nitride film may be a silicon nitride oxide film. As the first silicon oxide film 118a, a silicon oxide film whose defect density is low is preferably used. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide film 118b, a silicon oxide film containing excess oxygen is used. As the silicon nitride film 118c, a silicon nitride film from which a hydrogen gas and an ammonia gas are less likely to be released is used. Further, as the silicon nitride film, a silicon nitride film which does not transmit or hardly transmits hydrogen, water, and oxygen is used.

The silicon oxide film having excess oxygen means a silicon oxide film from which oxygen can be released by heat treatment or the like. An insulating film having excess oxygen means an insulating film from which oxygen is released by heat treatment.

The insulating film containing excess oxygen is capable of reducing oxygen vacancies in the oxide semiconductor film 106a. Oxygen vacancies in the oxide semiconductor film 106a form defect levels, and some of the defect levels become donor levels. Thus, by a reduction in oxygen vacancies in the oxide semiconductor film 106a (particularly, in the channel region), the carrier density of the oxide semiconductor film 106a (particularly the channel region) can be reduced, whereby the transistor can have stable electrical characteristics.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis (converted into the number of oxygen atoms).

Further, the film from which oxygen is released by heat treatment may contain a peroxide radical. Specifically, the spin density attributed to a peroxide radical is greater than or equal to $5\times10^{17}$ spins/cm$^3$. Note that the film containing a peroxide radical may have an asymmetric signal at a g factor of around 2.01 in ESR.

The insulating film containing excess oxygen may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

1-1-4. Gate Insulating Film

The gate insulating film 112 may be formed of a single layer or a stacked layer using an insulating film containing one or more kinds selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film may be, for example, a multilayer film including a silicon nitride film as a first layer and a silicon oxide film as a second layer. In that case, the silicon oxide film may be a silicon oxynitride film. In addition, the silicon nitride film may be a silicon nitride oxide film. As the silicon oxide film, a silicon oxide film whose defect density is low is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon oxide film, a silicon oxide film containing excess oxygen is preferably used. As the silicon nitride film, a silicon nitride film from which a hydrogen gas and an ammonia gas are less likely to be released is used. The amount of released hydrogen gas or ammonia gas may be measured by TDS.

In the case where at least one of the gate insulating film 112 and the protective insulating film 118 includes an insulating layer containing excess oxygen, oxygen vacancies in the oxide semiconductor film 106a are reduced, so that stable electrical characteristics of a transistor can be achieved.

1-1-5. Gate Electrode

The gate electrode 104 may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten.

1-1-6. Substrate

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 100, minute processing is sometimes difficult due to shrinkage of the substrate 100 caused by heat treatment or the like in a manufacturing process of a semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment which is performed for an hour at 400° C., preferably 450° C., further preferably 500° C. is less than or equal to 10 ppm, preferably less than or equal to 5 ppm, further preferably less than or equal to 3 ppm.

Further alternatively, a flexible substrate may be used as the substrate 100. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

In the transistor manufactured as described above, a channel is formed in the oxide semiconductor film 106a; thus, the transistor has stable electrical characteristics and a high field-effect mobility. Even when the source electrode 116a and the drain electrode 116b are formed of a multilayer film including a layer containing copper, stable electrical characteristics can be obtained.

1-2. Method for Manufacturing Transistor Structure (1)

A method for manufacturing a transistor is described here with reference to FIGS. 5A to 5C and FIGS. 6A and 6B.

First, the substrate 100 is prepared.

Then, a conductive film to be the gate electrode 104 is formed. The conductive film to be the gate electrode 104 may be formed using any of the conductive films given as examples of the gate electrode 104 by a sputtering method, a chemical vapor deposition (CVD) method, a molecular beam epitaxy (MBE) method, an atomic layer deposition (ALD) method, or a pulsed laser deposition (PLD) method.

Figure 5A:
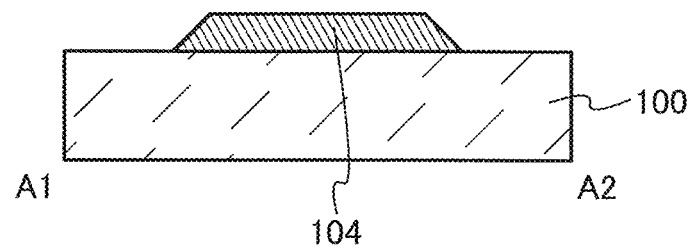
FIGS. 5A to 5C are cross-sectional views illustrating a method for manufacturing a transistor.

Next, the conductive film to be the gate electrode 104 is partly etched to form the gate electrode 104 (see FIG. 5A).

Figure 5B:
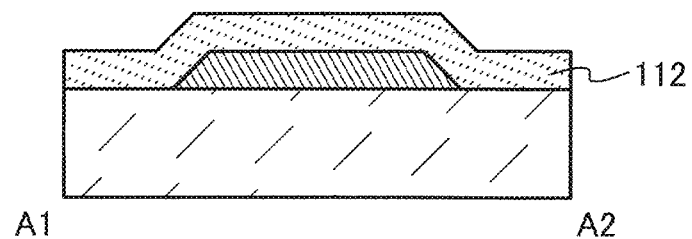

Next, the gate insulating film 112 is formed (see FIG. 5B). The gate insulating film 112 may be formed in such a manner that any of the insulating films given above as examples of the gate insulating film 112 is formed by a sputtering method, a CVD method, an MBE method, an ALD method, or a PLD method.

Figure 5C:
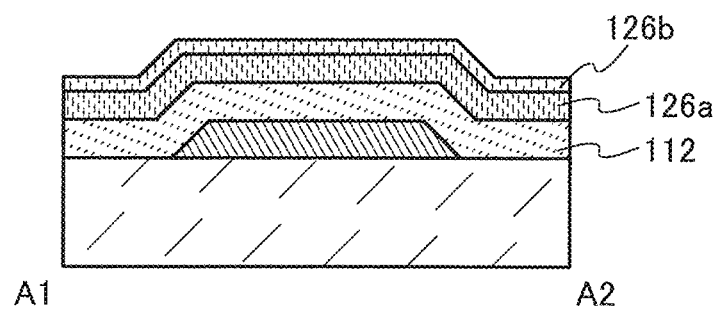

Next, an oxide semiconductor film 126a which is to be processed into the oxide semiconductor film 106a is formed (see FIG. 5C). As the oxide semiconductor film 126a, the oxide semiconductor film described above as the oxide semiconductor film 106a can be formed by a sputtering method, a CVD method, an MBE method, an ALD method, or a PLD method.

Next, an oxide film 126b to be processed into the oxide film 106b is formed. The oxide film 126b may be formed in such a manner that any of the oxide films given above as examples of the oxide film 106b is formed by a sputtering method, a CVD method, an MBE method, an ALD method, or a PLD method.

In the case where the oxide semiconductor film 126a and the oxide film 126b are formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the compositions of the oxide semiconductor film 126a and the oxide film 126b.

In the case of using a sputtering method, at least the oxide semiconductor film 126a can become a CAAC-OS film by the following method. Specifically, the oxide semiconductor film 126a is formed by a heat treatment where the substrate temperature is set higher than or equal to 150° C. and lower than or equal to 500° C., preferably higher than or equal to 150° C. and lower than or equal to 450° C., and further preferably higher than or equal to 200° C. and lower than or equal to 350° C. Note that the oxide film 126b may also be formed by such heat treatment.

To make a continuous junction between the oxide semiconductor film 106a and the oxide film 106b, the oxide semiconductor film 126a and the oxide film 126b are preferably formed in succession without being exposed to the air, in which case impurities can be prevented from being taken in between the oxide semiconductor film 126a and the oxide film 126b.

Specifically, to make the continuous junction, the films are preferably stacked in succession without exposure to the air using a deposition apparatus (sputtering apparatus) of a multi chamber type with a load lock chamber. Each chamber in the sputtering apparatus is preferably evacuated to be a high vacuum state (to the degree of about $1\times10^{-4}$ Pa to $5\times10^{-7}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas from an exhaust system to the inside of the chamber.

In order to obtain an oxide semiconductor film with reduced impurities and reduced density of carriers, besides the high vacuum evacuation of the chamber, purification of a sputtering gas is also needed. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

Note that in the case where the oxide film 126b is formed by a sputtering method, a target containing indium is preferably used in order to reduce the number of particles generated in the film formation. Moreover, it is preferable to use an oxide target in which the proportion of gallium is relatively small. Particularly in the case where a target containing indium is used, the conductivity of the target can be increased and DC discharge and AC discharge are facilitated; therefore, film formation over a large-sized substrate can be easily performed. Thus, semiconductor devices can be manufactured with improved productivity.

After the oxide semiconductor film 126a and the oxide film 126b are formed, plasma treatment in an oxygen atmosphere or a mixed atmosphere of nitrogen and oxygen may be performed. Thus, oxygen vacancies in at least the oxide semiconductor film 126a can be reduced.

Figure 6A:
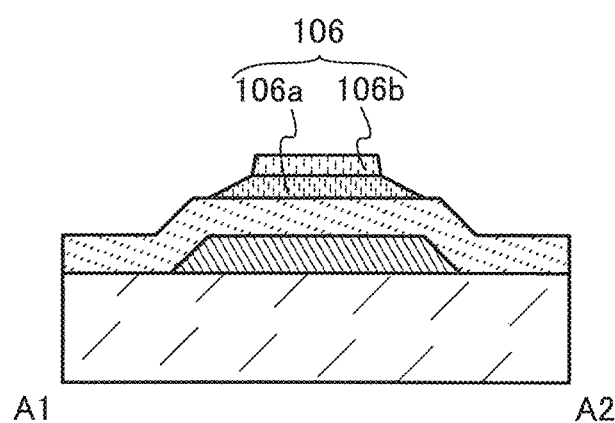
FIGS. 6A and 6B are cross-sectional views illustrating a method for manufacturing a transistor.

Next, a resist mask is formed over the oxide semiconductor film 126a and the oxide film 126b, and part of the oxide semiconductor film 126a and part of the oxide film 126b are etched with the use of the resist mask; thus, the multilayer film 106 including the oxide semiconductor film 106a and the oxide film 106b is formed (see FIG. 6A). For the etching, wet etching is performed in the above-described manner. By the wet etching, the multilayer film 106 can have a tapered shape having two different taper angles.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment enables the crystallinity of the oxide semiconductor film 106a to be improved, and in addition, impurities such as water, hydrogen, nitrogen, and carbon to be removed from the gate insulating film 112 and the multilayer film 106.

Note that the first heat treatment can be performed at least before or after the etching step for forming the multilayer film 106.

Then, a conductive film to be the source electrode 116a and the drain electrode 116b is formed. The conductive film to be the source electrode 116a and the drain electrode 116b may be formed in such a manner that any of the conductive films given above as examples of the source electrode 116a and the drain electrode 116b is formed by a sputtering method, a CVD method, an MBE method, an ALD method, or a PLD method.

For example, a multilayer film including a tungsten layer and a copper layer over the tungsten layer may be formed as the conductive film to be the source electrode 116a and the drain electrode 116b.

Figure 6B:
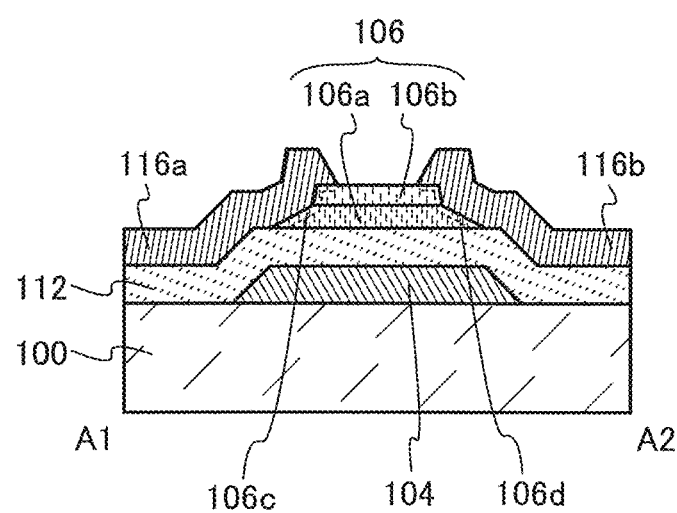

Next, the conductive film to be the source electrode 116a and the drain electrode 116b is partly etched to form the source electrode 116a and the drain electrode 116b (see FIG. 6B). In the case where a multilayer film including a tungsten layer and a copper layer over the tungsten layer is used as the conductive film to be the source electrode 116a and the drain electrode 116b, the multilayer film can be etched with the use of one etching mask. Even when the tungsten layer and the copper layer are etched at once, the concentration of copper in a region between the oxide semiconductor film 106a and the oxide film 106b can be lower than $1\times10^{19}$ atoms/cm$^3$, lower than $2\times10^{18}$ atoms/cm$^3$, or lower than $2\times10^{17}$ atoms/cm$^3$ owing to the oxide film 106b provided over the oxide semiconductor film 106a. Thus, deterioration of electrical characteristics of the transistor due to copper is not caused. Thus, the degree of freedom of the process is increased, so that transistors can be manufactured with improved productivity.

Next, second heat treatment is preferably performed. The description of the first heat treatment can be referred to for the second heat treatment. The second heat treatment can remove impurities such as hydrogen and water from the multilayer film 106. Hydrogen easily moves especially in the multilayer film 106; thus, reducing hydrogen by the second heat treatment enables a transistor to have stable electrical characteristics. Note that water is a compound containing hydrogen and thus might serve as an impurity in the oxide semiconductor film 106$a$.

In addition, by the second heat treatment, the low-resistance region 106$c$ and the low-resistance region 106$d$ can be formed in the multilayer film 106 in contact with the source electrode 116$a$ and the drain electrode 116$b$.

By forming the multilayer film 106 in the above-described manner, the crystallinity of the oxide semiconductor film 106$a$ can be increased, and the concentrations of impurities in the oxide semiconductor film 106$a$ and the oxide film 106$b$ and at the interface between the oxide semiconductor film 106$a$ and the oxide film 106$b$ can be reduced.

Next, the protective insulating film 118 is formed (see FIG. 1B). The protective insulating film 118 may be formed in such a manner that any of the insulating films given above as examples of the protective insulating film 118 is formed by a sputtering method, a CVD method, an MBE method, an ALD method, or a PLD method.

Here, the case where the protective insulating film 118 has a three-layer structure as illustrated in FIG. 1D is described. First, the first silicon oxide film 118$a$ is formed, and then the second silicon oxide film 118$b$ is formed. Next, treatment for adding oxygen ions to the second silicon oxide film 118$b$ may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, the silicon nitride film 118$c$ is formed. The protective insulating film 118 may be formed in the above manner.

The first silicon oxide film 118$a$ is preferably formed by a plasma CVD method which is one type of CVD method. Specifically, the first silicon oxide film 118$a$ may be formed by supplying high-frequency power to an electrode under the following conditions: the substrate temperature is higher than or equal to 180° C. and lower than or equal to 400° C., preferably higher than or equal to 200° C. and lower than or equal to 370° C., a deposition gas containing silicon and an oxidizing gas are used, and the pressure is higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content in the first silicon oxide film 118$a$ can be reduced and dangling bonds can be reduced.

In the above manner, the first silicon oxide film 118$a$ with low defect density is formed. That is, the spin density of the first silicon oxide film 118$a$, which is attributed to a signal with a g factor of 2.001 in ESR, can be lower than or equal to $3\times10^{17}$ spins/cm$^3$, preferably lower than or equal to $5\times10^{16}$ spins/cm$^3$.

The second silicon oxide film 118$b$ is preferably formed by a plasma CVD method. Specifically, the second silicon oxide film 118$b$ may be formed by supplying high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$, to an electrode under the following conditions: the substrate temperature is higher than or equal to 160° C. and lower than or equal to 350° C., preferably higher than or equal to 180° C. and lower than or equal to 260° C., a deposition gas containing silicon and an oxidizing gas are used, and the pressure is higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the second silicon oxide film 118$b$ containing excess oxygen can be formed.

The silicon nitride film 118$c$ is preferably formed by a plasma CVD method. Specifically, the silicon nitride film 118$c$ may be formed by supplying high-frequency power under the following conditions: the substrate temperature is higher than or equal to 180° C. and lower than or equal to 400° C., preferably higher than or equal to 200° C. and lower than or equal to 370° C., a deposition gas containing silicon, a nitrogen gas, and an ammonia gas are used, and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of ammonia as the source gas can promote decomposition of the deposition gas containing silicon and the nitrogen gas. This is because the ammonia gas is dissociated by plasma energy or heat energy, and energy generated by the dissociation contributes to decomposition of a bond of the deposition gas containing silicon and a bond of the nitrogen gas.

Through the above method, the silicon nitride film 118$c$ from which the hydrogen gas and the ammonia gas are less likely to be released can be formed. The silicon nitride film 118$c$ has low hydrogen content, and thus is dense and does not transmit or hardly transmit hydrogen, water, and oxygen.

Next, third heat treatment is preferably performed. The description of the first heat treatment can be referred to for the third heat treatment. By the third heat treatment, excess oxygen is released from the gate insulating film 112 and/or the protective insulating film 118; thus, oxygen vacancies in the multilayer film 106 can be reduced. Note that in the multilayer film 106, an oxygen vacancy captures an adjacent oxygen atom, so that the oxygen vacancy seems to move.

In the above manner, the BGTC transistor illustrated in FIGS. 1A to 1D can be manufactured.

1-3. Transistor Structure (2)

A transistor which is a modified example of the transistor illustrated in FIGS. 1A to 1D is described with reference to FIGS. 7A to 7D.

Figure 7A:
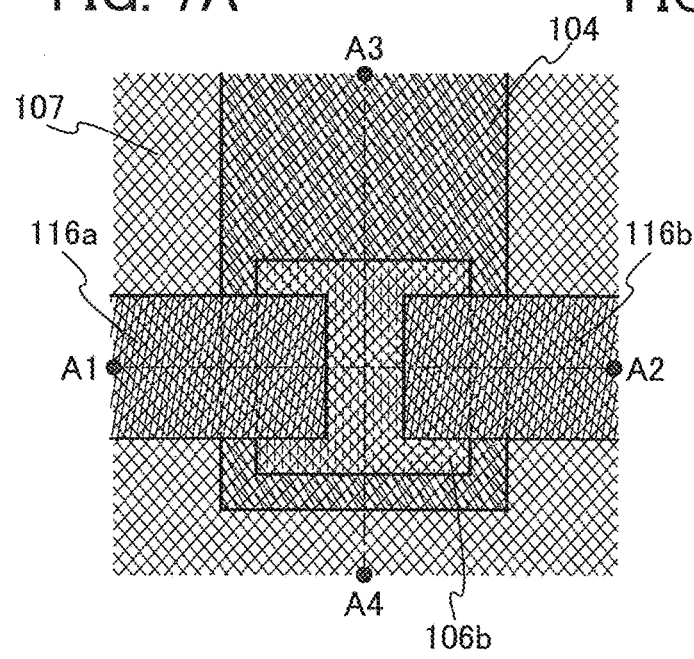
FIG. 7A is a top view of a transistor.
Figure 7C:
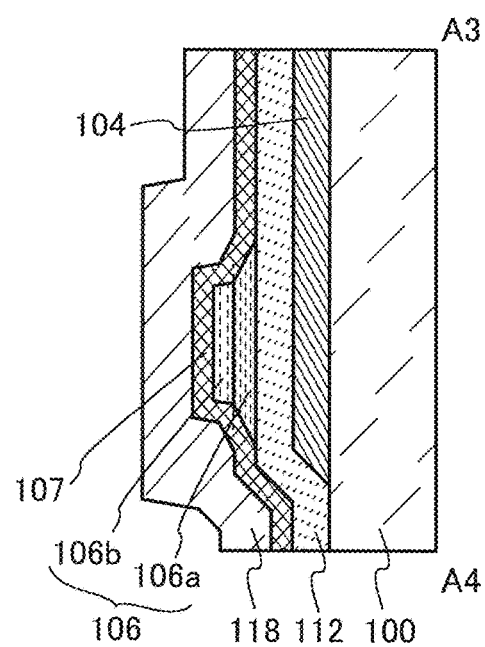
FIGS. 7B to 7D are cross-sectional views thereof.
Figure 7B:
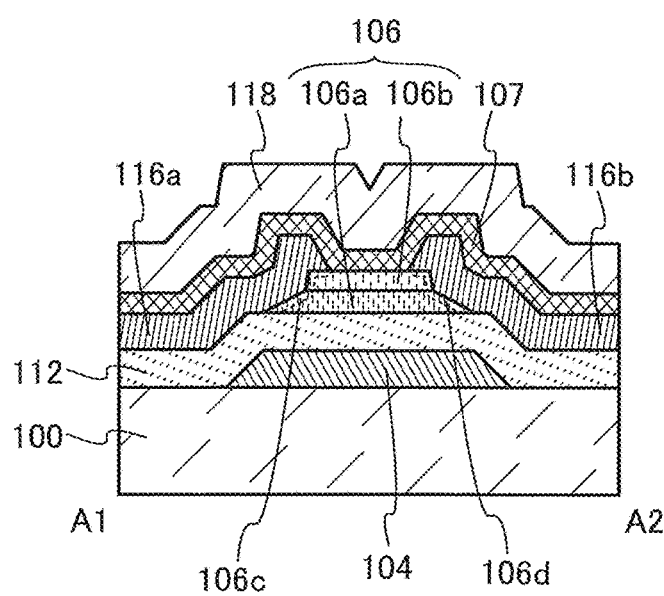
Figure 7D:
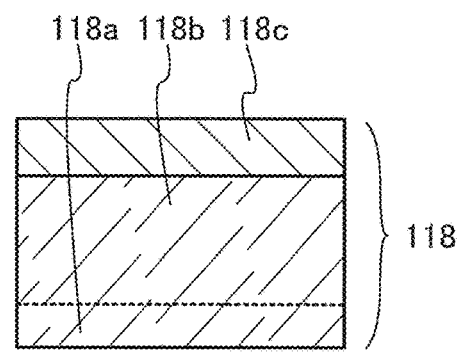

FIGS. 7A to 7D are a top view and cross-sectional views of the modified example. FIG. 7A is a top view of the transistor. FIG. 7B is a cross-sectional view taken along dashed-dotted line A1-A2 in FIG. 7A. FIG. 7C is a cross-sectional view taken along dashed-dotted line A3-A4 in FIG.

7A. Note that in FIG. 7A, some components of the transistor (e.g., a gate insulating film and a protective insulating film) are not illustrated for simplicity of the drawing.

The transistor illustrated in FIGS. 7A to 7D is different from the transistor illustrated in FIGS. 1A to 1D in that an oxide film 107 is provided in contact with top surfaces of the source and drain electrodes 116a and 116b and a top surface of the multilayer film 106.

As the oxide film 117, an oxide film that can be used for the oxide film 106b of the multilayer film 106 can be formed using the method that can be applied to formation of the oxide film 106b. The other components of the transistor illustrated in FIGS. 7A to 7D are the same as those of the transistor illustrated in FIGS. 1A to 1D, and the above description can be appropriately referred to.

In the structure of the transistor illustrated in FIGS. 7A to 7D, the oxide film 106b and the oxide film 107 are provided between the oxide semiconductor film 106a and the protective insulating film 118. This structure can keep trap states formed in the vicinity of the interface with the protective insulating film 118 owing to impurities and defects away more from the oxide semiconductor film 106a. That is, even when the energy gap between EcS1 and EcS2 is small, electrons in the oxide semiconductor film 106a can be prevented from reaching the trap states over the energy gap. Thus, the transistor illustrated in FIGS. 7A to 7D is a transistor with stable electrical characteristics and less variation in threshold voltage.

For a method for manufacturing the transistor illustrated in FIGS. 7A to 7D, the description of the transistor illustrated in FIGS. 1A to 1D can be appropriately referred to.

As described above, the transistors illustrated in FIGS. 1A to 1D and FIGS. 7A to 7D have stable electrical characteristics because impurities and the density of carriers are reduced in the oxide semiconductor film 106a (especially, the channel region) of the multilayer film 106.

Embodiment 2

In this embodiment, a transistor which is one embodiment of the present invention and has a structure that is partly different from the structures described in Embodiment 1 will be described.

2-1. Transistor Structure (3)

In this embodiment, a top-gate transistor is described. Here, a top-gate top-contact (TGTC) transistor, which is one kind of a top gate transistor, is described with reference to FIGS. 8A to 8C.

Figure 8A:
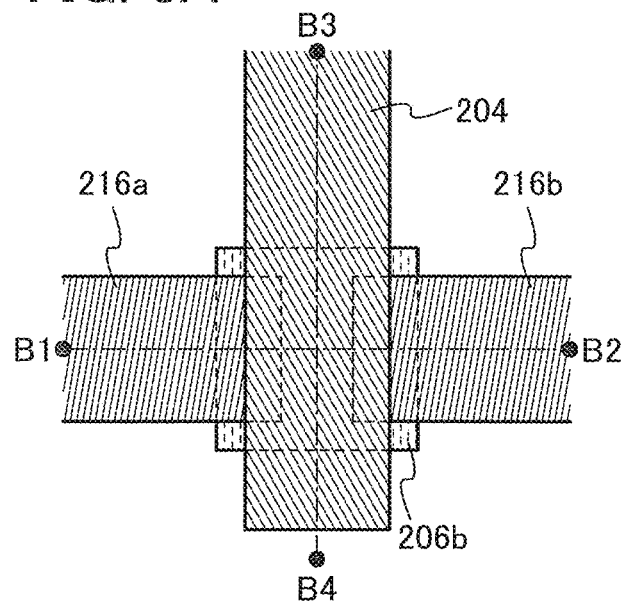
FIG. 8A is a top view of a transistor.
Figure 8C:
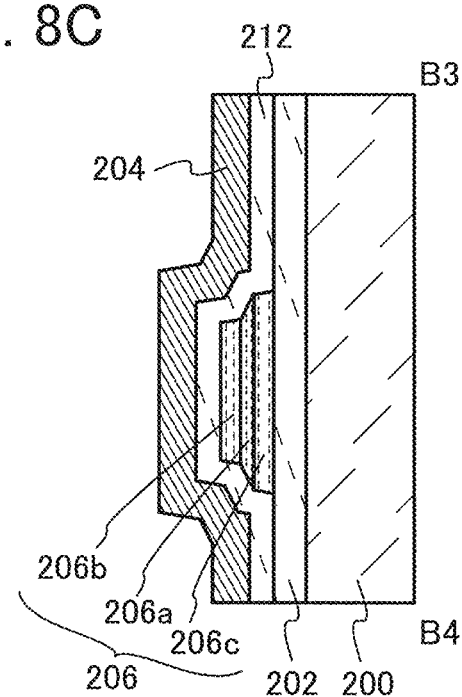
FIGS. 8B and 8C are cross-sectional views thereof.
Figure 8B:
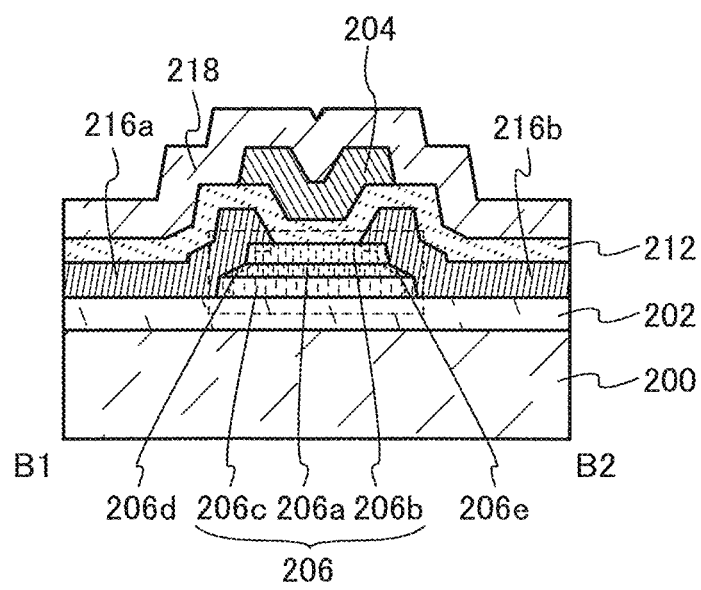

FIGS. 8A to 8C are a top view and cross-sectional views of a TGTC transistor. FIG. 8A is a top view of the transistor. FIG. 8B is a cross-sectional view taken along dashed-dotted line B1-B2 in FIG. 8A. FIG. 8C is a cross-sectional view taken along dashed-dotted line B3-B4 in FIG. 8A.

The transistor illustrated in FIG. 8B includes a base insulating film 202 provided over a substrate 200, a multilayer film 206 which includes an oxide film 206c provided over the base insulating film 202, an oxide semiconductor film 206a provided over the oxide film 206c, and an oxide film 206b provided over the oxide semiconductor film 206a, a source electrode 216a and a drain electrode 216b provided over the base insulating film 202 and the multilayer film 206, a gate insulating film 212 provided over the multilayer film 206, the source electrode 216a, and the drain electrode 216b, a gate electrode 204 provided over the gate insulating film 212, and a protective insulating film 218 provided over the gate insulating film 212 and the gate electrode 204. Note that either or both of the base insulating film 202 and the protective insulating film 218 may be eliminated from the transistor.

Note that a conductive film used for the source electrode 216a and the drain electrode 216b gains oxygen from part of the multilayer film 206 or forms a mixed layer depending on its kind, which results in formation of a low-resistance region 206d and a low-resistance region 206e in the multilayer film 206. The low-resistance region 206d and the low-resistance region 206e are regions of the multilayer film 206 which are in the vicinity of the interfaces in contact with the source electrode 216a and the drain electrode 216b (regions between the dashed lines in the multilayer film 206 and the source and drain electrodes 216a and 216b) in FIG. 8B. The low-resistance region 206d and the low-resistance region 206e partly or entirely function as source and drain electrodes.

In FIG. 8A, the distance between the source electrode 216a and the drain electrode 216b in a region overlapping with the gate electrode 204 is called channel length. Note that in the case where the transistor includes a source region and a drain region, the distance between the source region and the drain region in a region overlapping with the gate electrode 204 may be called channel length.

Note that a channel formation region refers to a region, which overlaps with the gate electrode 204 and is interposed between the source electrode 216a and the drain electrode 216b, in the multilayer film 206. Further, a channel region refers to a region through which current mainly flows in the channel formation region. Here, the channel region is a portion of the oxide semiconductor film 206a in the channel formation region.

2-1-1. Multilayer Film

The multilayer film 206 has a structure in which the oxide film 206b and the oxide film 206c are stacked over and below the oxide semiconductor film 206a. A bottom surface of the oxide semiconductor film 206a corresponds to the surface on the substrate 200 side of the oxide semiconductor film 206a or the boundary surface between the oxide semiconductor film 206a and the oxide film 206c. A bottom surface of the oxide film 206b corresponds to the surface on the substrate 200 side of the oxide film 206b or the boundary surface between the oxide film 206b and the oxide semiconductor film 206a. A bottom surface of the oxide film 206c corresponds to the surface on the substrate 200 side of the oxide film 206c or the surface in contact with the gate insulating film 112 of the oxide film 206c. Note that the boundaries in the stacked structure of the multilayer film 206 can be observed by scanning transmission electron microscopy (STEM). However, the boundaries cannot be observed clearly in some cases depending on the materials used in the oxide semiconductor film 206a and the oxide films 206b and 206c.

As the oxide semiconductor film 206a, an oxide semiconductor film that can be used as the oxide semiconductor film 106a in Embodiment 1 can be used. As the oxide film 206b, an oxide film that can be used as the oxide semiconductor film 106b in Embodiment 1 can be used. As the oxide film 206c, an oxide film that can be used as the oxide semiconductor film 106b in Embodiment 1 can be used.

In the multilayer film 206, at least the oxide semiconductor film 206a has a tapered shape. It is preferable that the oxide film 206b and the oxide film 206c also have tapered shapes. Further, it is preferable that at least the tapered shape of the oxide semiconductor film 206a is different from the tapered shapes of the oxide film 206b and the oxide film 206c. The tapered shape of the oxide film 206b may be the same as or different from that of the oxide film 206c.

Specifically, when the angle between the bottom surface of the oxide semiconductor film 206a and a side surface of the oxide semiconductor film 206a in the oxide semiconductor film 206a is defined as a first angle θ1, the angle between the bottom surface of the oxide film 206b and a side surface of the oxide film 206b in the oxide film 206b is defined as a second angle θ2, and the angle between the bottom surface of the oxide film 206c and a side surface of the oxide film 206c in the oxide film 206c is defined as a third angle θ3, the first angle θ1 can be an acute angle and the second angle θ2 and the third angle θ3 can be individually an acute angle or a right angle.

Figure 9:
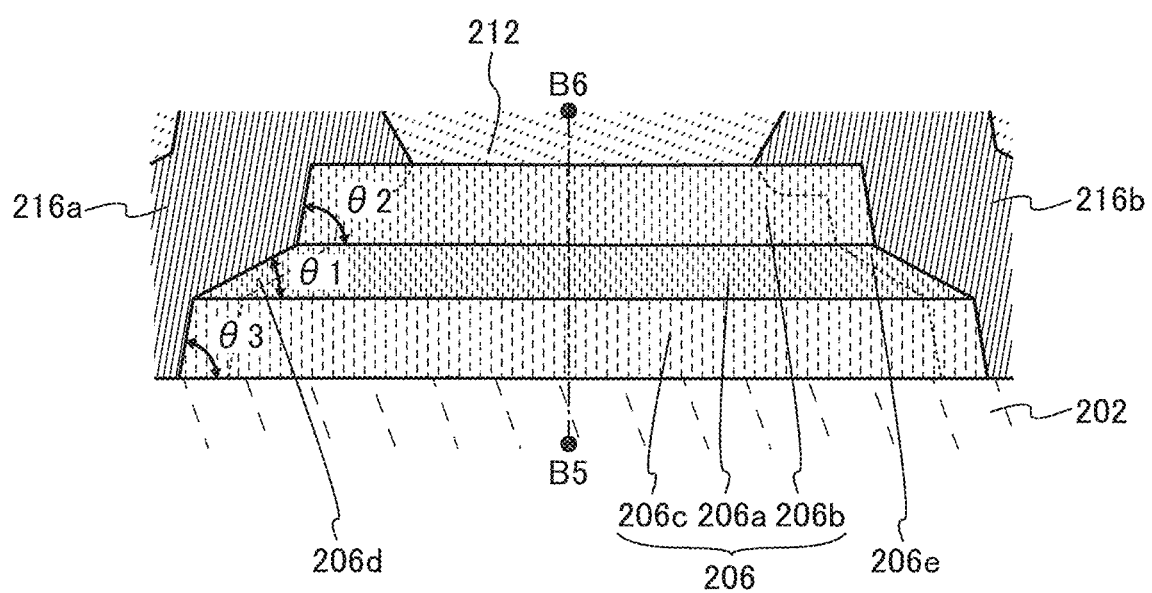
FIG. 9 is a cross-sectional view of a transistor.

It is particularly preferable that the first angle θ1, the second angle θ2, and the third angle θ3 be all acute angles and at least that the first angle θ1 is smaller than the second angle θ2 and the third angle θ3 (see FIG. 9).

Note that the second angle θ2 and the third angle θ3 may be the same angle or different angles. For example, the second angle θ2 and the third angle θ3 can be the same angle by using the same kind of oxide films as the oxide film 206b and the oxide film 206c.

Further, the first angle θ1 is greater than or equal to 10° and less than 90°, preferably greater than or equal to 30° and less than or equal to 70°. The second angle θ2 and the third angle θ3 are each greater than or equal to 10° and less than 90°, preferably greater than or equal to 30° and less than or equal to 70°.

The following effects can be obtained by the tapered shape with different taper angles of the multilayer film 206. The contact area of the source electrode 216a and the drain electrode 216b can be large with the tapered shape having different taper angles, compared with the tapered shape having one taper angle in the multilayer film 206. Accordingly, the contact resistance between the multilayer film 206 and the source and drain electrodes 216a and 216b is reduced, whereby on-state current of the transistor can be increased.

Further, by setting the second angle θ2 and the third angle θ3 larger than the first angle θ1, the contact area of the oxide films 206b and 206c with the source and drain electrodes 216a and 216b can be reduced, which can cause a reduction of the low-resistance regions formed in the oxide films 206b and 206c. This suppresses the lowering of the resistance of one or both of the oxide films 206b and 206c and thereby can suppress generation of a leak path between the source electrode 216a and the drain electrode 216b. In addition, low-resistance regions can be formed effectively in the oxide semiconductor film 206a functioning as the channel region. Thus, an increase in on-state current and a reduction in off-state current of the transistor can be both achieved.

Figure 32A:
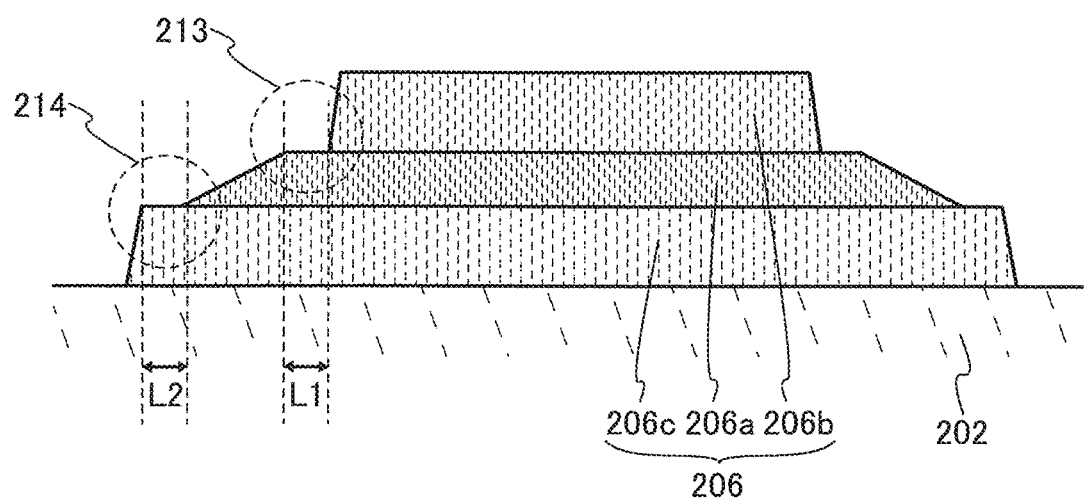
FIGS. 32A and 32B illustrate structures of multilayer films.
Figure 32B:
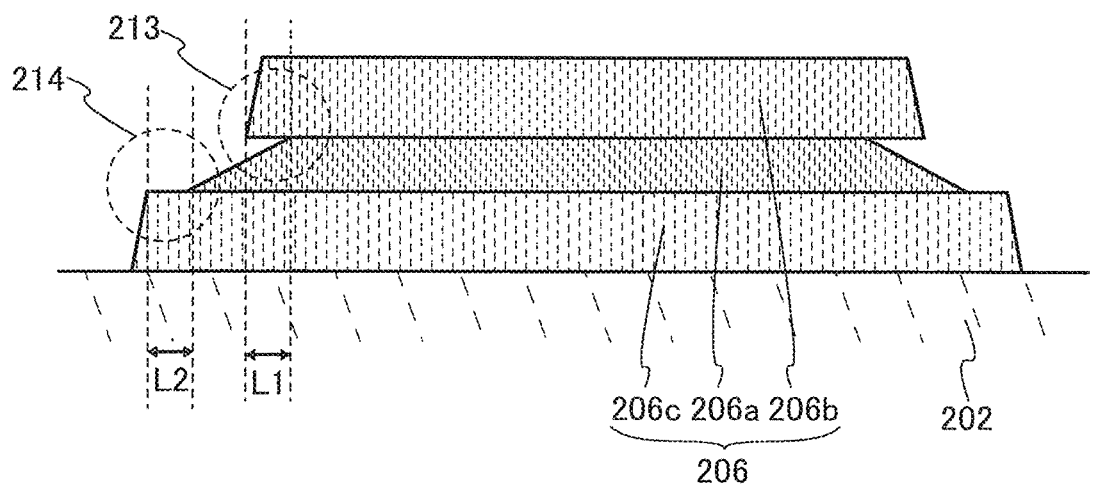

An upper edge of the oxide semiconductor film 206a substantially coincides with a lower edge of the oxide film 206b, and an upper edge of the oxide film 206c substantially coincides with a lower edge of the oxide semiconductor film 206a (see FIG. 9). That is, the multilayer film 206 has neither a large step 213 nor a large step 214 which are produced by two or more layers of the oxide semiconductor film 206a, the oxide film 206b, and the oxide film 206c (see FIGS. 32A and 32B). Therefore, disconnection of a film provided over the multilayer film 206 (e.g., a conductive film to be processed into the source electrode 216a and the drain electrode 216b) can be suppressed, and a transistor having favorable electrical characteristics can be manufactured. Note that the phrase "the upper edge of the oxide semiconductor film 206a and the lower edge of the oxide film 206b substantially coincide" means that the distance L1 between the lower edge of the oxide film 206b and the upper edge of the oxide semiconductor film 206a is 30 nm or shorter, preferably 10 nm or shorter, and the phrase "the upper edge of the oxide film 206c and the lower edge of the oxide semiconductor film 206a substantially coincide" means that the distance L2 between the upper edge of the oxide film 206c and the lower edge of the oxide semiconductor film 206a is 30 nm or shorter, preferably 10 nm or shorter (see FIGS. 32A and 32B).

The tapered shape can be formed by utilizing the difference in etching rate among the films in etching of the multilayer film 206. In particular, the above-described tapered shape can be formed by setting the etching rate of the oxide semiconductor film 206a lower than those of the oxide film 206b and the oxide film 206c.

In the case where the second angle θ2 is smaller than the third angle θ3, the etching rate of the oxide film 206b is set lower than that of the oxide film 206c. In the case where the second angle θ2 is larger than the third angle θ3, the etching rate of the oxide film 206b is set higher than that of the oxide film 206c.

To form the tapered shape, wet etching using a solution containing a phosphoric acid as an etchant can be performed in the same manner as that of Embodiment 1. For the details of the wet etching, Embodiment 1 can be referred to. Further, by setting the second angle θ2 and the third angle θ3 larger than the first angle θ1, the area exposed to the etchant in the wet etching can be reduced, and in addition, the low-resistance regions formed in the oxide films 206b and 206c owing to contamination or defect generation by the etchant can be reduced.

By forming the multilayer film 206 by wet etching, a transistor with favorable electrical characteristics can be manufactured with high productivity with less reduction in yield as described in Embodiment 1.

The band structure of the multilayer film 206 is described below with reference to FIGS. 10A to 10C.

In the example described here, an In—Ga—Zn oxide having an energy gap of 3.15 eV was used as the oxide semiconductor film 206a, and an In—Ga—Zn oxide having an energy gap of 3.5 eV was used as the oxide film 206b and the oxide film 206c. The energy gaps were measured with a spectroscopic ellipsometer (UT-300 manufactured by HORIBA JOBIN YVON S.A.S.).

The energy difference between the vacuum level and the top of the valence band (also called ionization potential) of the oxide semiconductor film 206a was 8 eV. In addition, the ionization potentials of the oxide film 206b and the oxide film 206c were 8.2 eV. Note that the energy difference between the vacuum level and the top of the valence band was measured with an ultraviolet photoelectron spectroscopy (UPS) device (VersaProbe manufactured by ULVAC-PHI, Inc.).

Thus, the energy difference between the vacuum level and the bottom of the conduction band (also called electron affinity) of the oxide semiconductor film 206a was 4.85 eV. In addition, the electron affinities of the oxide film 206b and the oxide film 206c were 4.7 eV.

Figure 10A:
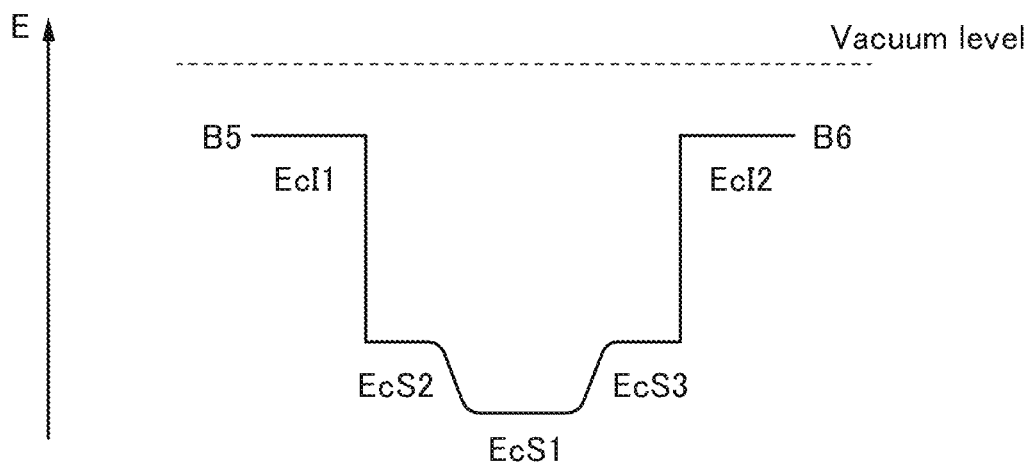
FIGS. 10A to 10C show band structures of multilayer films.

FIG. 10A schematically shows part of the band structure of the multilayer film 206. FIG. 10A shows a case where silicon oxide films (the base insulating film 202 and the gate insulating film 212) are provided in contact with the oxide film 206c and the oxide film 206b, respectively. Here, EcI1 represents the energy of the bottom of the conduction band of the silicon oxide film, EcS1 represents the energy of the bottom of the conduction band of the oxide semiconductor film 206a, EcS2 represents the energy of the bottom of the conduction band of the oxide film 206b, EcS3 represents the energy of the bottom of the conduction band of the oxide film 206c, and EcI2 represents the energy of the bottom of the conduction band of the silicon oxide film.

As illustrated in FIG. 10A, there is no energy barrier between the oxide semiconductor film 206a and the oxide film 206b and between the oxide semiconductor film 206a and the oxide film 206c, and the energy level of the bottom of the conduction band gradually changes therebetween. In other words, the energy level of the bottom of the conduction band is continuously changed. This is owing to the structure in which the oxide film 206b and the oxide film 206c include an element in common with the oxide semiconductor film 206a and a mixed layer is formed by oxygen movement between the oxide semiconductor film 206a and the oxide film 206b and between the oxide semiconductor film 206a and the oxide film 206c.

According to FIG. 10A, the oxide semiconductor film 206a of the multilayer film 206 serves as a well and a channel region of a transistor including the multilayer film 206 is formed in the oxide semiconductor film 206a. Note that since the energy level of the bottom of the conduction band in the multilayer film 206 continuously changes, it can be said that the oxide semiconductor film 206a and the oxide film 206b make a continuous junction and the oxide semiconductor film 206a and the oxide film 206c make a continuous junction.

By using oxide films having different energy levels of the bottom of the conduction band as the oxide film 206b and the oxide film 206c, the band structure of the multilayer film 206 can be changed in accordance with a relationship between the different energy levels of the bottom of the conduction band.

Figure 10B:
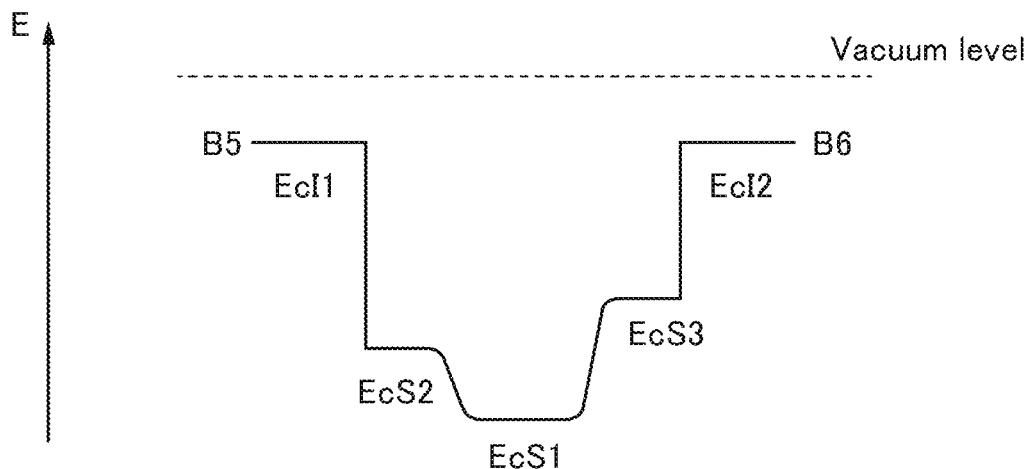

By using an oxide having a higher energy of the bottom of the conduction band than the oxide film 206b as the oxide film 206c, the multilayer film 206 having the band structure illustrated in FIG. 10B can be formed.

Figure 10C:
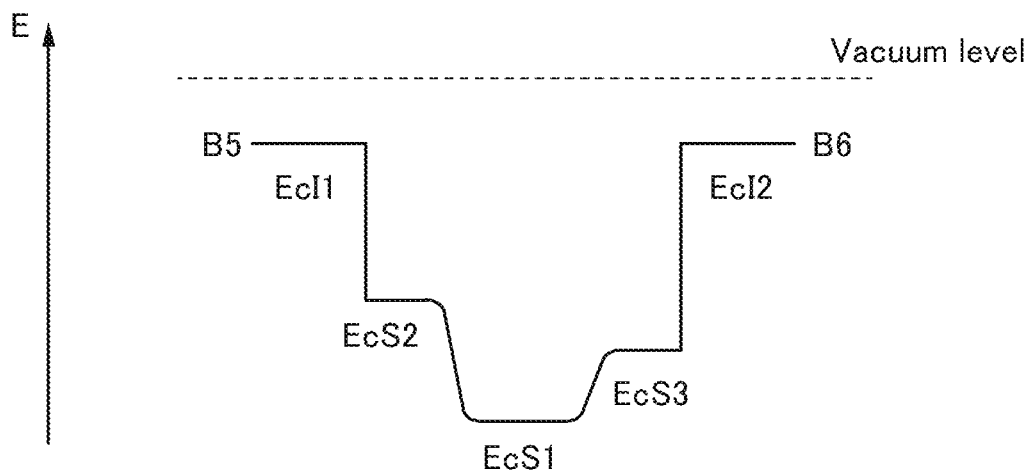

By using an oxide having a lower energy of the bottom of the conduction band than the oxide film 206c as the oxide film 206b, the multilayer film 206 having the band structure illustrated in FIG. 10C can be formed.

Also in the multilayer film 206 having the band structure illustrated in FIGS. 10B and 10C, the channel region is formed in the oxide semiconductor film 206a.

Trap states due to impurities or defects can be formed in the vicinity of the interface between the oxide film 206b and the gate insulating film 212. However, the oxide film 206b can keep the oxide semiconductor film 206a away from the trap levels. However, when the energy difference between EcS1 and EcS2 is small, electrons in the oxide semiconductor film 206a might reach the trap levels over the energy difference. When the electrons are captured by the trap states, negative fixed charges are generated, so that the threshold voltage of the transistor is shifted in the positive direction.

Trap levels due to impurities or defects can be formed in the vicinity of the interface between the oxide film 206c and the base insulating film 202. However, the oxide film 206c can keep the oxide semiconductor film 206a away from the trap levels. However, when the energy difference between EcS1 and EcS3 is small, electrons in the oxide semiconductor film 206a might reach the trap levels over the energy gap. When the electrons are captured by the trap levels, negative fixed charges are generated, so that the threshold voltage of the transistor is shifted in the positive direction.

Thus, the energy difference between EcS1 and EcS2 and the energy difference between EcS1 and EcS3 are each preferably greater than or equal to 0.1 eV, further preferably greater than or equal to 0.15 eV, in which case variations in the threshold voltage of the transistor can be reduced and stable electrical characteristics of the transistor can be achieved.

2-1-2. Other Structures

For the substrate 200, the description of the substrate 100 can be referred to. For the source electrode 216a and the drain electrode 216b, the description of the source electrode 116a and the drain electrode 116b can be referred to. For the gate insulating film 212, the description of the gate insulating film 112 can be referred to. For the gate electrode 204, the description of the gate electrode 104 can be referred to. For the protective insulating film 218, the description of the protective insulating film 118 can be referred to.

In FIG. 8A, the multilayer film 206 is formed so as to extend beyond the edge of the gate electrode 204 in the top view; however, the width of the gate electrode 204 may be larger than that of the multilayer film 206 in order to suppress generation of carriers in the multilayer film 206 due to light from the above.

The base insulating film 202 can be formed of a single layer or a stacked layer using an insulating film containing one or more kinds selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 202 may be, for example, a multilayer film including a silicon nitride film as a first layer and a silicon oxide film as a second layer. In that case, the silicon oxide film may be a silicon oxynitride film. In addition, the silicon nitride film may be a silicon nitride oxide film. As the silicon oxide film, a silicon oxide film whose defect density is low is preferably used. Specifically, a silicon oxide film whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon nitride film, a silicon nitride film from which hydrogen and ammonia are less likely to be released is used. The amount of released hydrogen or ammonia may be measured by thermal desorption spectroscopy (TDS). Further, as the silicon nitride film, a silicon nitride film which does not transmit or hardly transmits hydrogen, water, and oxygen is used.

Alternatively, the base insulating film 202 may be, for example, a multilayer film including a first silicon nitride film as a first layer, a first silicon oxide film 118b as a second layer, and a second silicon oxide film as a third layer. In that case, the first silicon oxide film and/or the second silicon oxide film may be a silicon oxynitride film. In addition, the silicon nitride film may be a silicon nitride oxide film. As the first silicon oxide film, a silicon oxide film whose defect density is low is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide film, a silicon oxide film containing excess oxygen is used. As the silicon nitride film, a silicon nitride film from which hydrogen and ammonia are less likely to be released is used. Further, as the silicon nitride film, a silicon nitride film which does not transmit or hardly transmits hydrogen, water, and oxygen is used.

In the case where at least one of the gate insulating film 212 and the base insulating film 202 is the insulating film containing excess oxygen, oxygen vacancies in the oxide semiconductor film 206a can be reduced.

With the above-described structure, the transistor described in this embodiment has reduced impurities and low density of carriers in the oxide semiconductor film 206a (especially, the channel region) of the multilayer film 206, whereby the transistor has stable electrical characteristics and a high field-effect mobility.

2-2. Method for Manufacturing Transistor Structure (3)

Here, a method for manufacturing the transistor is described here with reference to FIGS. 11A to 11C and FIGS. 12A and 12B.

First, the substrate 200 is prepared.

Next, the base insulating film 202 is formed over the substrate 200. The base insulating film 202 may be formed in such a manner that any of the insulating films given above as examples is formed by a sputtering method, a CVD method, an MBE method, an ALD method, or a PLD method.

Next, an oxide film 226c to be processed into the oxide film 206c is formed. For the formation method of the oxide film 206c, the description of the oxide film 106b in Embodiment 1 can be referred to. Note that the oxide film 206c is formed so as to be a CAAC-OS film or an amorphous film. When the oxide film 206c is a CAAC-OS film or an amorphous film, an oxide semiconductor film 226a to be the oxide semiconductor film 206a easily becomes a CAAC-OS film.

Next, the oxide semiconductor film 226a to be processed into the oxide semiconductor film 206a is formed. For the method for forming the oxide semiconductor film 226a, the description of the oxide semiconductor film 106a in Embodiment 1 can be referred to.

Next, an oxide film 226b to be processed into the oxide film 206b is formed. For the method for forming the oxide film 226b, the description of the oxide film 106b in Embodiment 1 can be referred to (see FIG. 11A).

As described in Embodiment 1, to make a continuous junction among the oxide film 206c, the oxide semiconductor film 206a, and the oxide film 206b, the oxide film 226c, the oxide semiconductor film 226a, and the oxide film 226b are preferably stacked in succession without being exposed to the air.

Figure 11A:
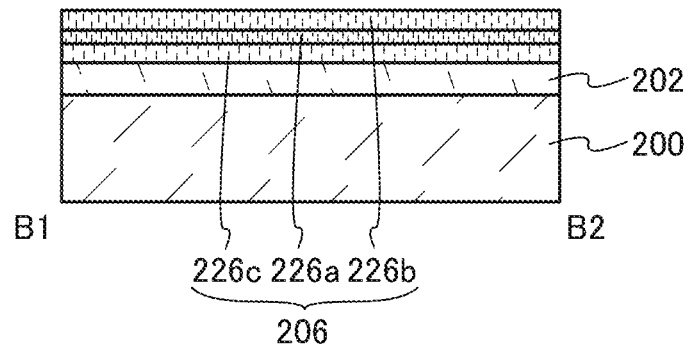
FIGS. 11A to 11C are cross-sectional views illustrating a method for manufacturing a transistor.
Figure 11B:
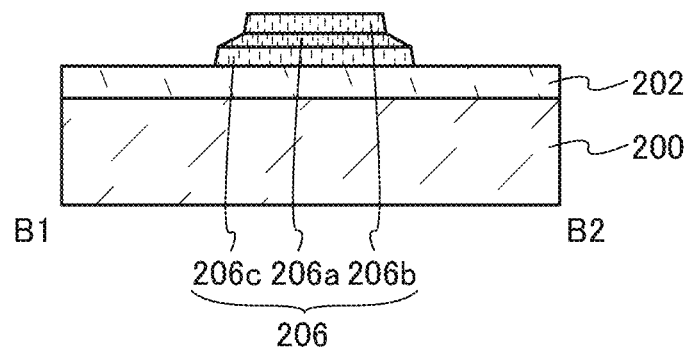

Next, part of the oxide film 226c, part of the oxide semiconductor film 226a, and part of the oxide film 226b are etched to form the multilayer film 206 including the oxide film 206c, the oxide semiconductor film 206a, and the oxide film 206b (see FIG. 11B). For this etching, the above description can be referred to.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment enables the crystallinity of the oxide semiconductor film 226a to be improved, and in addition, impurities such as water, hydrogen, nitrogen, and carbon to be removed from the base insulating film 202 and the multilayer film 206.

Note that the first heat treatment can be performed at least before or after the etching step for forming the multilayer film 206.

Then, a conductive film to be the source electrode 216a and the drain electrode 216b is formed. For the formation method of the conductive film to be the source electrode 216a and the drain electrode 216b, the description of the source electrode 116a and the drain electrode 116b in Embodiment 1 can be referred to.

Figure 11C:
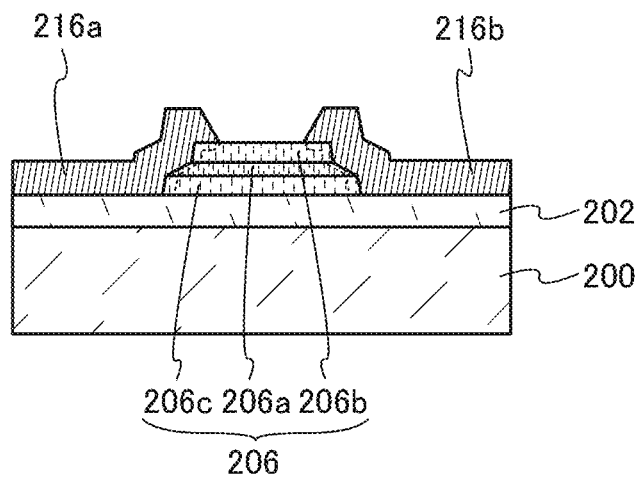

Next, the conductive film to be the source electrode 216a and the drain electrode 216b is partly etched to form the source electrode 216a and the drain electrode 216b (see FIG. 11C).

Next, second heat treatment is preferably performed. The description of the first heat treatment can be referred to for the second heat treatment. The second heat treatment can remove impurities such as water, hydrogen, nitrogen, and carbon from the multilayer film 206.

In addition, by the second heat treatment, the low-resistance region 206d and the low-resistance region 206e can be formed in the multilayer film 206 in contact with the source electrode 216a and the drain electrode 216b.

Figure 12A:
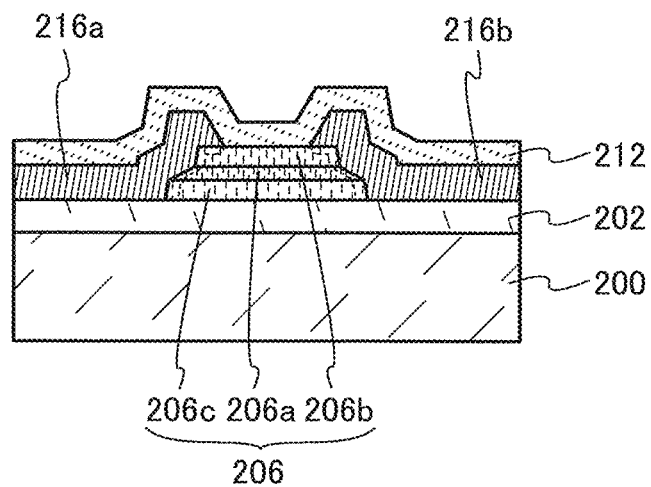
FIGS. 12A and 12B are cross-sectional views illustrating a method for manufacturing a transistor.
Figure 12B:
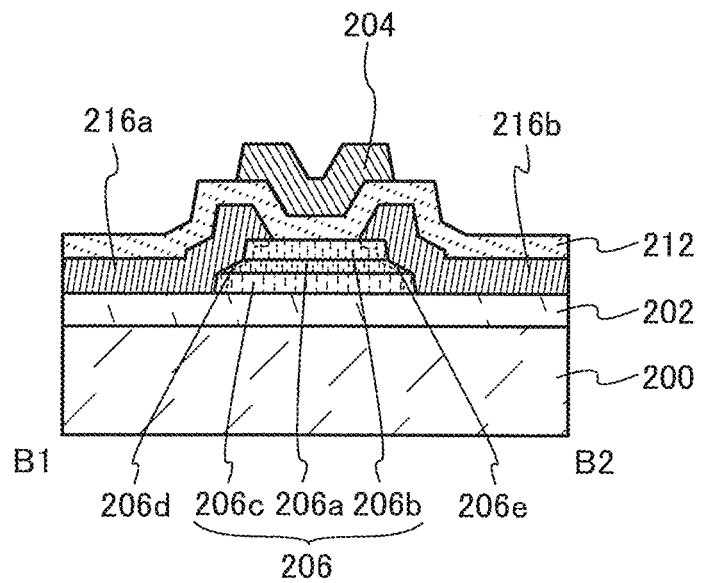

Next, the gate insulating film 212 is formed (see FIG. 12A). For the method for forming the gate insulating film 212, the description of the gate insulating film 112 in Embodiment 1 is referred to.

Next, a conductive film to be the gate electrode 204 is formed. Then, the conductive film to be the gate electrode 204 is partly etched to form the gate electrode 204 (see FIG. 12B). For the formation method and the etching step of the gate electrode 204, the description of the gate electrode 104 in Embodiment 1 can be referred to.

Next, the protective insulating film 218 is formed (see FIG. 8B). For the method for forming the protective insulating film 218, the description of the protective insulating film 118 is referred to.

In the above manner, the transistor illustrated in FIGS. 8A to 8C can be manufactured.

2-3. Transistor Structure (4)

A transistor which is a modified example of the transistor illustrated in FIGS. 8A to 8C is described with reference to FIGS. 13A to 13C.

Figure 13A:
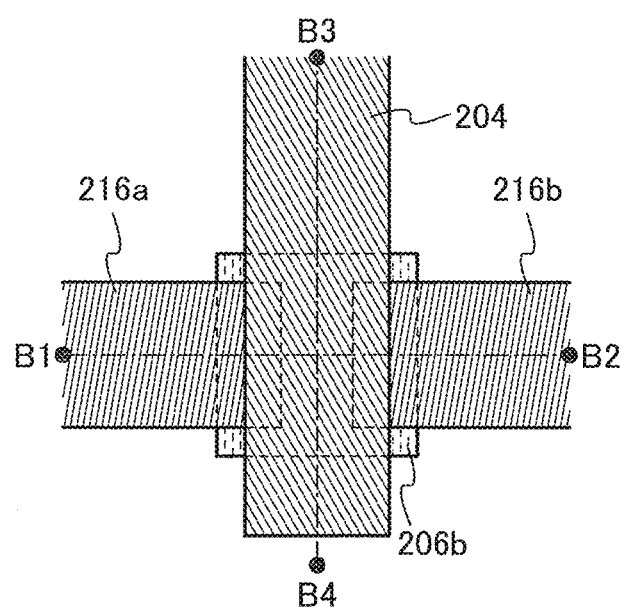
FIG. 13A is a top view of a transistor.
Figure 13C:
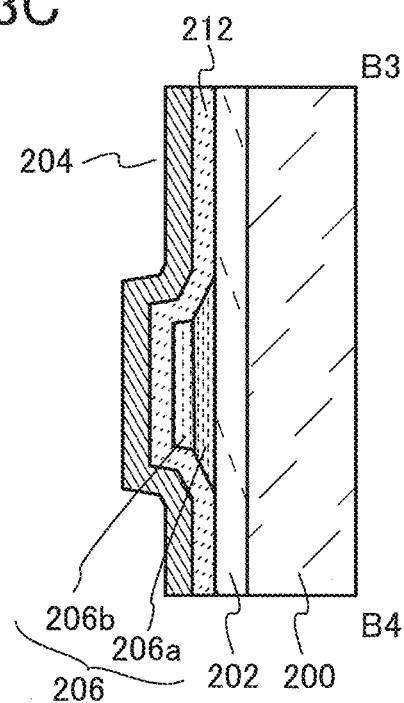
FIGS. 13B and 13C are cross-sectional views thereof.
Figure 13B:
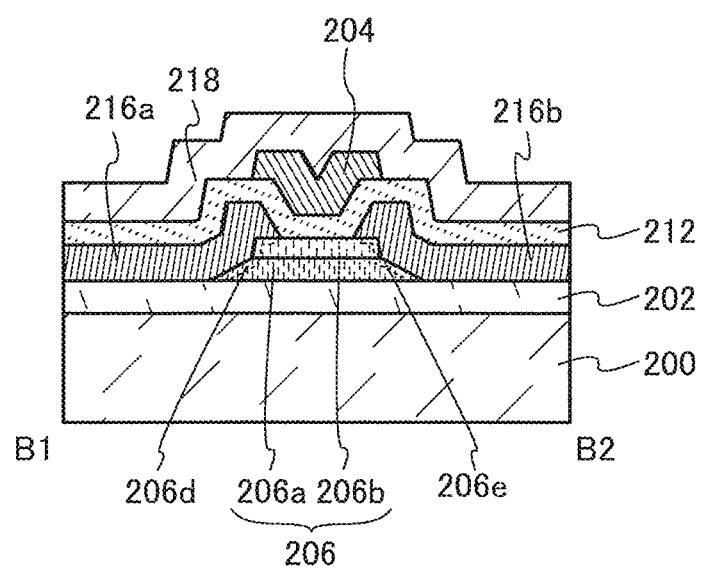

FIGS. 13A to 13C are a top view and cross-sectional views of the modified example. FIG. 13A is a top view of the transistor. FIG. 13B is a cross-sectional view taken along dashed-dotted line B1-B2 in FIG. 13A. FIG. 13C is a cross-sectional view taken along dashed-dotted line B3-B4 in FIG. 13A. Note that in FIG. 13A, some components of the transistor (e.g., a gate insulating film and a protective insulating film) are not illustrated for simplicity of the drawing.

The transistor illustrated in FIGS. 13A to 13C is different from the transistor illustrated in FIGS. 8A to 8C in not having the oxide film 206c in the multilayer film 206. That is, the multilayer film 206 in the transistor illustrated in FIGS. 13A to 13C consists of the oxide semiconductor film 206a and the oxide film 206b. The other components of the transistor illustrated in FIGS. 13A to 13C are the same as those of the transistor illustrated in FIGS. 8A to 8C, and the above description can be appropriately referred to.

In the transistor illustrated in FIGS. 13A to 13C, trap states due to impurities or defects can be formed in the vicinity of the interface between the oxide film 206b and the gate insulating film 212. However, the oxide film 206b can keep the oxide semiconductor film 206a away from the trap states. Thus, the transistor illustrated in FIGS. 13A to 13C is a transistor with stable electrical characteristics and less variation in threshold voltage.

For a method for manufacturing the transistor illustrated in FIGS. 13A to 13C, the description in Embodiment 1 and the description of the transistor illustrated in FIGS. 8A to 8C can be appropriately referred to.

2-4. Transistor Structure (5)

A transistor which is a modified example of the transistor illustrated in FIGS. 8A to 8C is described with reference to FIGS. 14A to 14C.

Figure 14A:
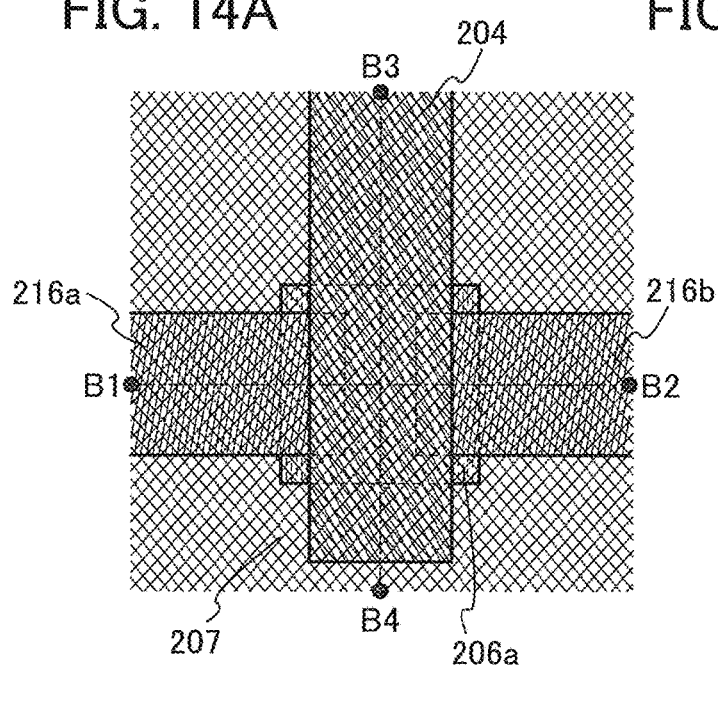
FIG. 14A is a top view of a transistor.
Figure 14C:
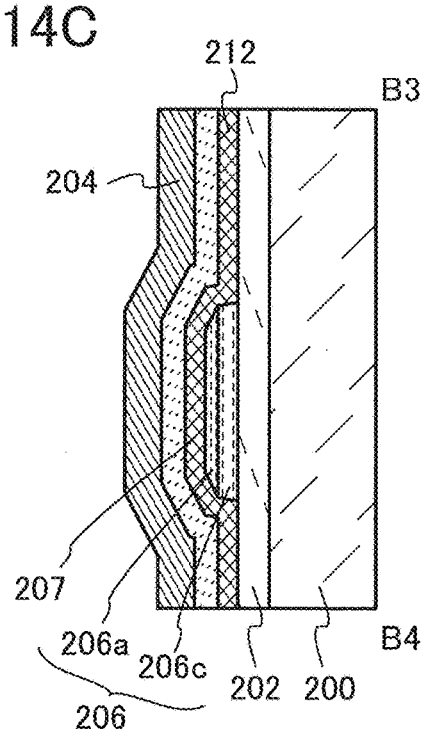
FIGS. 14B and 14C are cross-sectional views thereof.
Figure 14B:
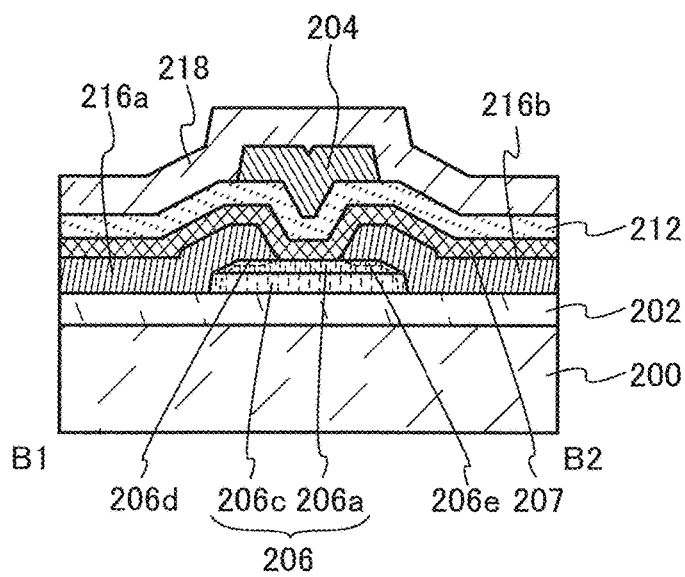

FIGS. 14A to 14C are a top view and cross-sectional views of the modified example. FIG. 14A is a top view of the transistor. FIG. 14B is a cross-sectional view taken along dashed-dotted line B1-B2 in FIG. 14A. FIG. 14C is a cross-sectional view taken along dashed-dotted line B3-B4 in FIG. 14A. Note that in FIG. 14A, some components of the transistor (e.g., a gate insulating film and a protective insulating film) are not illustrated for simplicity of the drawing.

The transistor illustrated in FIGS. 14A to 14C is different from the transistor illustrated in FIGS. 8A to 8C in not having the oxide film 206b in the multilayer film 206. That is, the multilayer film 206 in the transistor illustrated in FIGS. 14A to 14C consists of the oxide film 206c and the oxide semiconductor film 206a. In addition, the transistor illustrated in FIGS. 14A to 14C is also different from the transistor illustrated in FIGS. 8A to 8C in that an oxide film 207 is provided in contact with top surfaces of the source electrode 216a and the drain electrode 216b and the a top surface of the multilayer film 206.

As the oxide film 207, an oxide film that can be used for the oxide film 106b of the multilayer film 106 in Embodiment 1 can be formed using the method that can be applied to formation of the oxide film 106b. The other components of the transistor illustrated in FIGS. 14A to 14C are the same as those of the transistor illustrated in FIGS. 8A to 8C, and the above description can be appropriately referred to.

In the structure of the transistor illustrated in FIGS. 14A to 14C, the oxide film 207 is provided between the oxide semiconductor film 206a and the gate insulating film 212. This structure can keep trap states formed in the vicinity of the interface between the oxide film 207 and the gate insulating film 212 owing to impurities and defects away from the oxide semiconductor film 106a. Thus, the transistor illustrated in FIGS. 14A to 14C is a transistor with stable electrical characteristics and less variation in threshold voltage.

For a method for manufacturing the transistor illustrated in FIGS. 14A to 14C, the description in Embodiment 1 and the description of the transistor illustrated in FIGS. 8A to 8C can be appropriately referred to.

2-5. Other Transistor Structures

For example, the transistor illustrated in FIGS. 8A to 8C to which the oxide film 207 in the transistor illustrated in FIGS. 14A to 14C is added between the gate insulating film 212 and the top surfaces of the source and drain electrodes 212a and 212b and the multilayer film 206 is also an embodiment of the present invention.

In this structure, the oxide film 206b and the oxide film 207 are provided between the oxide semiconductor film 206a and the gate insulating film 212. This structure can keep trap states formed in the vicinity of the interface between the oxide film 207 and the gate insulating film 212 owing to impurities and defects away more from the oxide semiconductor film 206a. That is, even when the energy gap between EcS1 and EcS2 is small, electrons in the oxide semiconductor film 206a can be prevented from reaching the trap states over the energy gap. Thus, a transistor with stable electrical characteristics and even less variation in threshold voltage can be obtained.

In addition, the bottom-gate transistor described in Embodiment 1 in which the multilayer film 106 is replaced by the multilayer film 206 including the oxide semiconductor film 206a, the oxide film 206b, and the oxide film 206c is also an embodiment of the present invention.

As described above, the transistors illustrated in FIGS. 8A to 8C, FIGS. 13A to 13C, and FIGS. 14A to 14C have stable electrical characteristics because impurities and the density of carriers are reduced in the oxide semiconductor films 106a and 206a (especially, the channel regions) of the multilayer films 106 and 206.

Embodiment 3

In this embodiment, a semiconductor device which includes the transistor described in the above embodiment will be described.

3-1. Display Device

Here, display devices which are one kind of semiconductor devices using the transistor described in the above embodiment will be described.

As a display element provided in the display device, a liquid crystal element (also referred to as a liquid crystal display element), a light-emitting element (also referred to as a light-emitting display element) or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. A display device including an EL element and a display device including a liquid crystal element are described below as examples of the display device.

The display device described below includes, in its category, a panel in which a display element is sealed and a module in which an IC such as a controller is mounted on the panel.

The display device described below refers to an image display device or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

The display devices described below can be provided with an input means capable of noncontact or contact sensing (not shown). For example, as the input means capable of contact sensing, touch sensors of various types such as a resistive type, a capacitive type, an infrared ray type, an electromagnetic induction type, and a surface acoustic wave type can be used. As the input means capable of noncontact sensing, an infrared camera or the like can be used.

The input means may be provided over a display device described below to form what is called an on-cell display device or may be provided integrally with a display device described below to form what is called an in-cell display device.

3-1-1. EL Display Device

First, a display device including an EL element (also called an EL display device) is described.

Figure 15:
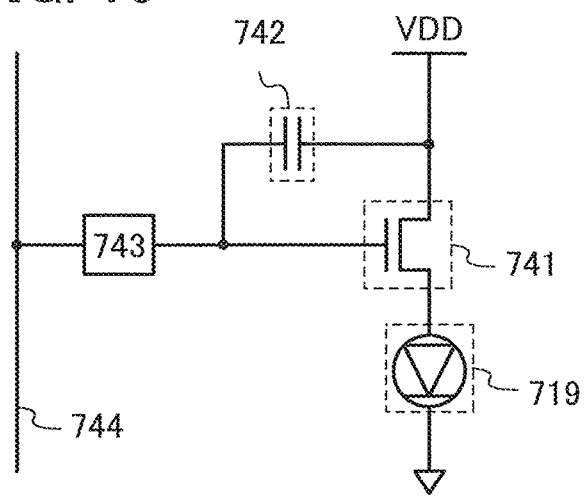
FIG. 15 is a circuit diagram showing an example of an EL display device.

FIG. 15 is an example of a circuit diagram of a pixel in the EL display device.

The EL display device illustrated in FIG. 15 includes a switching element 743, a transistor 741, a capacitor 742, and a light-emitting element 719.

A gate of the transistor 741 is electrically connected to one terminal of the switching element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switching element 743 is electrically connected to a signal line 744. The other terminal of the light-emitting element 719 is supplied with a fixed potential. Note that the fixed potential is a ground potential GND or lower.

Note that as the transistor 741, the transistor described in the above embodiment is used. The transistor has stable electrical characteristics. Thus, the EL display device can have high display quality.

As the switching element 743, a transistor is preferably used. When the transistor is used as the switching element, the area of a pixel can be reduced, so that the EL display device can have high resolution. Alternatively, the transistor described in the above embodiment may be used as the switching element 743. When the above transistor is used as the switching element 743, the switching element 743 can be formed in the same process as the transistor 741, so that the productivity of the EL display device can be improved.

Figure 16A:
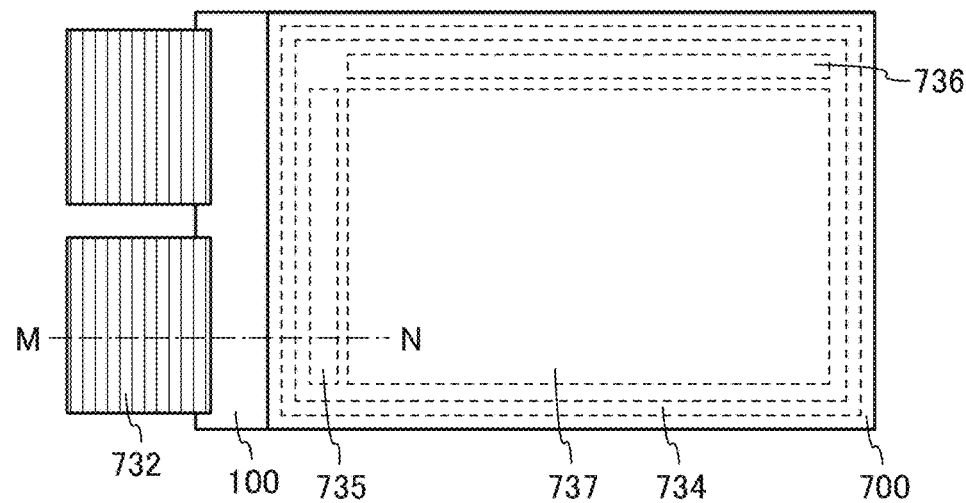
FIG. 16A is a top view illustrating an example of an EL display device.

FIG. 16A is a top view of an EL display device. The EL display device includes a substrate 100, a substrate 700, a sealant 734, a driver circuit 735, a driver circuit 736, a pixel 737, and an FPC 732. The sealant 734 is provided between the substrate 100 and the substrate 700 so as to surround the pixel 737, the driver circuit 735 and the driver circuit 736. Note that the driver circuit 735 and/or the driver circuit 736 may be provided outside the sealant 734.

Figure 16B:
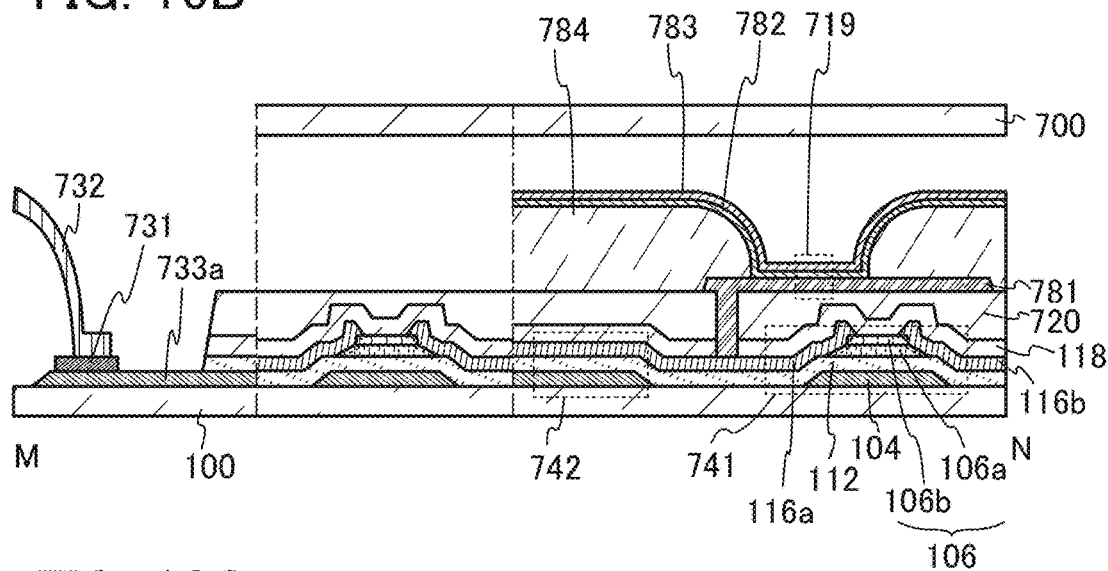
FIGS. 16B and 16C are cross-sectional views thereof.

FIG. 16B is a cross-sectional view of the EL display device taken along dashed-dotted line M-N in FIG. 16A. The FPC 732 is connected to a wiring 733a via a terminal 731. Note that the wiring 733a is formed in the same layer as the gate electrode 104.

Note that FIG. 16B shows an example in which a transistor 741 and a capacitor 742 are provided in the same plane. With such a structure, the capacitor 742 can be formed in the same plane as a gate electrode, a gate insulating film, and a source electrode (drain electrode), which are included in the transistor 741. When the transistor 741 and the capacitor 742 are provided in the same plane in this manner, the number of manufacturing steps of the EL display device can be reduced; thus the productivity can be improved.

FIG. 16B illustrates an example in which the transistor illustrated in FIGS. 1A to 1D is used as the transistor 741. Therefore, for components of the transistor 741 which are not particularly described below, the description on FIGS. 1A to 1D is referred to.

An insulating film 720 is provided over the transistor 741 and the capacitor 742.

Here, an opening reaching the source electrode 116a of the transistor 741 is provided in the insulating film 720 and the protective insulating film 118.

An electrode 781 is provided over the insulating film 720. The electrode 781 is in contact with the source electrode 116a of the transistor 741 through the opening provided in the insulating film 720 and the protective insulating film 118.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that for the insulating film 720, the description of the protective insulating film 118 is referred to. Alternatively, a resin film of a polyimide resin, an acrylic resin, an epoxy resin, a silicone resin, or the like may be used.

Figure 16C:
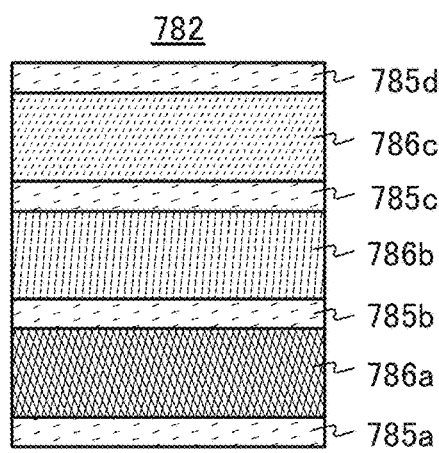

The light-emitting layer 782 is not limited to a single layer, and may be a stack including a plurality of kinds of light-emitting layers and the like. For example, a structure illustrated in FIG. 16C may be employed. FIG. 16C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 719 with a high color rendering property or higher emission efficiency can be formed.

A plurality of kinds of light-emitting layers may be stacked to obtain white light. Although not illustrated in FIG. 16B, white light may be extracted through coloring layers.

Although the structure in which three light-emitting layers and four intermediate layers are provided is shown here, the structure is not limited thereto. The number of light-emitting layers and the number of intermediate layers can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Further, the intermediate layer may have a stacked-layer structure including a hole-injection layer, a hole-transport layer, an electron-transport layer, an electron-injection layer, or the like. Note that not all of these layers need to be provided in the intermediate layer. Any of these layers may be selected as appropriate to form the intermediate layer. Note that layers having similar functions may be provided. Further, an electron-relay layer or the like may be added as appropriate in the intermediate layer, in addition to a carrier generation layer.

The electrode 781 can be formed using a conductive film having visible light permeability. Having visible light permeability means having an average transmittance of 70% or more, particularly 80% or more in the visible light region (e.g., the range of wavelength of from 400 nm to 800 nm).

As the electrode 781, for example, an oxide film such as an In—Zn—W-based oxide film, an In—Sn-based oxide film, an In—Zn-based oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used. For example, an Ag film, an Mg film, or an Ag—Mg alloy film with a thickness of 5 nm may be used.

The electrode 781 is preferably a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has visible light permeability, it is preferable that the electrode 783 efficiently reflects visible light. When the electrode 781 efficiently reflects visible light, it is preferable that the electrode 783 have visible light permeability.

Positions of the electrode 781 and the electrode 783 are not limited to the structure illustrated in FIG. 16B, and the electrode 781 and the electrode 783 may be replaced with each other. It is preferable to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

For the partition 784, the description of the protective insulating film 118 is referred to. Alternatively, a resin film of a polyimide resin, an acrylic resin, an epoxy resin, a silicone resin, or the like may be used.

In the display device, a black matrix (light-blocking film), an optical member (optical substrate) such as a polarizing member, a retardation member, or an anti-reflection member, and the like are provided as appropriate. For example, circular polarization may be obtained by using a polarizing substrate and a retardation substrate.

The transistor 741 connected to the light-emitting element 719 has stable electrical characteristics. Thus, an EL display device having high display quality can be provided.

Figure 17A:
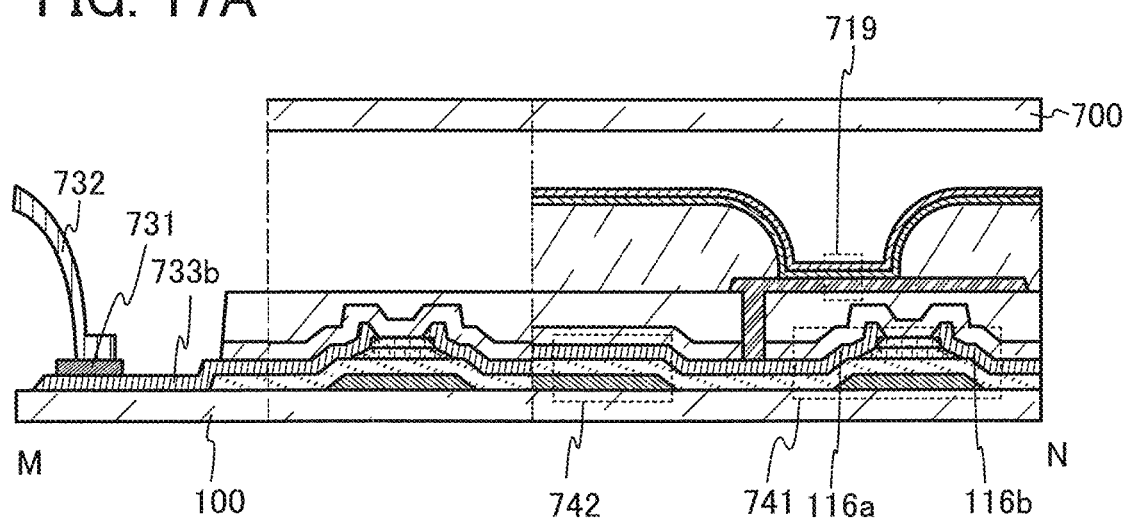
FIGS. 17A and 17B are cross-sectional views illustrating examples of an EL display device.
Figure 17B:
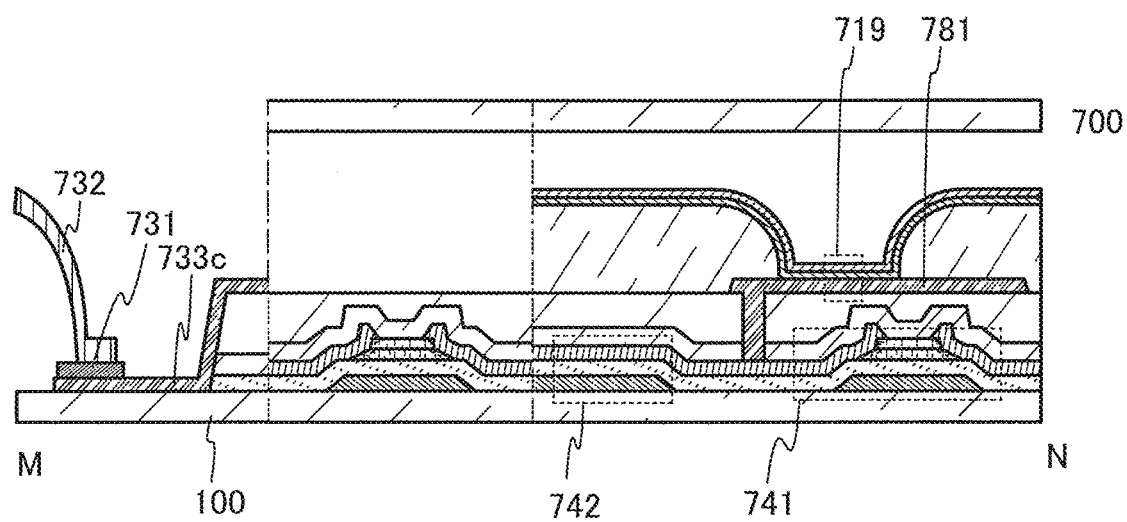

FIGS. 17A and 17B each illustrate an example of a cross section of an EL display device which is partly different from that in FIG. 16B. Specifically, the difference lies in a wiring connected to the FPC 732. In FIG. 17A, a wiring 733b is connected to the FPC 732 via the terminal 731. The wiring 733b is formed in the same layer as the source electrode 116a and the drain electrode 116b. In FIG. 17B, a wiring 733c is connected to the FPC 732 via the terminal 731. The wiring 733c is formed in the same layer as the electrode 781.

3-1-2. Liquid Crystal Display Device

Next, a display device including a liquid crystal element (also called a liquid crystal display device) is described.

Figure 18:
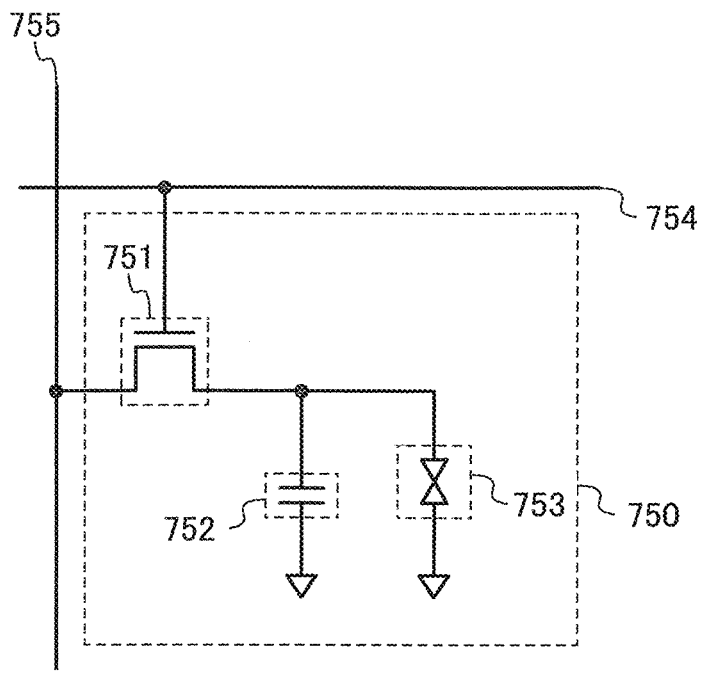
FIG. 18 is a circuit diagram showing an example of a liquid crystal display device.

FIG. 18 is a circuit diagram showing a structural example of a pixel of the liquid crystal display device. A pixel 750 illustrated in FIG. 18 includes a transistor 751, a capacitor 752, and an element 753 in which liquid crystal is injected between a pair of electrodes (hereinafter also referred to as liquid crystal element).

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring to which the other of the electrodes of the capacitor 752 is electrically connected.

Figure 19A:
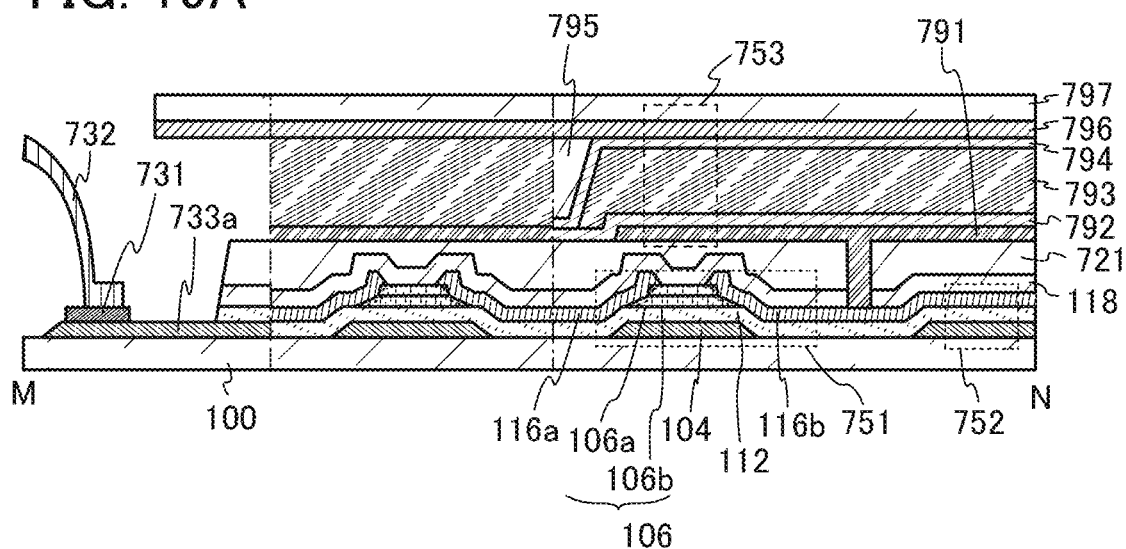
FIGS. 19A to 19C are cross-sectional views illustrating examples of a liquid crystal display device.

Note that a top view of the liquid crystal display device is roughly similar to that of the EL display device. FIG. 19A is a cross-sectional view of the liquid crystal display device taken along dashed-dotted line M-N in FIG. 16A. In FIG. 19A, the FPC 732 is connected to the wiring 733a via the terminal 731. Note that the wiring 733a is formed in the same layer as the gate electrode 104.

Note that FIG. 19A illustrates an example in which the transistor 751 and the capacitor 752 are provided in the same plane. With such a structure, the capacitor 752 can be formed in the same plane as a gate electrode, a gate insulating film, and a source electrode (drain electrode), which are included in the transistor 751. When the transistor 751 and the capacitor 752 are provided in the same plane in this manner, the number of manufacturing steps of the liquid crystal display device can be reduced; thus, the productivity can be increased.

As the transistor 751, the transistor described above can be used. In FIG. 19A, the transistor illustrated in FIGS. 1A to 1D is used as the transistor 751. Therefore, for components of the transistor 751 which are not particularly described below, the description of FIGS. 1A to 1D is referred to.

Note that the transistor 751 can be a transistor having extremely low off-state current. Thus, the charge held in the capacitor 752 is unlikely to be leaked and voltage applied to the liquid crystal element 753 can be retained for a long time. Thus, by turning off the transistor 751 when an image with little motion or a still image is displayed, power for the operation of the transistor 751 is not needed. As a result, the power consumption of the liquid crystal display device can be low.

The size of the capacitor 752 provided in the liquid crystal display device is set considering the leakage current of the transistor 751 provided in the pixel portion, or the like so that charge can be held for a predetermined period. By using the transistor 751, it is enough to provide a capacitor having a capacitance that is ⅓ or less, preferably ⅕ or less of a liquid crystal capacitance of each pixel; therefore, the aperture ratio of a pixel can be increased.

An insulating film 721 is provided over the transistor 751 and the capacitor 752.

Here, an opening reaching the drain electrode 116b of the transistor 751 is provided in the insulating film 721 and the protective insulating film 118.

An electrode 791 is provided over the insulating film 721. The electrode 791 is in contact with the drain electrode 116b of the transistor 751 through the opening provided in the insulating film 721 and the protective insulating film 118.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

For the insulating film 721, the description of the protective insulating film 118 is referred to. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Note that as the liquid crystal layer 793, a liquid crystal exhibiting a blue phase may be used. In that case, the structure without the insulating films 792 and 794 serving as alignment films may be employed.

The electrode 791 can be formed using a conductive film having a transmitting property with respect to visible light.

In the case where the liquid crystal display device is transmissive-type, as the electrode 791, for example, an oxide film such as an In—Zn—W-based oxide film, an In—Sn-based oxide film, an In—Zn-based oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used.

In the case where the liquid crystal display device is reflective-type, the electrode 791 is preferably a film which efficiently reflects visible light. For example, a film containing aluminum, titanium, chromium, copper, molybdenum, silver, tantalum, or tungsten can be used as the electrode 791.

In the case where the liquid crystal display device is transmissive-type, the electrode 796 can be formed using any of the visible-light-transmitting conductive films described above as the electrode 791. In the case where the liquid crystal display device is reflective-type, on the other hand, when the electrode 791 has visible light permeability, it is preferable that the electrode 796 efficiently reflects visible light. When the electrode 791 efficiently reflects visible light, it is preferable that the electrode 796 have visible light permeability.

Positions of the electrode 791 and the electrode 796 are not limited to the structure illustrated in FIG. 19A, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another functions as the liquid crystal element 753.

As the substrate 797, a glass substrate, a resin substrate, a metal substrate, or the like can be used. The substrate 797 may have flexibility.

Figure 19B:
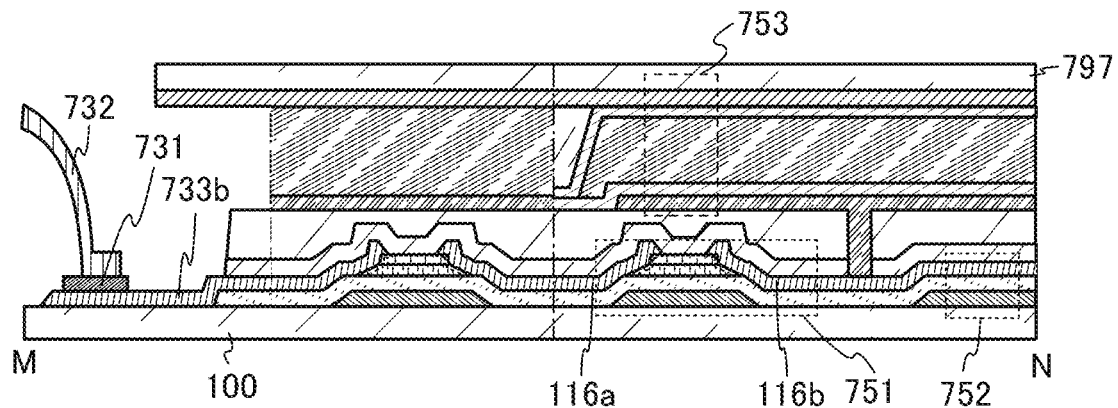
Figure 19C:
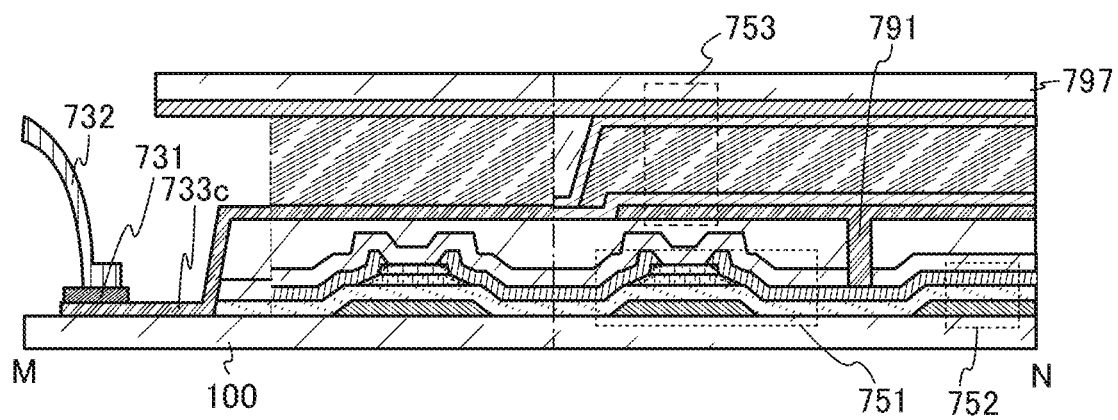

FIGS. 19B and 19C each illustrate an example of a cross section of a liquid crystal display device which is partly different from that in FIG. 19A. Specifically, the difference lies in a wiring connected to the FPC 732. In FIG. 19B, the wiring 733b is connected to the FPC 732 via the terminal 731. The wiring 733b is formed in the same layer as the source electrode 116a and the drain electrode 116b. In FIG. 19C, the wiring 733c is connected to the FPC 732 via the terminal 731. The wiring 733c is formed in the same layer as the electrode 791.

The transistor 751 connected to the liquid crystal element 753 has stable electrical characteristics. Thus, a liquid crystal display device having high display quality can be provided. Further, since the off-state current of the transistor 751 can be extremely low, a liquid crystal display device with low power consumption can be provided.

In the liquid crystal display device, the operation mode can be selected as appropriate. For example, as the driving method, there are a vertical electric field method where voltage is applied perpendicular to a substrate and a horizontal electric field method where voltage is applied in parallel to a substrate. Specifically, a TN mode, a VA mode, an MVA mode, a PVA mode, an ASM mode, a TBA mode, an OCB mode, an FLC mode, an AFLC mode, an FFS mode, or the like can be used.

In the liquid crystal display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (field-sequential driving method) with the use of a plurality of light-emitting diodes (LEDs) for a backlight. A field-sequential driving method enables color display without using a coloring layer.

As a display method in the pixel portion, a progressive method, an interlace method, or the like is employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. However, one embodiment of the present invention is not limited to a color liquid crystal display device and can be applied to a monochrome liquid crystal display device.

3-2. Microcomputer

The transistors described above can be applied to a microcomputer used for a variety of electronic appliances.

A structure and operation of a fire alarm system that is an example of the electronic appliance using a microcomputer are described with reference to FIG. 20, FIG. 21, FIGS. 22A to 22C, and FIG. 23A.

The fire alarm in this specification refers to any system which raises an alarm over fire occurrence instantly and includes, for example, a residential fire alarm, an automatic fire alarm system, and a fire detector used for the automatic fire alarm system in its category.

Figure 20:
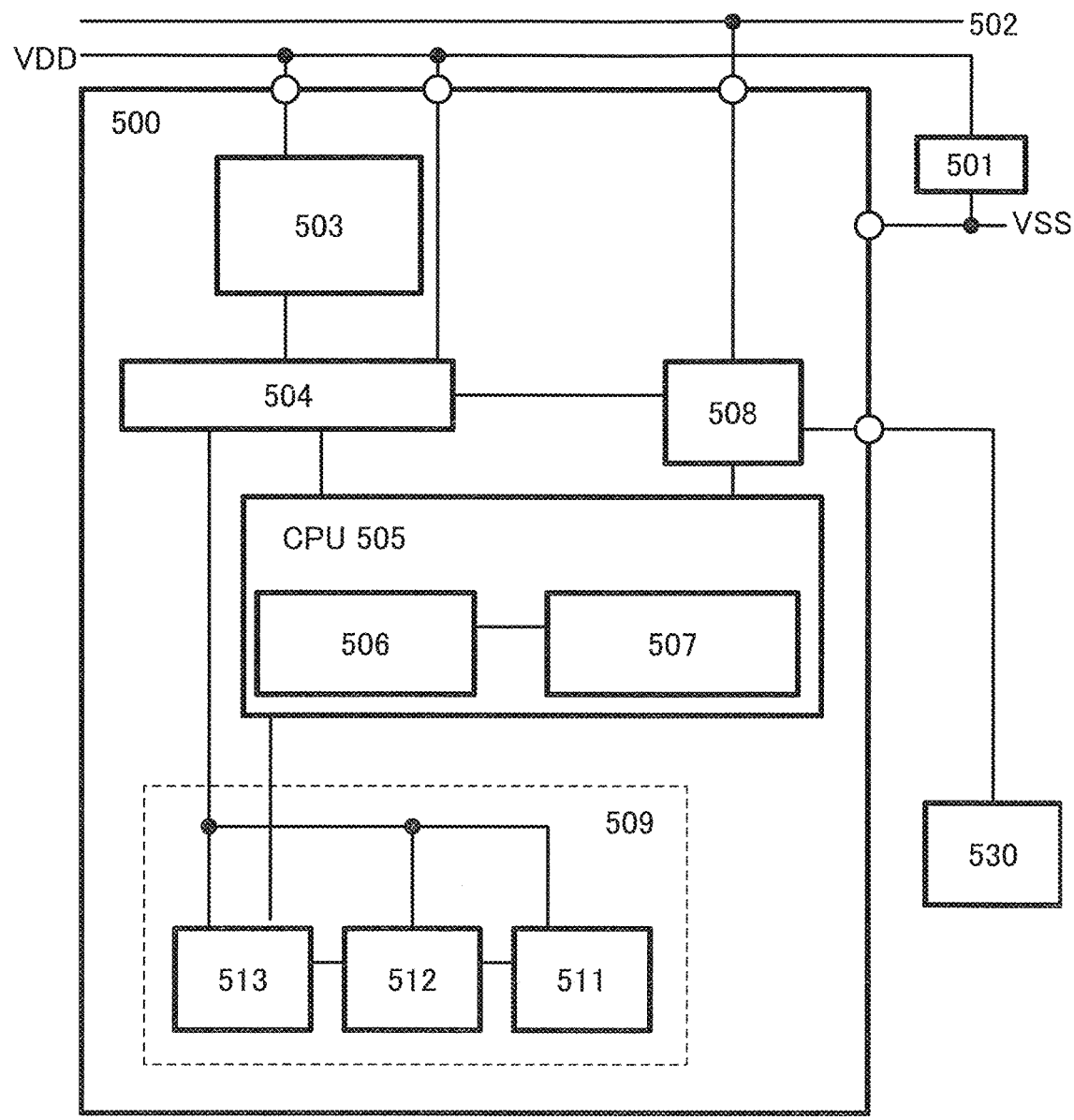
FIG. 20 is a block diagram showing an example of a semiconductor device.

An alarm system illustrated in FIG. 20 includes at least a microcomputer 500. The microcomputer 500 is provided inside the alarm system. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 via an interface 508. The interface 508 as well as the CPU 505 is electrically connected to the power gate 504. As a bus standard of the interface 508, for example, an I²C bus can be used. A light-emitting element 530 electrically connected to the power gate 504 via the interface 508 is provided in the alarm system.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm system operates in such a manner, whereby power consumption can be reduced as compared to the case where power is continuously supplied to the above structures.

In the case where a transistor is used as the power gate 504, it is preferable to use a transistor which has extremely low off-state current and is used for the nonvolatile memory portion 507, for example, the transistor described in the above embodiment. With the use of such a transistor, leakage current can be reduced when supply of power is stopped by the power gate 504, so that power consumption can be reduced.

A direct-current power source 501 may be provided in the alarm system so that power is supplied from the direct-current power source 501 to the high potential power supply line VDD. An electrode of the direct-current power source 501 on the high potential side is electrically connected to the high potential power supply line VDD, and an electrode of the direct-current power source 501 on the low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case which includes an electrode electrically connected to the high potential power supply line VDD, an electrode electrically connected to the low potential power supply line VSS, and a housing which can hold the battery is provided in the housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measured value to the CPU 505. A physical quantity relating to an abnormal situation depends on the usage of the alarm system, and in an alarm system functioning as a fire alarm, a physical quantity relating to a fire is measured. Thus, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 21:
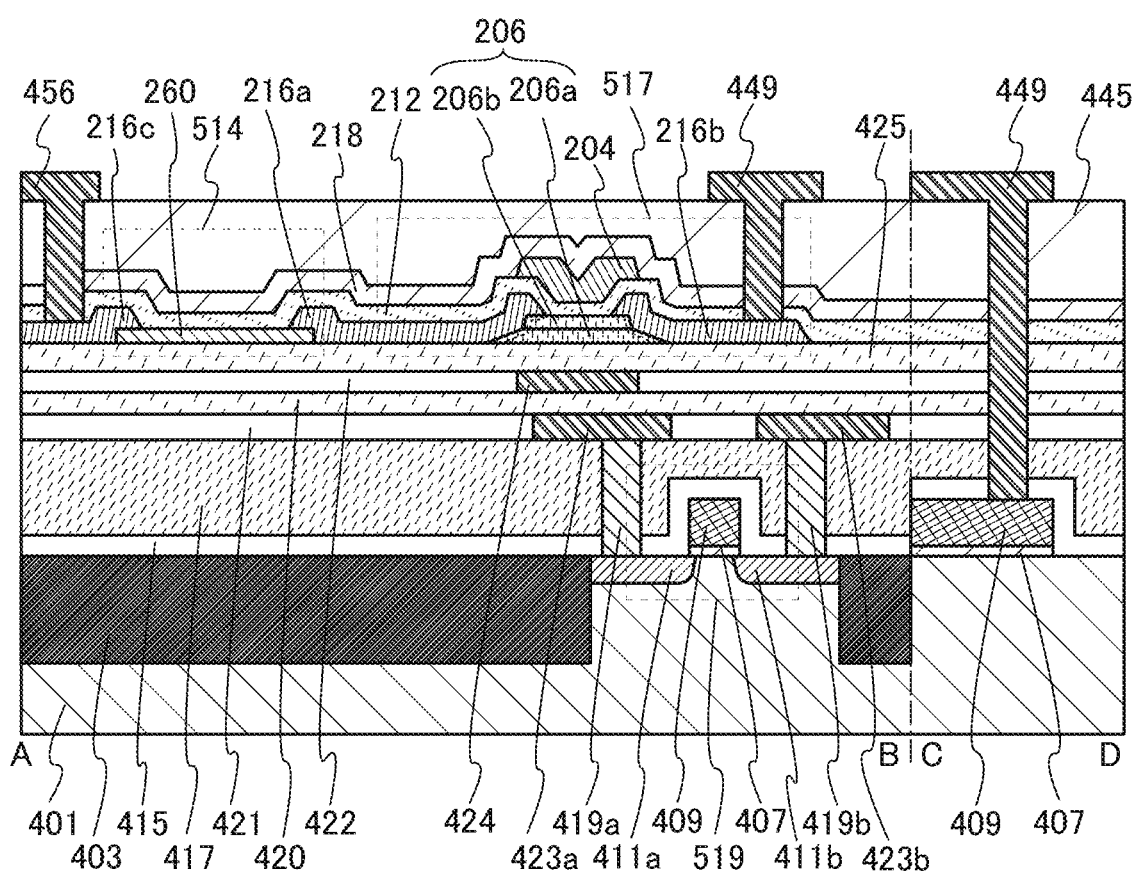
FIG. 21 is a cross-sectional view illustrating an example of a semiconductor device.

FIG. 21 illustrates part of the cross section of the alarm system. An n-channel transistor 519 includes element isolation regions 403 in a p-type semiconductor substrate 401, a gate insulating film 407, a gate electrode 409, and n-type impurity regions 411a and 411b. The n-channel transistor 519 is formed using a semiconductor such as single crystal silicon, so that the n-channel transistor 519 can operate at high speed. Accordingly, a volatile memory portion of a CPU that can achieve high-speed access can be formed. Note that an insulating film 415 and an insulating film 417 are provided over the n-channel transistor 519.

In addition, contact plugs 419a and 419b are formed in openings which are formed by partly etching the insulating films 415 and 417, and an insulating film 421 having groove portions is formed over the insulating film 417 and the contact plugs 419a and 419b. Wirings 423a and 423b are formed in the groove portions of the insulating film 421. An insulating film 420 is formed over the insulating film 421 and the wirings 423a and 423b by a sputtering method, a CVD method, or the like, and an insulating film 422 having a groove portion is formed over the insulating film 420. An electrode 424 is formed in the groove portion of the insulating film 422. The electrode 424 functions as a back gate electrode of a second transistor 517. The electrode 424 can control the threshold voltage of the second transistor 517.

Moreover, an insulating film 425 is formed over the insulating film 422 and the electrode 424 by a sputtering method, a CVD method, or the like.

The second transistor 517 and a photoelectric conversion element 514 are provided over the insulating film 425. The second transistor 517 includes the multilayer film 206 including the oxide semiconductor film 206a and the oxide film 206b, the source electrode 216a and the drain electrode 216b which are over and in contact with the multilayer film 206, the gate insulating film 212, the gate electrode 204, and the protective insulating film 218. Moreover, an insulating film 445 which covers the photoelectric conversion element 514 and the second transistor 517 is formed, and a wiring 449 in contact with the drain electrode 216b is formed over the insulating film 445. The wiring 449 functions as a node which electrically connects the drain electrode of the second transistor 517 to the gate electrode 409 of the n-channel transistor 519.

The optical sensor 511 includes the photoelectric conversion element 514, a capacitor, a first transistor, the second transistor 517, a third transistor, and the n-channel transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the second transistor 517. The gate electrode of the second transistor 517 is supplied with an electric charge accumulation control signal Tx, and the other of the source electrode and the drain electrode thereof is electrically connected to one of a pair of electrodes of the capacitor, one of a source electrode and a drain electrode of the first transistor, and the gate electrode of the n-channel transistor 519 (hereinafter the node is referred to as a node FD in some cases). The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD. One of a source electrode and a drain electrode of the n-channel transistor 519 is electrically connected to one of a source electrode and a drain electrode of the third transistor and the amplifier 512. The other of the source electrode and the drain electrode of the n-channel transistor 519 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 519 or the like is sufficiently large, a structure without the capacitor may be employed.

Further, as each of the first transistor and the second transistor 517, the transistor with extremely low off-state current is preferably used. As the transistor with extremely low off-state current, the transistor which includes the multilayer film including the oxide semiconductor film is preferably used. With such a structure, the potential of the node FD can be held for a long time.

In the structure in FIG. 21, the photoelectric conversion element 514 is electrically connected to the second transistor 517 and is provided over the insulating film 425.

The photoelectric conversion element 514 includes a semiconductor film 260 over the insulating film 425, and the source electrode 216a and an electrode 216c of the second transistor 517 which are in contact with the semiconductor film 260. The source electrode 216a is an electrode functioning as the source electrode or the drain electrode of the second transistor 517 and electrically connects the photoelectric conversion element 514 to the second transistor 517.

Over the semiconductor film 260 and the source and drain electrodes 216a and 216c of the second transistor 517, the gate insulating film 212, the protective insulating film 218, and the insulating film 445 are provided. Further, a wiring 456 is formed over the insulating film 445 and is in contact with the electrode 216c through an opening provided in the gate insulating film 212, the protective insulating film 218, and the insulating film 445.

The electrode 216c can be formed in steps similar to those of the source electrode 216a and the drain electrode 216b of the second transistor 517, and the wiring 456 can be formed in steps similar to those of the wiring 449.

As the semiconductor film 260, a semiconductor film which can perform photoelectric conversion is provided, and for example, silicon, germanium, or the like can be used. In the case of using silicon for the semiconductor layer 260, an optical sensor which senses visible light can be obtained. Further, there is a difference between silicon and germanium in wavelengths of absorbed electromagnetic waves. In the case of using germanium for the semiconductor layer 260, a sensor which senses infrared rays can be obtained.

In the above manner, the sensor portion 509 including the optical sensor 511 can be incorporated into the microcomputer 500, so that the number of components can be reduced and the housing of the alarm system can be reduced in size.

In the above fire alarm including an IC chip, the CPU 505 in which a plurality of circuits each including the above-described transistor are combined and mounted on one IC chip is used.

3-3. CPU

Figure 22A:
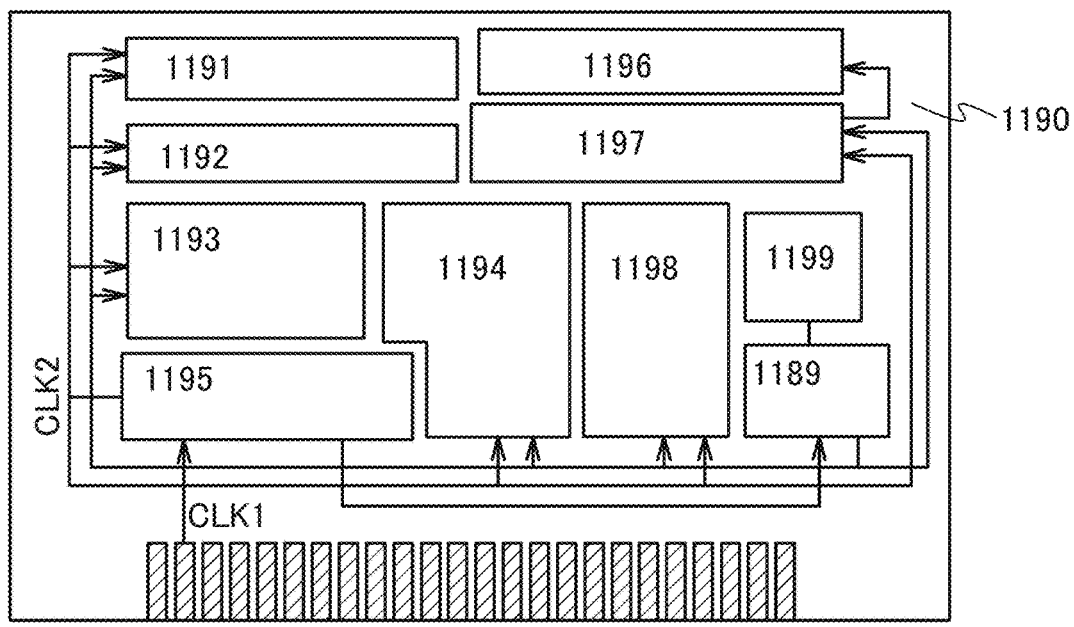
FIGS. 22A to 22C are block diagrams illustrating an example of a CPU.
Figure 22B:
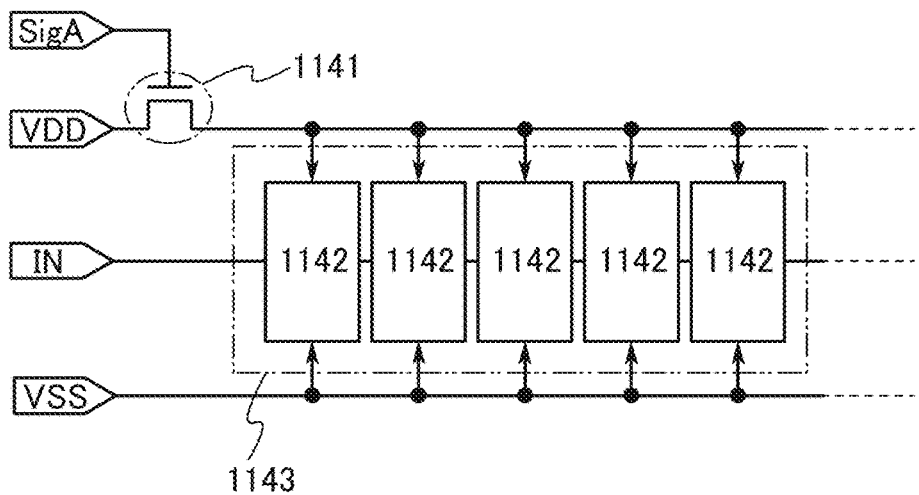
Figure 22C:
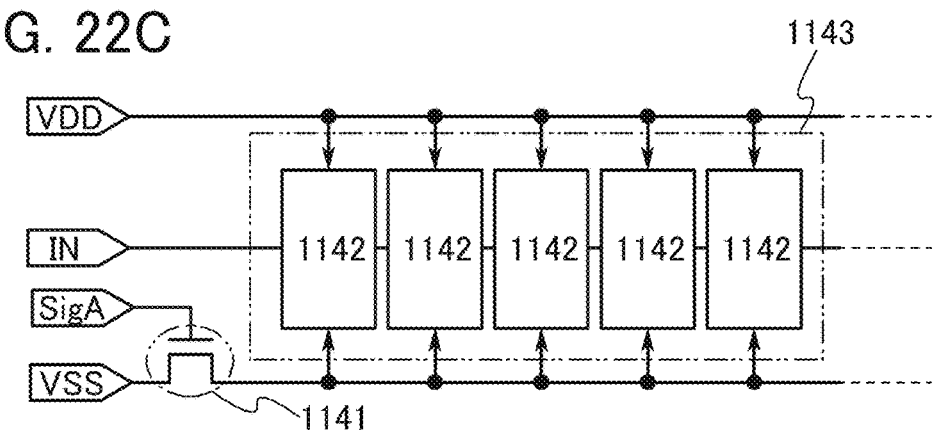

FIGS. 22A to 22C are block diagrams illustrating a specific structure of a CPU at least partly including the above-described transistor.

The CPU illustrated in FIG. 22A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over separate chips. Needless to say, the CPU in FIG. 22A is just an example of a simplified structure, and an actual CPU may have a variety of structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 22A, a memory cell is provided in the register 1196. As the memory cell of the register 1196, the above transistor can be used.

In the CPU illustrated in FIG. 22A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 22B or FIG. 22C. Circuits illustrated in FIGS. 22B and 22C are described below.

FIGS. 22B and 22C each illustrate a memory device in which the above-described transistor is used as a switching element which controls supply of a power supply potential to a memory cell.

The memory device illustrated in FIG. 22B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 22B, the above transistor is used as the switching element 1141, and the switching of the transistor is controlled by a signal SigA supplied to a gate electrode layer thereof.

Note that FIG. 22B illustrates the structure in which the switching element 1141 includes only one transistor; however, one embodiment of the present invention is not limited thereto and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 22B, the switching element 1141 may control the supply of the low-level power supply potential VSS.

FIG. 22C illustrates an example of a memory device in which each of the memory cells 1142 included in the memory cell group 1143 is supplied with the low-level power supply potential VSS via the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

3-4. Installation Example

Figure 23A:
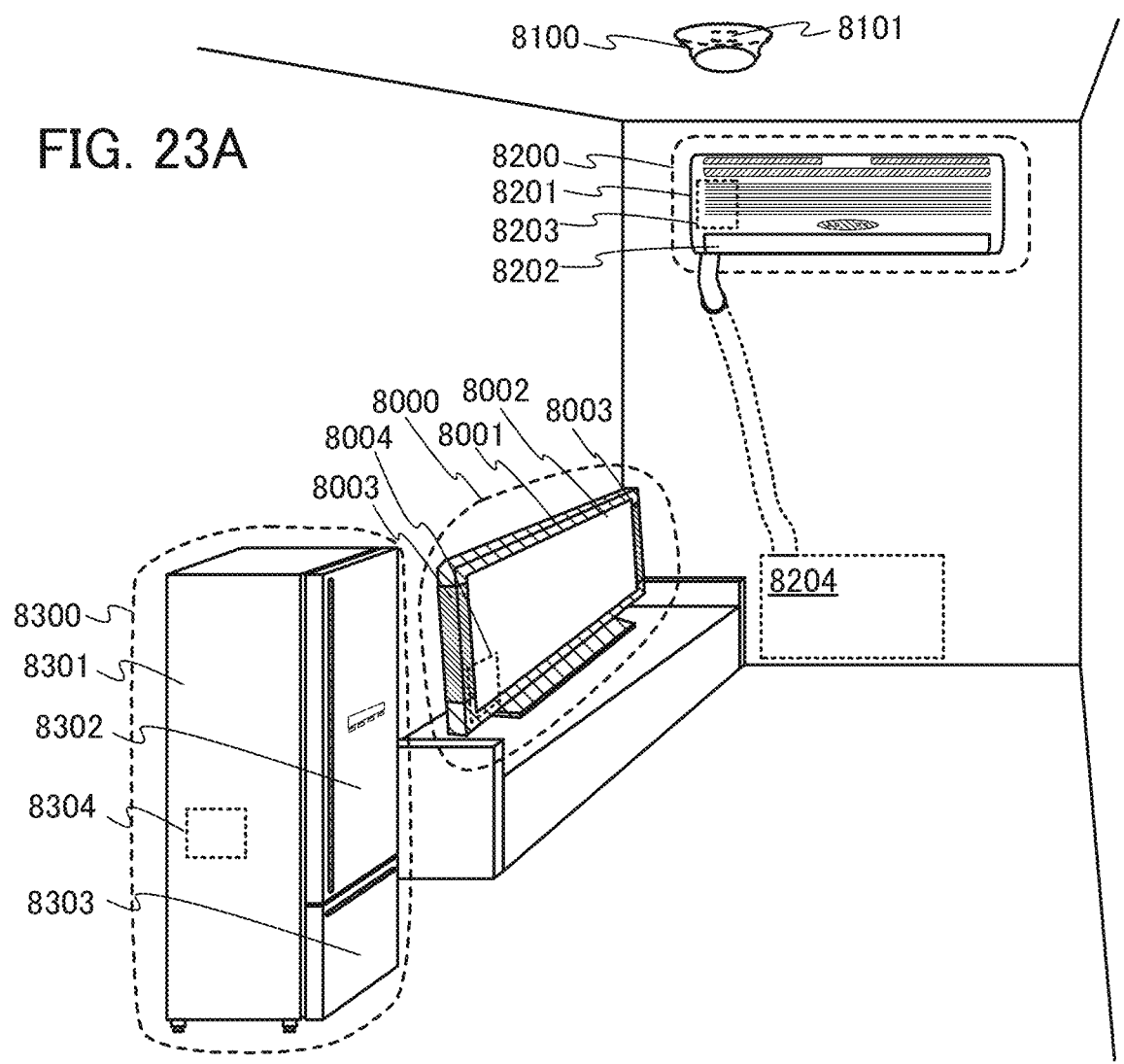
FIGS. 23A to 23C illustrate examples of an electronic appliance.

In FIG. 23A, an alarm system 8100 is a residential fire alarm, which includes a sensor portion and a microcomputer 8101. The microcomputer 8101 includes a CPU in which the above-described transistor is used.

In FIG. 23A, a CPU that uses the above-described transistor is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 23A, the CPU 8203 may be provided in the outdoor unit 8204. Alternatively, the CPU 8203 may be provided in both the indoor unit 8200 and the outdoor unit 8204. The CPU that uses the above-described transistor can save the power of the air conditioner.

In FIG. 23A, a CPU that uses the above-described transistor is included in an electric refrigerator-freezer 8300. Specifically, the electric refrigerator-freezer 8300 includes a housing 8301, a door for a refrigerator 8302, a door for a freezer 8303, a CPU 8304, and the like. In FIG. 23A, the CPU 8304 is provided in the housing 8301. The CPU that uses the above-described transistor can save the power of the electric refrigerator-freezer 8300.

Figure 23B:
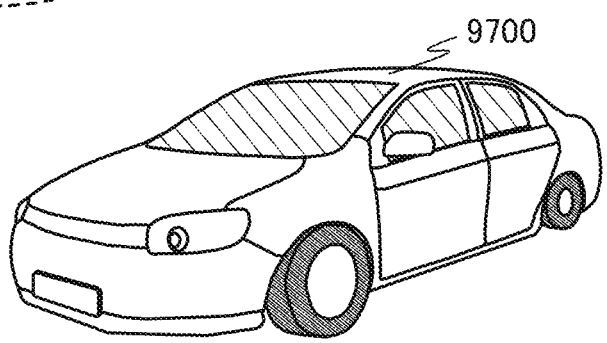
Figure 23C:
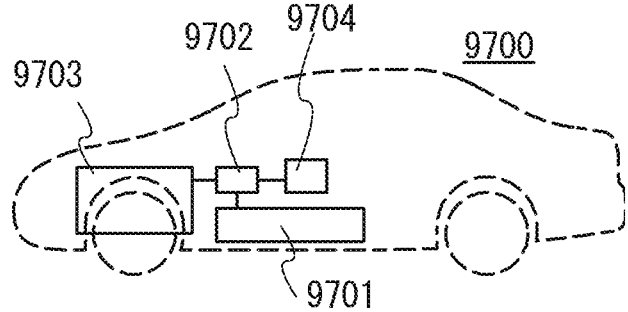

FIGS. 23B and 23C illustrates an example of an electric vehicle. The electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. A CPU that uses the above-described transistor can save the power of the electric vehicle 9700.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

Example 1

In Example 1, etching rates at the time of wet etching oxide semiconductor films and the obtained shapes of side surfaces of the oxide semiconductor films will be described with reference to FIG. 24, FIGS. 25A and 25B, FIG. 26, FIGS. 27A and 27B, FIGS. 28A and 28B, FIGS. 29A and 29B, and FIGS. 30A and 30B.

First, the oxide semiconductor films and the etchants used here and the etching rate are described.

Methods for fabricating Sample 1 and Sample 2 are described below.

An oxide semiconductor film was formed over a glass substrate. Sample 1 includes, over a glass substrate, a 100-nm-thick In—Ga—Zn oxide film formed using a sputtering target of a metal oxide with an atomic ratio of In:Ga:Zn=1:1:1. Sample 2 includes, over a glass substrate, a 100-nm-thick In—Ga—Zn oxide film formed using a sputtering target of a metal oxide with an atomic ratio of In:Ga:Zn=1:3:2.

The In—Ga—Zn oxide film in Sample 1 was formed under the following formation conditions: a sputtering target with an atomic ratio of In:Ga:Zn=1:1:1 was used, argon with a flow rate of 50 sccm and oxygen with a flow rate of 50 sccm were supplied as a sputtering gas into a reaction chamber of a sputtering apparatus, the pressure in the reaction chamber was adjusted to 0.6 Pa, and a direct-current power of 5 kW was supplied. Note that the In—Ga—Zn oxide film was formed at a substrate temperature of 170° C.

The In—Ga—Zn oxide film in Sample 2 was formed under the following formation conditions: a sputtering target with an atomic ratio of In:Ga:Zn=1:3:2 was used; argon with a flow rate of 90 sccm and oxygen with a flow rate of 10 sccm were supplied as a sputtering gas into the reaction chamber of the sputtering apparatus; the pressure in the reaction chamber was controlled to 0.3 Pa; and a direct-current power of 5 kW was supplied. Note that the In—Ga—Zn oxide film was formed at a substrate temperature of 100° C.

Next, the In—Ga—Zn oxide films in Sample 1 and Sample 2 were wet etched. The wet etching step was conducted with a first etchant, a second etchant, or a third etchant. As the first etchant, an 85 wt. % phosphoric acid at 25° C. was used. As the second etchant, an oxalic acid-based solution at 60° C. (e.g., ITO-07N (an aqueous solution containing an oxalic acid at 5 wt. % or lower)) was used. As the third etchant, a phosphoric acid-based solution at 30° C. (e.g., Al-Etchant produced by Wako Pure Chemical Industries, Ltd. (an aqueous solution containing a 72 wt. % phosphoric acid, a 2 wt. % nitric acid, and a 9.8 wt. % acetic acid)) was used.

Next, the relationship between the etchants used for Sample 1 and Sample 2 and the etching rates is described with reference to FIG. 24.

Figure 24:
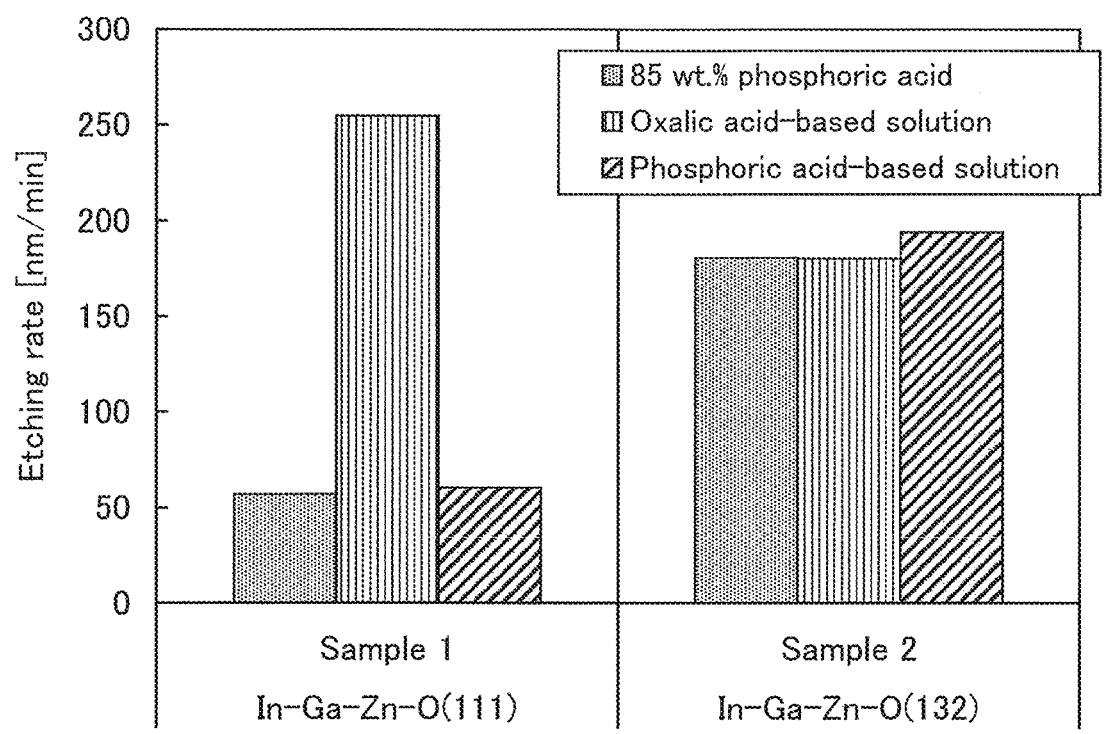
FIG. 24 shows a relationship between etchants and etching rates.

As shown in FIG. 24, the etching rate of Sample 1, which includes the In—Ga—Zn oxide film (also referred to as In—Ga—Zn—O(111)) formed using the sputtering target with an atomic ratio of In:Ga:Zn=1:1:1, is high in etching with the use of the oxalic acid-based solution, which is the second etchant.

In contrast, the etching rates with all kinds of etchants for Sample 2, which includes the In—Ga—Zn oxide film (also referred to as In—Ga—Zn—O(132)) formed using the sputtering target with an atomic ratio of In:Ga:Zn=1:3:2, are substantially the same.

Next, described is the shape of the side surface of the oxide semiconductor film obtained by etching the oxide semiconductor film having a stacked structure with the first to third etchants.

Methods for fabricating Sample 3 and Sample 4 are described below. Sample 3 and Sample 4 have a two-layer structure where a first In—Ga—Zn oxide film and a second In—Ga—Zn oxide film are stacked.

An oxide semiconductor film with the stacked structure was formed over a glass substrate. First, the first In—Ga—Zn oxide film was formed with a thickness of 35 nm over the glass substrate using a sputtering target of a metal oxide with an atomic ratio of In:Ga:Zn=1:1:1. Then, the second In—Ga—Zn oxide film was formed with a thickness of 20 nm using a sputtering target of a metal oxide with an atomic ratio of In:Ga:Zn=1:3:2.

Note that the first In—Ga—Zn oxide film is the film formed under the same formation conditions as those of the In—Ga—Zn oxide film of Sample 1. The second In—Ga—Zn oxide film is the film formed under the same formation conditions as the In—Ga—Zn oxide film of Sample 2.

Then, the oxide semiconductor film having the stacked structure was etched. As the etchant for Sample 3, the 85 wt. % phosphoric acid at 25° C., which was the first etchant, was used. As the etchant for Sample 4, the phosphoric acid solution at 30° C., which was the third etchant, was used.

Next, a method for fabricating Sample 5 is described below. Sample 5 has a three-layer structure where a first In—Ga—Zn oxide film, a second In—Ga—Zn oxide film, and a third In—Ga—Zn oxide film are stacked.

A silicon nitride film and a silicon oxynitride film were formed over a glass substrate by a CVD method. Next, the oxide semiconductor film with the stacked structure was formed over the silicon oxynitride film. Then, the first In—Ga—Zn oxide film was formed with a thickness of 5 nm over the silicon oxynitride film using a sputtering target of a metal oxide with an atomic ratio of In:Ga:Zn=1:3:2. Then, the second In—Ga—Zn oxide film was formed with a thickness of 20 nm using a sputtering target of a metal oxide with an atomic ratio of In:Ga:Zn=3:1:2. Further, the third In—Ga—Zn oxide film was formed with a thickness of 20 nm using a sputtering target of a metal oxide with an atomic ratio of In:Ga:Zn=1:1:1. Next, a silicon oxynitride film was formed over the third In—Ga—Zn oxide film by a CVD method.

The first In—Ga—Zn oxide film in Sample 5 was formed under the following formation conditions: a sputtering target with an atomic ratio of In:Ga:Zn=1:3:2 was used; argon with a flow rate of 90 sccm and oxygen with a flow rate of 10 sccm were supplied as a sputtering gas into a reaction chamber of a sputtering apparatus; the pressure in the reaction chamber was controlled to 0.6 Pa; and a direct-current power of 5 kW was supplied. The second In—Ga—Zn oxide film was formed under the following conditions: a sputtering target with an atomic ratio of In:Ga:Zn=3:1:2 was used; argon with a flow rate of 50 sccm and oxygen with a flow rate of 50 sccm were supplied as a sputtering gas into the reaction chamber of the sputtering apparatus; the pressure in the reaction chamber was controlled to 0.6 Pa; and a direct-current power of 5 kW was supplied. The third In—Ga—Zn oxide film was formed under the following conditions: a sputtering target with an atomic ratio of In:Ga:Zn=1:1:1 was used; oxygen with a flow rate of 100 sccm was supplied as a sputtering gas into the reaction chamber of the sputtering apparatus; the pressure in the reaction chamber was controlled to 0.6 Pa; and a direct-current power of 5 kW was supplied. Note that the first to third In—Ga—Zn oxide films were formed at a substrate temperature of 170° C.

Next, the oxide semiconductor film with the stacked structure was etched. As the etchant for Sample 5, the oxalic acid solution at 60° C., which was the second etchant, was used.

A method for fabricating Sample 6 is described below. Sample 6 has a two-layer structure where a first In—Ga—Zn oxide film and a second In—Ga—Zn oxide film are stacked.

A silicon oxynitride film was formed over a glass substrate by a CVD method. Next, under the same formation conditions as those for Sample 3 and Sample 4, after the first In—Ga—Zn oxide film was formed with a thickness of 35 nm over the silicon oxynitride film using a sputtering target of a metal oxide with an atomic ratio of In:Ga:Zn=1:1:1, the second In—Ga—Zn oxide film was formed with a thickness of 20 nm using a sputtering target of a metal oxide with an atomic ratio of In:Ga:Zn=1:3:2. Then, a silicon oxynitride film was formed over the second In—Ga—Zn oxide film.

Next, the oxide semiconductor film with the stacked structure was etched. The oxide semiconductor film with the stacked structure of Sample 6 was etched by a dry etching method. Note that $BCl_3$ was used as an etching gas.

Next, the cross-sectional shapes of Sample 3 to Sample 6 were observed by scanning transmission electron microscopy (STEM).

Figure 25A:
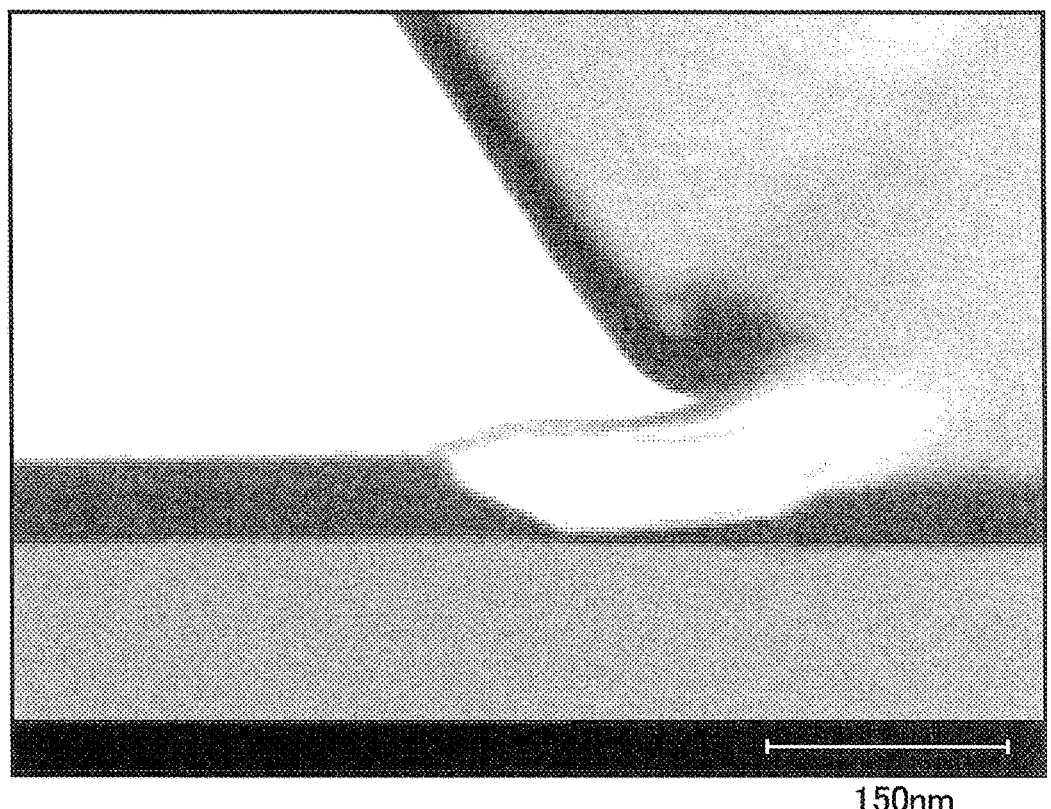
FIGS. 25A and 25B show STEM images.
Figure 25B:
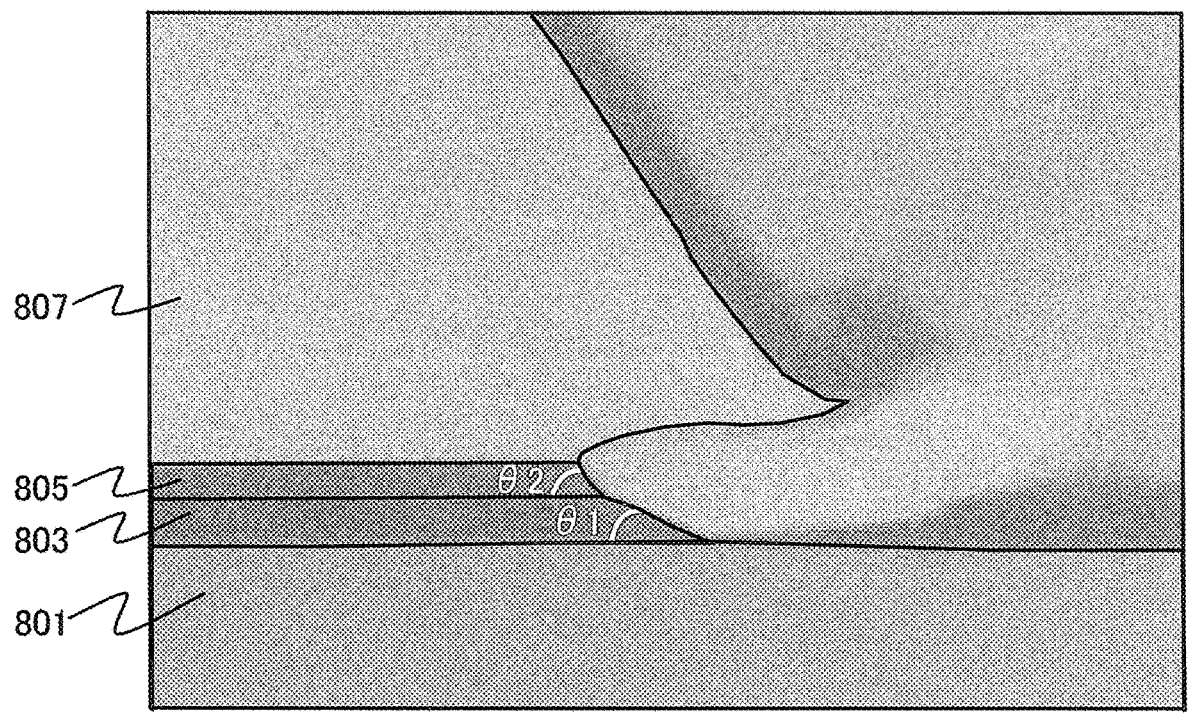
Figure 26:
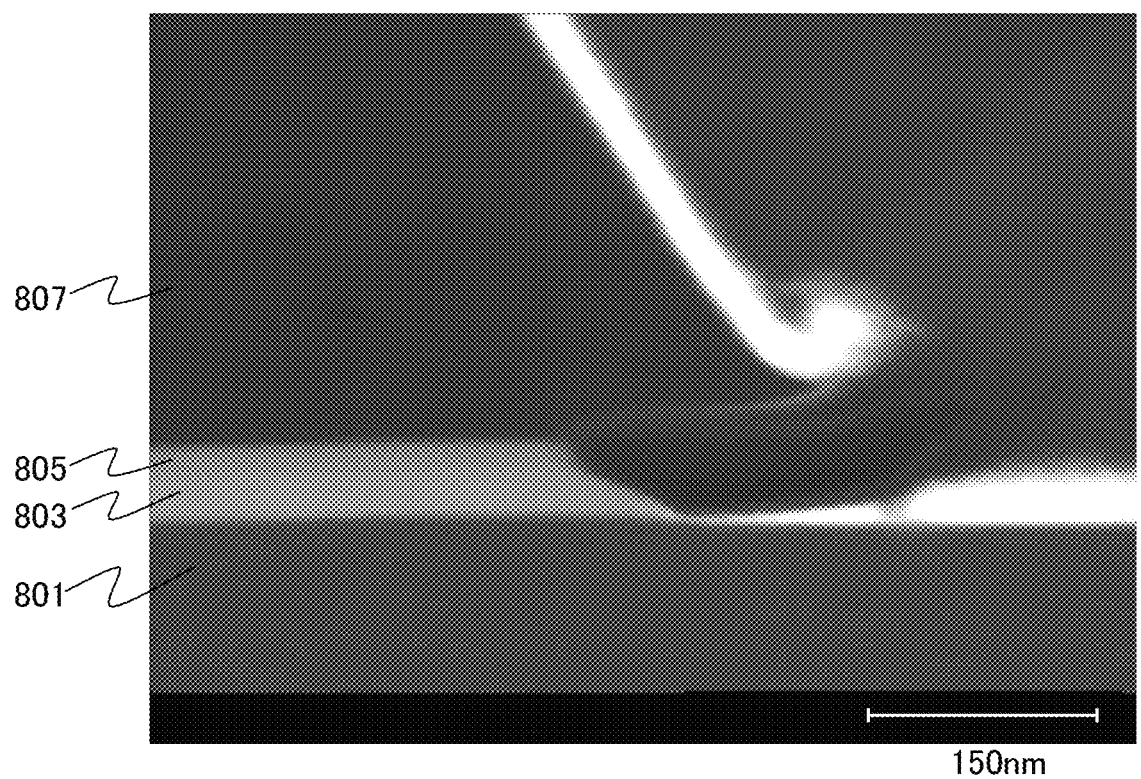
FIG. 26 shows a STEM image.

FIG. 25A shows a phase contrast image (TE image) of Sample 3 at 200,000-fold magnification, and FIG. 25B is a schematic view of FIG. 25A. Further, FIG. 26 shows a Z-contrast image (ZC image) of Sample 3 at 150,000-fold magnification.

Figure 27A:
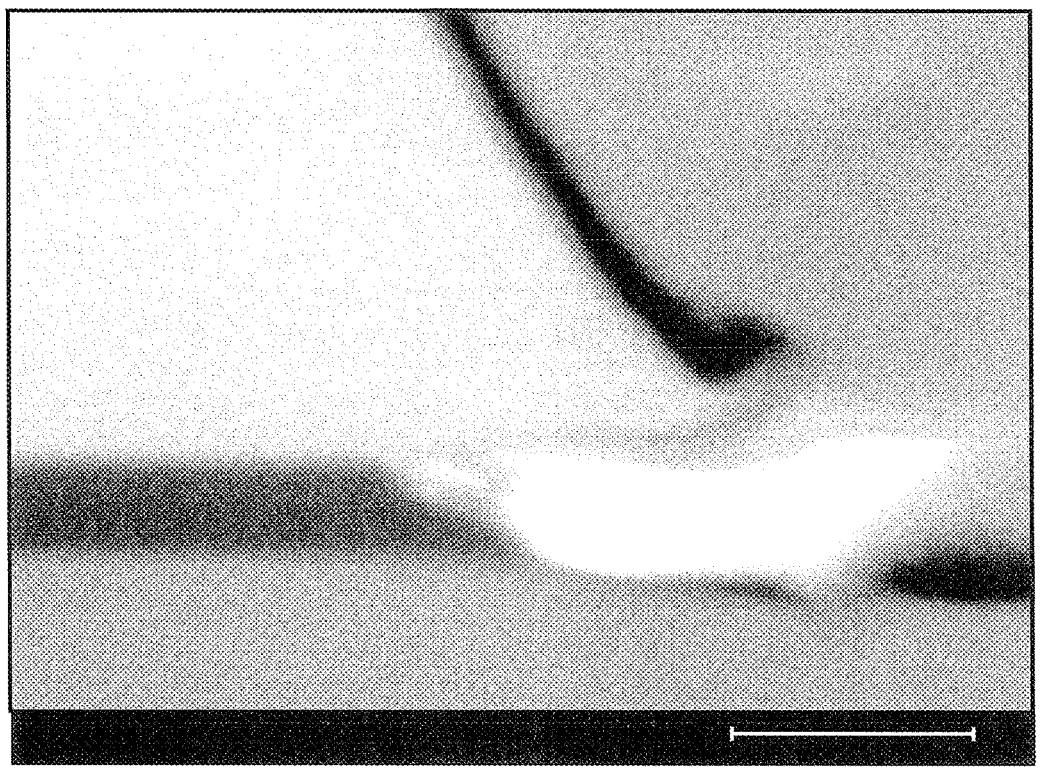
FIGS. 27A and 27B show STEM images.
Figure 27B:
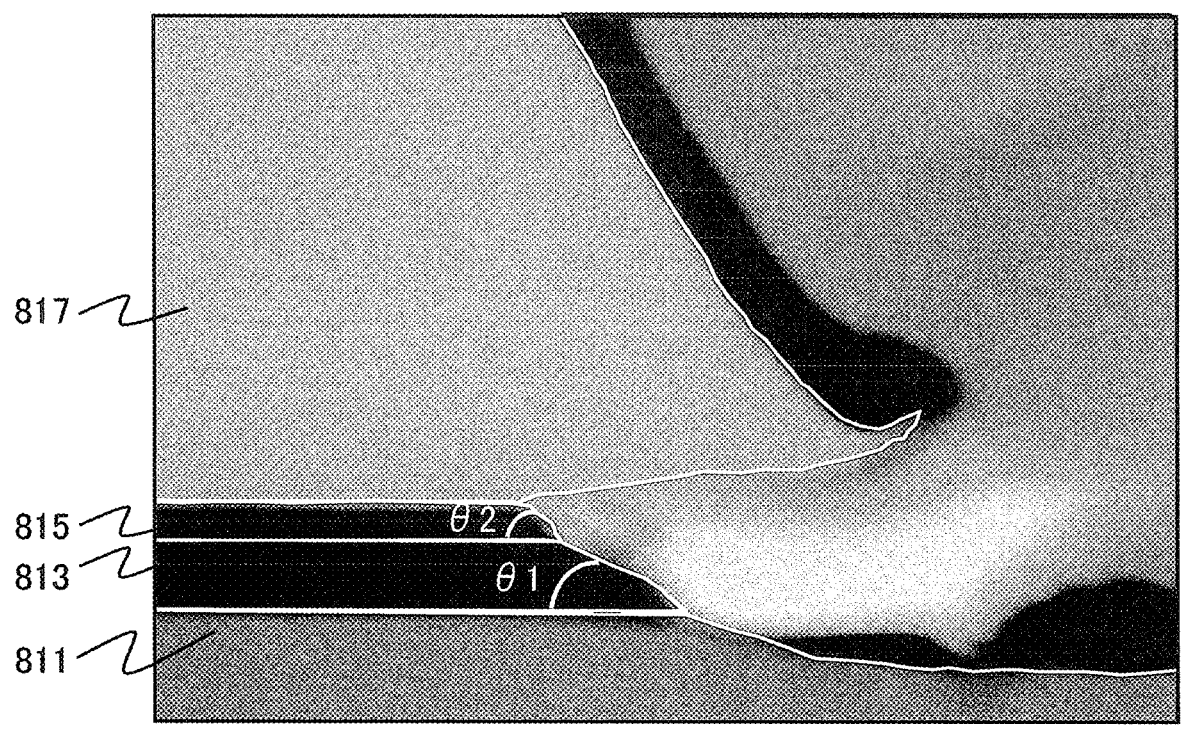

FIG. 27A shows a phase contrast image (TE image) of Sample 4 at 200,000-fold magnification, and FIG. 27B is a schematic view of FIG. 27A.

Figure 28A:
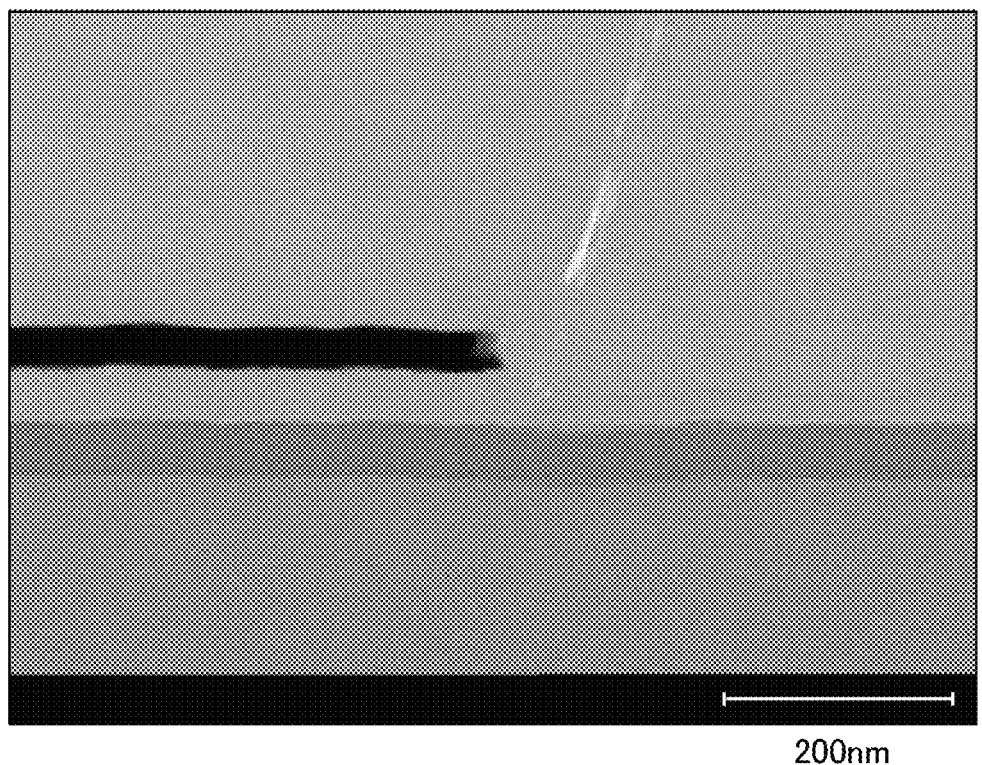
FIGS. 28A and 28B show STEM images.
Figure 28B:
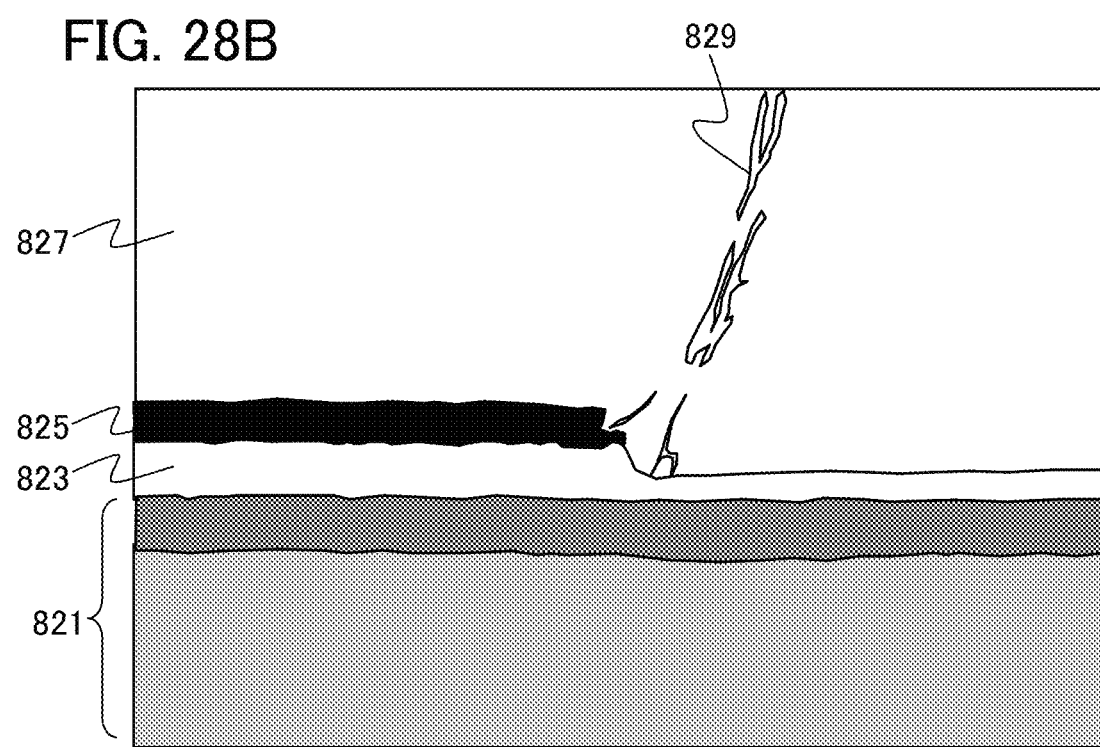
Figure 29A:
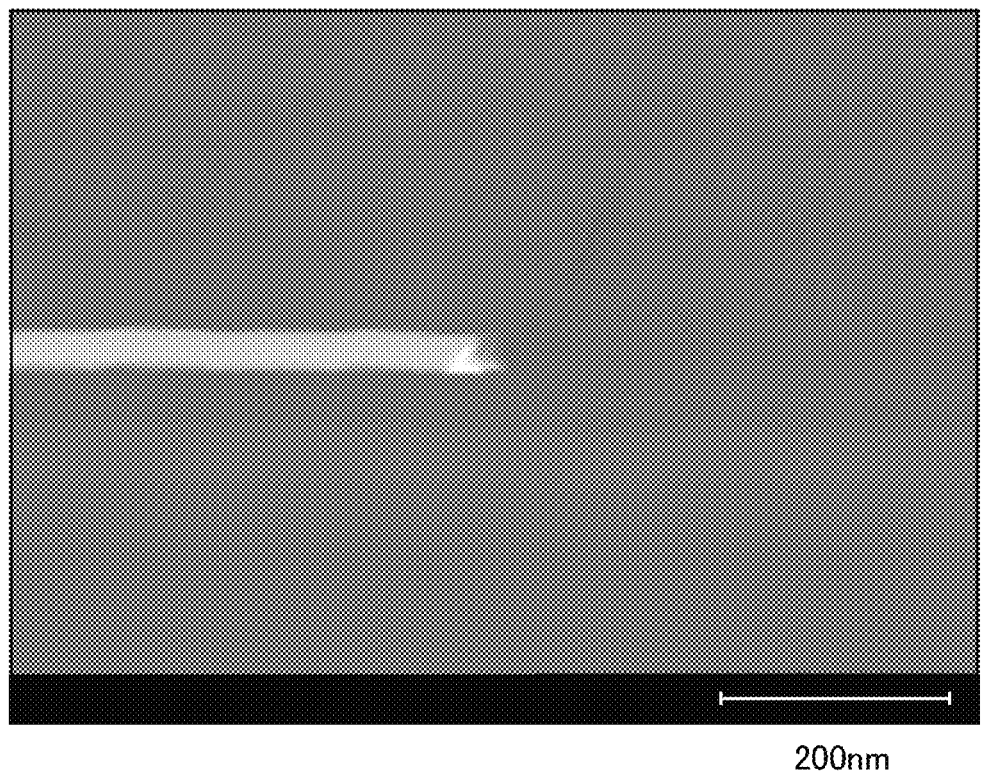
FIGS. 29A and 29B show STEM images.
Figure 29B:
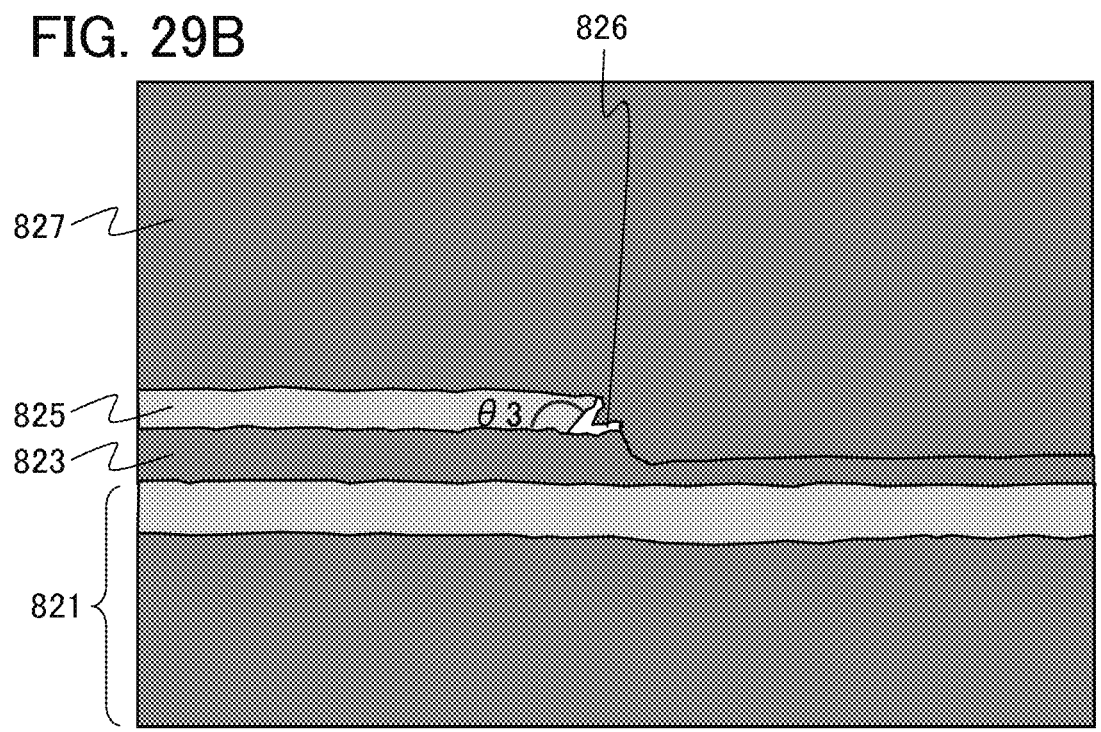

FIG. 28A shows a phase contrast image (TE image) of Sample 5 at 150,000-fold magnification, and FIG. 28B is a schematic view of FIG. 28A. Further, for describing the area around the side surface of the oxide semiconductor film with the stacked structure of Sample 5 in detail, a Z-contrast image (ZC image) of Sample 5 at 150,000-fold magnification is shown in FIG. 29A, and a schematic view of FIG. 29A is shown in FIG. 29B.

Figure 30A:
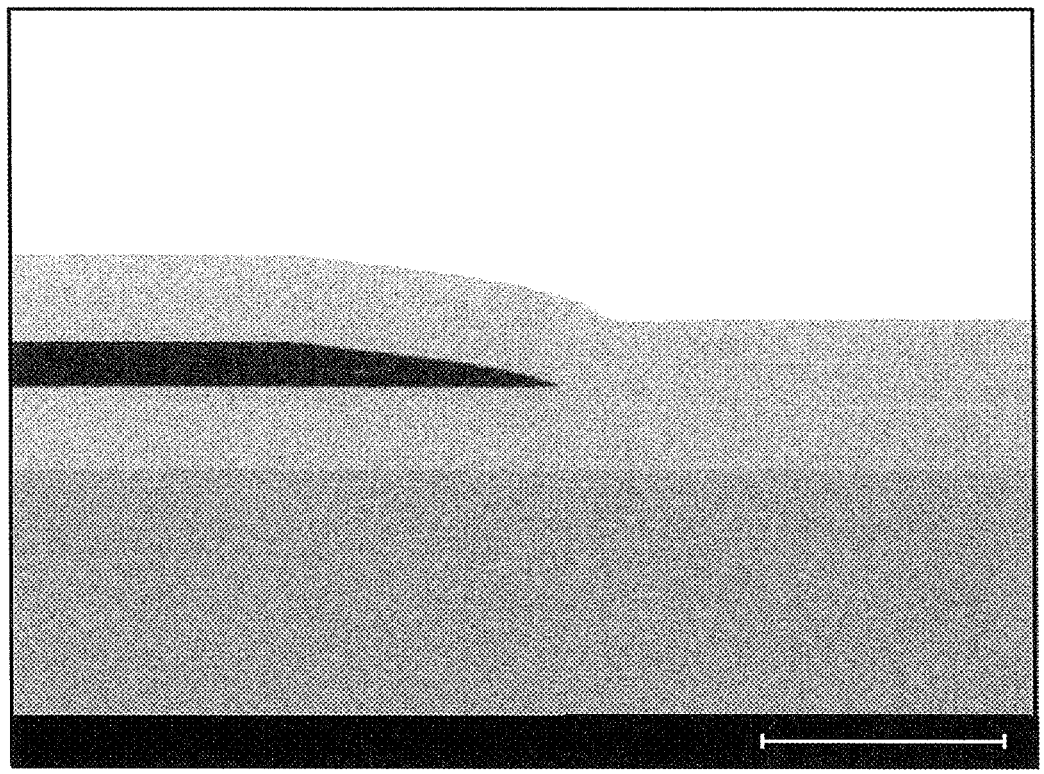
FIGS. 30A and 30B show STEM images.
Figure 30B:
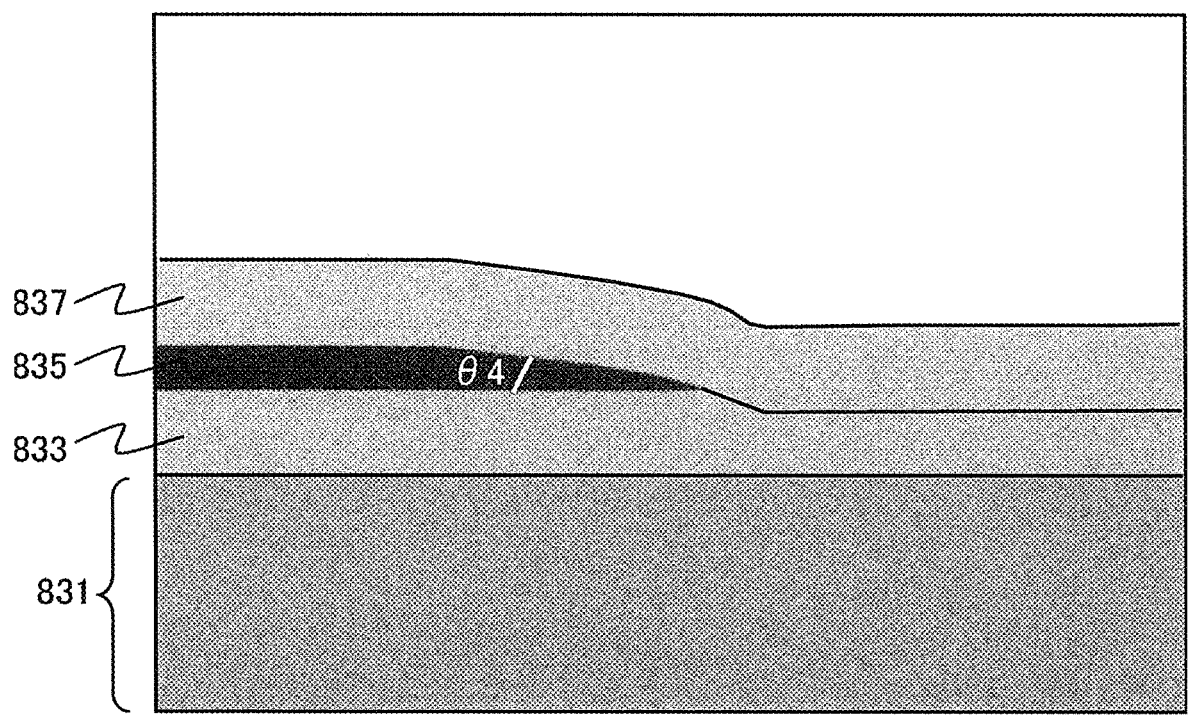

FIG. 30A shows a phase contrast image (TE image) of Sample 6 at 150,000-fold magnification, and FIG. 30B is a schematic view of FIG. 30A.

As shown in FIG. 25B, a first In—Ga—Zn oxide film 803 is formed over a glass substrate 801 in Sample 3. A second In—Ga—Zn oxide film 805 is formed over the first In—Ga—Zn oxide film 803. A resist 807 is provided over the second In—Ga—Zn oxide film 805.

In FIG. 26, the boundary between the first In—Ga—Zn oxide film 803 and the second In—Ga—Zn oxide film 805 in Sample 3 can be recognized by the difference in tones. That is, in the transistor of one embodiment of the present invention, even when the oxide semiconductor film and the oxide film include elements in common, the boundary therebetween can be recognized by the difference in composition thereof.

As shown in FIG. 27B, a first In—Ga—Zn oxide film 813 is formed over a glass substrate 811 in Sample 4. A second In—Ga—Zn oxide film 815 is formed over the first In—Ga—Zn oxide film 813. A resist 817 is provided over the second In—Ga—Zn oxide film 815.

In Sample 3 and Sample 4, the angles between the glass substrates 801 and 811 and the side surfaces of the first In—Ga—Zn oxide films 803 and 813 are each the angle $\theta 1$. The angles between the interfaces between the first In—Ga—Zn oxide films 803 and 813 and the second In—Ga—Zn oxide films 805 and 815 and the side surfaces of the second In—Ga—Zn oxide films 805 and 815 are each the angle $\theta 2$. As illustrated in FIGS. 25A and 25B and FIGS. 27A and 27B, the angle $\theta 2$ is larger than the angle $\theta 1$ in Sample 3 and Sample 4.

In Sample 5, a silicon oxynitride film 823 is formed over a silicon nitride film 821 as shown in FIG. 28B. An oxide semiconductor film 825 with the stacked structure is formed over the silicon oxynitride film 823. A silicon oxynitride film 827 is formed over the silicon oxynitride film 823 and the oxide semiconductor film 825 with the stacked structure. Note that a low-density region 829 is formed in the silicon oxynitride film 827.

In Sample 5, the angle between the interface between the silicon oxynitride film 823 and the oxide semiconductor film 825 with the stacked structure and the side surface of the oxide semiconductor film 825 with the stacked structure is the angle $\theta 3$. As shown in FIG. 29B, the angle $\theta 3$ is an obtuse angle in Sample 5. Note that elements with different atomic numbers are shown in different tones on the ZC image. Thus, it can be seen that a film 826 with a different composition from that of the oxide semiconductor film is formed on the side surface of the oxide semiconductor film 825 with the stacked structure. By energy dispersive X-ray spectrometry (EDX), the film 826 was found to contain tungsten.

As shown in FIG. 30B, a silicon oxynitride film 833 is formed over a glass substrate 831 in Sample 6. An oxide semiconductor film 835 with the stacked structure is formed over the silicon oxynitride film 833. A silicon oxynitride film 837 is formed over the silicon oxynitride film 833 and the oxide semiconductor film 835 with the stacked structure.

In Sample 6, the angle between the interface between the silicon oxynitride film 833 and the oxide semiconductor film 835 with the stacked structure and the side surface of the oxide semiconductor film 835 with the stacked structure is an angle $\theta 4$. As shown in FIG. 30B, the angle $\theta 4$ in Sample 6 does not vary depending on the place on the side surface of the oxide semiconductor film and is substantially constant.

The above description shows that in the oxide semiconductor film with the stacked structure, the angle $\theta 1$ formed between the side surface of the In—Ga—Zn oxide film formed using the sputtering target with an atomic ratio of In:Ga:Zn=1:1:1 and the interface of the In—Ga—Sn oxide film with a base film of the In—Ga—Zn oxide film can become smaller than the angle $\theta 2$ formed between the side surface of the In—Ga—Zn oxide film formed using the sputtering target with an atomic ratio of In:Ga:Zn=1:3:2 and the interface of the In—Ga—Zn oxide film with the base film of the In—Ga—Zn oxide film, by utilizing a wet etching method using a phosphoric acid or a phosphoric acid solution as an etchant.

This application is based on Japanese Patent Application serial no. 2012-251794 filed with Japan Patent Office on Nov. 16, 2012, the entire contents of which are hereby incorporated by reference.

What is claimed is:

1. A semiconductor device comprising:
   a glass substrate;
   a gate electrode with a tapered side surface over the glass substrate;
   a first insulating film comprising at least one of silicon oxide, silicon nitride, silicon oxynitride, and silicon nitride oxide over the gate electrode;
   an oxide semiconductor film over and in contact with the first insulating film, the oxide semiconductor film comprising a first oxide film and a second oxide film;
   a first conductive film over and in contact with a top surface of the second oxide film, the first conductive film being in contact with a first side surface of the first oxide film and a first side surface of the second oxide film;
   a second conductive film over and in contact with the top surface of the second oxide film, the second conductive film being in contact with a second side surface of the first oxide film and a second side surface of the second oxide film;
   a second insulating film over the oxide semiconductor film, the first conductive film, and the second conductive film; and
   a third insulating film over the second insulating film,
   wherein the second conductive film is electrically connected to a first electrode of a display element via an opening provided in the second insulating film and the third insulating film,
   wherein a thickness of the first side surface of the first oxide film is larger than a thickness of the first side surface of the second oxide film in a cross-sectional view,
   wherein at least one of the first oxide film and the second oxide film is crystalline, wherein the first oxide film comprises indium and gallium, wherein the second oxide film overlaps with the first oxide film and comprises indium and gallium, wherein the first insulating film comprises a fourth insulating film comprising silicon oxide and a fifth insulating film comprising silicon nitride, wherein a sixth insulating film is provided over the first electrode of the display element, wherein the sixth insulating film covers a side surface of the first electrode of the display element, wherein the sixth insulating film overlaps with the first conductive film without the first electrode of the display element provided therebetween, wherein a second electrode of the display element is provided over the sixth insulating film, and wherein the first electrode and the second electrode of the display element overlap with the oxide semiconductor film.

2. The semiconductor device according to claim 1, wherein the first conductive film and the second conductive film overlap with the gate electrode.

3. The semiconductor device according to claim 1, wherein the second conductive film extends beyond the opening.

4. The semiconductor device according to claim 1, wherein the first electrode comprises indium and zinc.

5. A semiconductor device comprising:
a substrate;
a gate electrode over the substrate;
a first insulating film over the gate electrode;
an oxide semiconductor film over and in contact with the first insulating film, the oxide semiconductor film comprising a first oxide film and a second oxide film;
a first conductive film over and in contact with a top surface of the second oxide film, the first conductive film being in contact with a first side surface of the first oxide film and a first side surface of the second oxide film;
a second conductive film;
a second insulating film over the oxide semiconductor film, the first conductive film, and the second conductive film; and
a third insulating film over the second insulating film,
wherein the second conductive film is electrically connected to a first electrode of a display element,
wherein a thickness of the first side surface of the first oxide film is larger than a thickness of the first side surface of the second oxide film in a cross-sectional view,
wherein each of the first oxide film and the second oxide film is crystalline,
wherein the first oxide film comprises indium, gallium, and zinc,
wherein the second oxide film overlaps with the first oxide film and comprises indium, gallium, and zinc,
wherein one of the first oxide film and the second oxide film comprises a microcrystal,
wherein the first oxide film and the second oxide film have different compositions,
wherein a fourth insulating film is provided over the first electrode of the display element,
wherein the fourth insulating film covers a side surface of the first electrode of the display element,
wherein the fourth insulating film overlaps with the first conductive film without the first electrode of the display element provided therebetween, wherein a second electrode of the display element is provided over the fourth insulating film, and wherein the first electrode and the second electrode of the display element overlap with the oxide semiconductor film.

6. The semiconductor device according to claim 5, wherein the first conductive film and the second conductive film overlap with the gate electrode.

7. The semiconductor device according to claim 5, wherein the second conductive film extends beyond an opening provided in the second insulating film and the third insulating film.

8. The semiconductor device according to claim 5, wherein the first electrode comprises indium and zinc.

9. A semiconductor device comprising:
a substrate;
a gate electrode over the substrate;
a first insulating film over the gate electrode;
an oxide semiconductor film over and in contact with the first insulating film, the oxide semiconductor film comprising a first oxide film and a second oxide film;
a first conductive film over and in contact with a top surface of the second oxide film, the first conductive film being in contact with a first side surface of the first oxide film and a first side surface of the second oxide film;
a second conductive film over and in contact with the top surface of the second oxide film, the second conductive film being in contact with a second side surface of the first oxide film and a second side surface of the second oxide film;
a second insulating film over the oxide semiconductor film, the first conductive film, and the second conductive film, the second insulating film comprising a third insulating film comprising silicon oxide and a fourth insulating film comprising silicon nitride; and
a fifth insulating film over the second insulating film,
wherein the first oxide film comprises indium, gallium, and tin,
wherein the second oxide film overlaps with the first oxide film and comprises indium, gallium, and zinc,
wherein the second conductive film is electrically connected to a first electrode of a display element via an opening provided in the second insulating film and the fifth insulating film,
wherein a thickness of the first side surface of the first oxide film is different from a thickness of the first side surface of the second oxide film in a cross-sectional view,
wherein each of the first oxide film and the second oxide film is crystalline,
wherein each of the first oxide film and the second oxide film comprises a microcrystal,
wherein the first oxide film and the second oxide film have different compositions,
wherein a sixth insulating film is provided over the first electrode of the display element,
wherein the sixth insulating film covers a side surface of the first electrode of the display element,
wherein, in the cross-sectional view, the sixth insulating film overlaps with the first conductive film without the first electrode of the display element provided therebetween,
wherein a second electrode of the display element is provided over the sixth insulating film, and wherein, in the cross-sectional view, the first electrode and the second electrode of the display element overlap with the oxide semiconductor film.

\* \* \* \* \*